United States Patent
Ohara et al.

(10) Patent No.: US 10,476,033 B2
(45) Date of Patent: Nov. 12, 2019

(54) LIGHT-EMITTING ELEMENT, DISPLAY PANEL, DISPLAY DEVICE, ELECTRONIC DEVICE AND METHOD FOR PRODUCING LIGHT-EMITTING ELEMENT

(71) Applicant: Sharp Kabushiki Kaisha, Sakai, Osaka (JP)

(72) Inventors: Masanori Ohara, Sakai (JP); Hideki Uchida, Sakai (JP); Katsuhiro Kikuchi, Sakai (JP); Satoshi Inoue, Sakai (JP); Yuto Tsukamoto, Sakai (JP); Kazuki Matsunaga, Sakai (JP); Eiji Koike, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 16 days.

(21) Appl. No.: 15/529,981

(22) PCT Filed: Nov. 20, 2015

(86) PCT No.: PCT/JP2015/082657
§ 371 (c)(1),
(2) Date: May 25, 2017

(87) PCT Pub. No.: WO2016/084727
PCT Pub. Date: Jun. 2, 2016

(65) Prior Publication Data
US 2017/0324063 A1    Nov. 9, 2017

(30) Foreign Application Priority Data

Nov. 27, 2014   (JP) ................................. 2014-240512

(51) Int. Cl.
*H01L 51/52*   (2006.01)
*H01L 51/50*   (2006.01)
(Continued)

(52) U.S. Cl.
CPC ............ *H01L 51/5262* (2013.01); *G09F 9/30* (2013.01); *H01L 27/32* (2013.01);
(Continued)

(58) Field of Classification Search
CPC ......................... H01L 51/5262; H01L 27/3213
See application file for complete search history.

(56) References Cited

U.S. PATENT DOCUMENTS

2005/0285128 A1* 12/2005 Scherer .................. H01L 33/22
257/98
2007/0290607 A1   12/2007 Okada et al.
(Continued)

FOREIGN PATENT DOCUMENTS

CN   101015232 A   8/2007
JP   2009-009861 A   1/2009
(Continued)

OTHER PUBLICATIONS

Okamoto Takayuki, Application of surface plasmon radiation photonic and high efficiency light extraction technique,the papers of 271ST Technical Meeting of 131st committee on thin films of Japan society for the promotion of science, H26.6.18, Japan.

*Primary Examiner* — Kenneth Parker
*Assistant Examiner* — Long H Le
(74) *Attorney, Agent, or Firm* — ScienBiziP, P.C.

(57) ABSTRACT

A light-emitting element includes at least a first trench portion having an indented shape within a single light-emitting region. In the first trench portion, a first electrode, an EL layer, and a second electrode are layered in this order and in contact with each other. One of the first electrode and the second electrode includes a reflective electrode, and concave-convex portions of the submicron order configured to diffract surface plasmons are provided on the surface of the reflective electrode on a side closer to the EL layer.

13 Claims, 16 Drawing Sheets

(51) Int. Cl.
*H01L 21/32* (2006.01)
*G09F 9/30* (2006.01)
*H01L 27/32* (2006.01)
*H05B 33/26* (2006.01)

(52) U.S. Cl.
CPC ...... *H01L 27/3213* (2013.01); *H01L 27/3288* (2013.01); *H01L 51/50* (2013.01); *H01L 51/5012* (2013.01); *H01L 51/5212* (2013.01); *H01L 51/5218* (2013.01); *H01L 51/5228* (2013.01); *H01L 51/5234* (2013.01); *H01L 51/5271* (2013.01); *H05B 33/26* (2013.01); *H01L 2251/5315* (2013.01)

(56) References Cited

U.S. PATENT DOCUMENTS

| | | | | |
|---|---|---|---|---|
| 2014/0167017 | A1* | 6/2014 | Shinotsuka | H01L 51/5268 257/40 |
| 2014/0284570 | A1* | 9/2014 | Jinta | H01L 27/3218 257/40 |
| 2014/0306241 | A1* | 10/2014 | Hirakata | H01L 51/5281 257/79 |
| 2015/0138463 | A1 | 5/2015 | Jinta et al. | |

FOREIGN PATENT DOCUMENTS

| | | |
|---|---|---|
| JP | 2012-221811 A | 11/2012 |
| JP | 2014-045166 A | 3/2014 |
| JP | 2015-090810 A | 5/2015 |

* cited by examiner

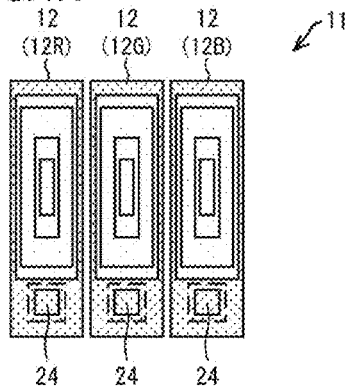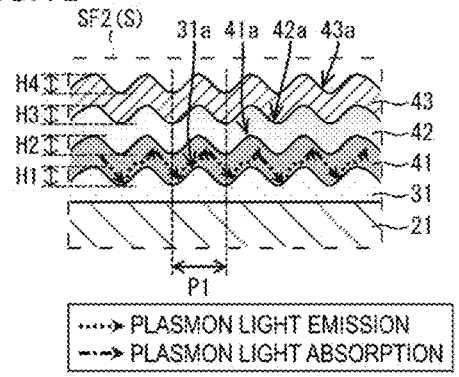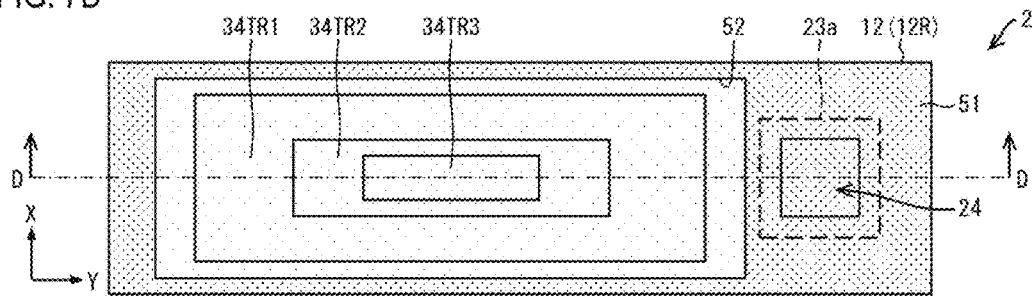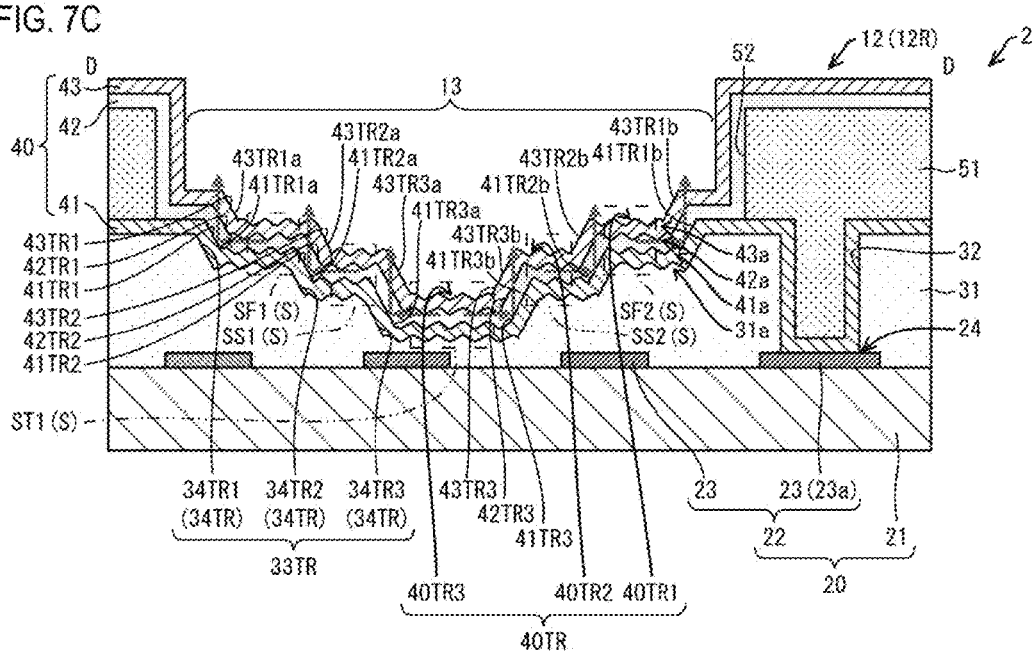

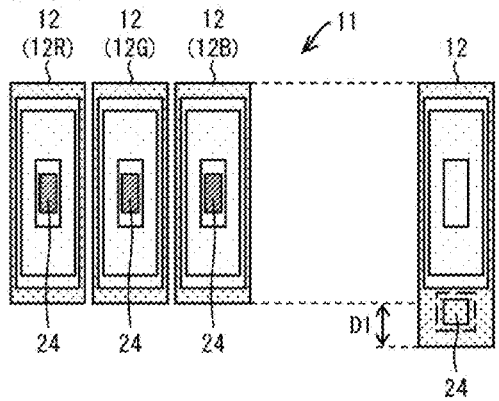
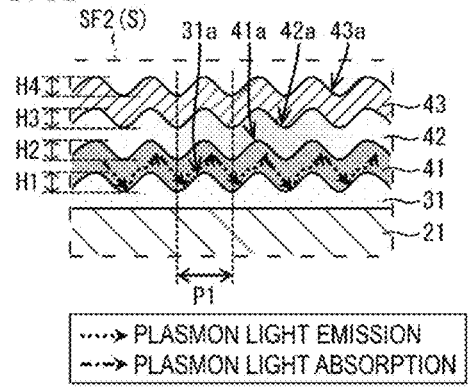
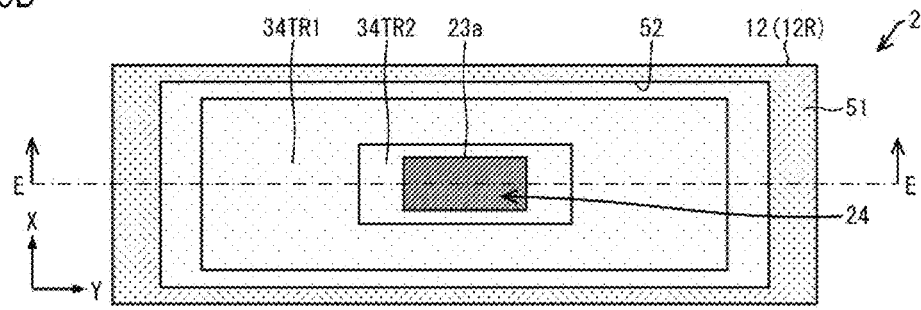
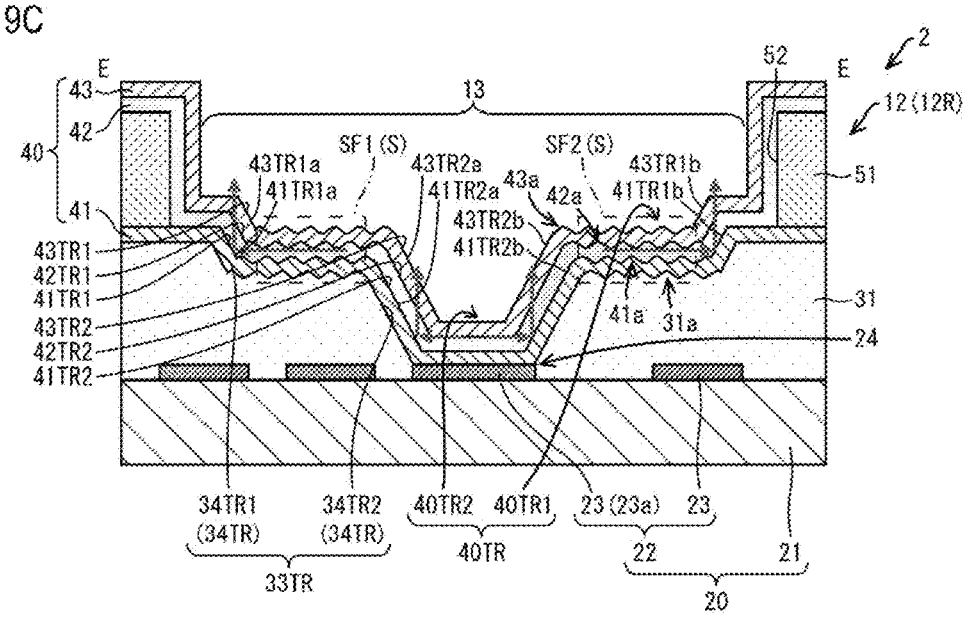

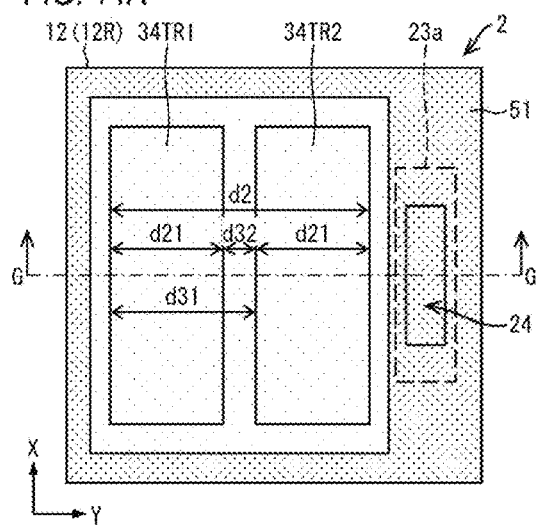
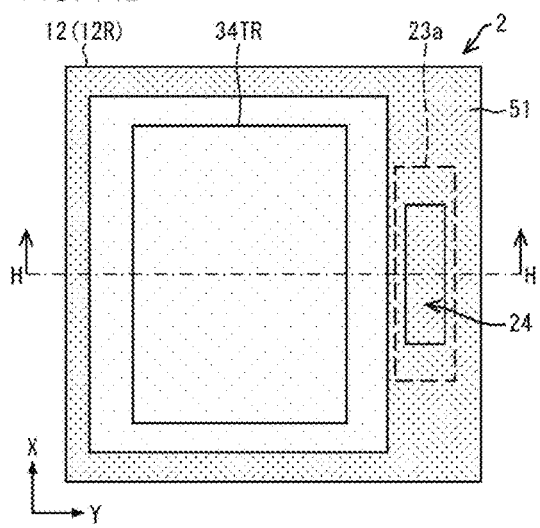
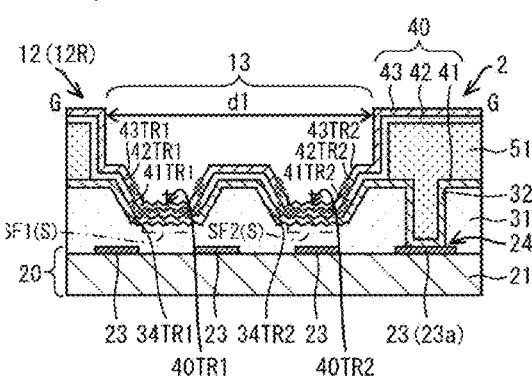
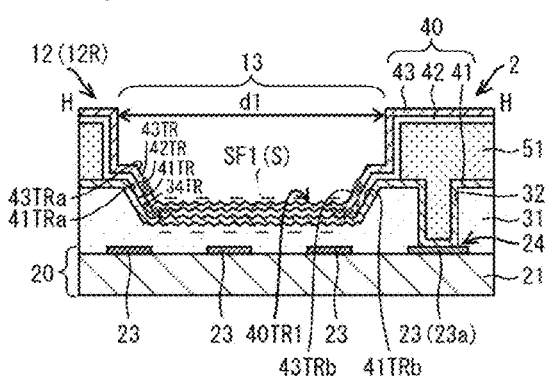
FIG. 14A FIG. 14B

LIGHT-EMITTING ELEMENT, DISPLAY PANEL, DISPLAY DEVICE, ELECTRONIC DEVICE AND METHOD FOR PRODUCING LIGHT-EMITTING ELEMENT

TECHNICAL FIELD

The present disclosure relates to a light-emitting element, a display panel, a display device, an electronic device, and a method for producing a light-emitting element.

BACKGROUND ART

In recent years, flat panel displays have been utilized in various products and fields, and there are demands for flat panel displays having even larger sizes, even higher picture quality, and even lower power consumption.

In view of such circumstances, organic electroluminescence (referred to as EL below) display devices provided with organic EL elements utilizing the electroluminescence of organic materials are attracting much attention as flat panel displays due to their excellent qualities, such as low voltage driving, high responsiveness, and self-luminosity, while being in a completely solid state.

An organic EL display device has a configuration including, for example, thin film transistors (TFTs) provided on a substrate, such as a glass substrate, and organic EL elements provided on the substrate connected to the TFTs.

Organic EL elements are light-emitting elements capable of emitting light at high luminance using low voltage direct current driving, and have a configuration in which a first electrode, an organic EL layer, and a second electrode are layered in this order.

An organic EL layer is an organic compound layer including a light-emitting layer. A full color organic EL display device generally includes organic EL elements of each color for red (R), green (G), and blue (B) formed in an array on the substrate as sub pixels. TFTs are employed in a full color organic EL display device to display pictures by selectively causing these organic EL elements to emit light at a desired luminance.

However, generally, a portion of light from the light generated in the light-emitting layer of each of the organic EL elements is not extracted outside from the organic EL element, but instead, propagates inside the organic EL element and is trapped within the organic EL element due to reflection, such as at the interfaces between the first electrode or the second electrode and the organic EL layer.

Thus, regarding organic EL display devices, there is a proposal for a method of extracting, to the outside, the portion of the light trapped within the organic EL elements. In the proposed method, light which is being reflected at interfaces, propagating within the organic EL elements, and not extractable to the outside from the organic EL elements (being attenuated due to a light propagation distance limit) is reflected using a plurality of walls and sloping banks having reflecting properties (see, for example, PTL 1).

FIG. 16A is a plan view illustrating a schematic configuration of sub pixels 510R, 510G, and 510B in an organic EL display device 500 stated in PTL 1. FIG. 16B is a cross-sectional view taken along line J-J of the sub pixel 510R illustrated in FIG. 16A.

As illustrated in FIG. 16A, the organic EL display device 500 has a configuration in which a plurality of sub pixels 510R, 510G, and 510B configured to exhibit each of three different colors, red (R), green (G), and blue (B), are each arranged within a display region.

As illustrated in FIG. 16B, the sub pixels 510R are each divided into a plurality of light-emitting regions 510Ra by partitions 527 serving as non-light-emitting regions (see FIG. 16B). Similarly, the sub pixels 510G and 510B are each divided into a plurality of light-emitting regions 510Ga and 510Ba.

As illustrated in FIG. 16B, the organic EL display device 500 includes a substrate 520 on which TFT circuit portions 521 are formed, and side layers 523 disposed on the substrate 520, with a flattened layer 522 interposed between the substrate 520 and the side layers 523. A first electrode 525 is disposed on the flattened layer 522 and the side layers 523. Reflection structures 526 are formed by the side layers 523 and the first electrode 525.

As illustrated in FIG. 16A, first electrodes 525 are isolated from each other for each of the sub pixels 510R, 510G, and 510B. The first electrode 525 for each of the sub pixels 510R, 510G, and 510B is electrically connected to a different respective TFT circuit portion 521 (TFT drive circuit) through a contact portion 524. A plurality of light-emitting regions within the same sub pixel, for example, the plurality of light-emitting regions 510Ra within the sub pixel 510R, have a common first electrode 525, and so are driven by the same TFT circuit portion 521.

As illustrated in FIG. 16B, the partitions 527 are disposed on the first electrode 525, and cover the first electrode 525 on the side layers 523 and the first electrode 525 at the contact portion 524.

An organic EL layer 528 including at least a light-emitting layer is disposed above the first electrode 225. A second electrode 529 is disposed on the organic EL layer 528 spanning across an entire display region 501. Organic EL elements are configured by the first electrode 525, the organic EL layer 528, and the second electrode 529. Since the partitions 527 are disposed on the first electrode 525, the organic EL layer 528 above the reflection structures 526 does not emit light. Regions within trenches 530 (indentations) formed by the partitions 527 and lying between the partitions 527 are employed as the light-emitting regions 510Ra, 510Ga, and 510Ba.

According to PTL 1, the reflection structures 526 include inclined faces at the side layers 523, and, out of the light emitted by the light-emitting regions, light traveling in the in-plane direction of the substrate 520 is reflected by the first electrode 525 on the inclined faces.

Thus, according to PTL 1, a portion of light trapped within the organic EL elements is reflected by the reflection structures 526 at the trenches 530, enabling extraction to the outside of the organic EL elements, and enabling the light extraction efficiency to be increased.

CITATION LIST

Patent Literature

PTL 1: Japanese Unexamined Patent Application Publication No. 2012-221811A (published Nov. 12, 2012).

Non-Patent Literature

NPL 1: Takayuki Okamoto, "Hyomen purazumon fukusha fotonikusu to kou kouritsu hikari toridashi gijutsu he no ouyou", JAPAN SOCIETY FOR THE PROMOTION OF SCIENCE, "131st Committee on Thin Films", 271st Research Conference document, Jun. 18, 2014, pp. 15-20.

SUMMARY

Technical Problem

However, in PTL 1, each of the sub pixels 510R, 510G, and 510B is provided with a plurality of trenches 530 disposed side-by-side at a predetermined trench pitch P along the horizontal direction in an island pattern (see FIG. 16B). In PTL 1, the inter-trench space S (see FIG. 16B), where the partition 527 is disposed, is a non-light-emitting region.

Namely, the organic EL display device 500 of PTL 1 has a configuration including, within the sub pixel 510R, for example, a plurality of light-emitting regions 510Ra partitioned by a plurality of non-light-emitting regions arising from presence of the partition walls 527, with one of the trenches 530 formed in each one of the light-emitting regions 510Ra.

Thus, in PTL 1, the surface area of the light-emitting regions within each of the sub pixels 510R, 510G, and 510B is defined by the size in plan view of openings, each of the openings being defined by two partitions 527, in other words, by the surface area in plan view of the trenches 530 within each of the sub pixels 510R, 510G, and 510B.

The organic EL display device 500 of PTL 1 includes the partitions 527 on the reflection structures 526 as stated above. Namely, the organic EL display device 500 of PTL 1 has a configuration including an insulating layer provided within the trenches 530. Accordingly, superfluous reflection occurs in which a portion of the light generated in the organic EL layer 528 may be reflected by an interface between the first electrode 525 and the insulating layer (partition 527) forming the reflection structure 526 or the like, and may propagate within the insulating layer without being extracted outside.

Further, the organic EL display device 500 of PTL 1 has a problem that the surface of the first electrode 525 disposed under the organic EL layer 528 including a light-emitting layer is flat, and thus, the light extraction efficiency is deteriorated due to the light absorption effect by surface plasmon of the surface of the first electrode 525.

In other words, the incidence of the emitted light from the light-emitting layer into the surface of a metal layer causes surface plasmon in which free electrons on the metal layer surface collectively oscillate to act as pseudo-particles (for example, see NPL 1).

The surface plasmon is localized at the interface between a metal layer and a dielectric layer, and the surface plasmon itself will not be radiated as propagation light to the outside of the element.

The surface plasmon is a combination of electric charge compressional waves and surface electromagnetic waves associated with the electric charge compressional waves (evanescent waves). When the light-emitting layer is present within an existence range of the surface electromagnetic waves, a significant portion of light-emitting energy becomes the surface plasmon to be dissipated.

According to NPL 1, the dissipated energy from an exciton generated in the light-emitting layer may be determined as a function of tangential component of the photon wavenumber (in-plane wavenumber) by regarding the recombination of the exciton as dipole radiation.

The target for which the light energy released from the light-emitting layer is dissipated may be divided into five regions depending on the magnitude of the in-plane wavenumber. Further, modes in which the light energy released from the light-emitting layer is dissipated is classified, depending on the target for which the light energy is dissipated, into five modes: (1) a radiation mode in which the light energy is radiated to the outside (atmosphere); (2) a substrate mode in which the light energy is trapped within a substrate such as a glass substrate; (3) a waveguide mode in which the light energy is trapped within the light-emitting layer; (4) a surface plasmon mode in which the light energy is absorbed by the plasmon on the metal surface; and (5) a mode in which the light energy performs an intra-band transition or an intra-band transition.

According to NPL 1, of these modes, the surface plasmon mode accounts for approximately 50%. That is, about a half of the light energy released from the light-emitting layer is dissipated into the surface plasmon and absorbed by the surface plasmon.

Such absorption by the surface plasmon notably occurs in a case where the surface of the metal layer is flat.

Therefore, as in PTL 1, when the surface of the first electrode 525 into which the light radiated from the light-emitting layer in the organic EL layer 528 is made incidence is flat, and if the wavelength of light reached the first electrode 525 from the light-emitting layer becomes same as a resonant frequency of the surface plasmon generated on the surface of the first electrode 525 (i.e., the light energy released from the light-emitting layer has the same resonant frequency as that of plasmon phenomenon), then the light energy released from the light-emitting layer is absorbed by the surface plasmon.

A portion of the light energy absorbed by the surface plasmon is converted into heat energy and is lost in the end. This causes a significant decrease in the light extraction efficiency.

In view of the above circumstances, an object of the present disclosure is to provide a light-emitting element, a display panel, a display device, and an electronic device capable of extracting light generated in the light-emitting layer to the outside with good efficiency, and a method for producing a light-emitting element.

Solution to Problem

To address the above issues, a light emitting element of an aspect of the present invention is a light emitting element including a substrate, an interlayer insulating layer on the substrate, a first electrode, an electroluminescence layer including at least a light emitting layer, and a second electrode. The first electrode, the electroluminescence layer, and the second electrode are layered in this order with an interlayer insulating layer interposed between the substrate and the first electrode. One electrode out of the first electrode and the second electrode includes a reflective electrode. At least one trench having an indented shape is formed within a single light-emitting region. The at least one trench includes the first electrode, the electroluminescence layer, and the second electrode, the first electrode, the electroluminescence layer, and the second electrode being layered in this order and in contact with each other. A concave-convex portion of the submicron order configured to diffract surface plasmons is provided on a surface of the reflective electrode on a side closer to the electroluminescence layer.

To address the above issues, a display panel according to an aspect of the present invention includes a plurality of the light-emitting elements being arranged.

To address the above issues, a display device according to an aspect of the present invention includes the display panel 2.

To address the above issues, an electronic device according to an aspect of the present invention includes the light-emitting element.

To address the above issues, a method for producing a light-emitting element according to an aspect of the present invention is a method including: forming at least one trench including a concave-convex portion of submicron order in a region for forming a light-emitting region of an interlayer insulating layer layered on a substrate; forming a first electrode on the interlayer insulating layer, the first electrode including a trench including a concave-convex portion of submicron order along the trench of the interlayer insulating layer; forming an edge cover on the first electrode, the edge cover surrounding the trench in the first electrode, covering an end portion of the first electrode where the trench is not formed, and including an opening at a light-emitting region; and forming an electroluminescence layer and a second electrode on the first electrode, the electroluminescence layer including at least a light-emitting layer, the first electrode, the electroluminescence layer, and the second electrode being layered in this order and in contact with each other at the trench in the first electrode and, each of the electroluminescence layer and the second electrode including, along the trench of the first electrode, a trench including a concave-convex portion of submicron order. In such a method, a reflective electrode is employed as one electrode out of the first electrode and the second electrode.

Advantageous Effects of Invention

According to an aspect of the present invention, the trenches in the light-emitting element each includes the first electrode, the electroluminescence layer, and the second electrode layered in this order and in contact with each other, and do not include an insulating layer on a reflection structure, as is the case in PTL 1.

Thus, in the light-emitting element, light emitted from a light-emitting region is reflected by a reflective electrode without interposing an insulating layer. Thus, in the light-emitting element, superfluous reflection like that of PTL 1 does not occur, enabling light generated in the light-emitting layer to be extracted outside with good efficiency.

In addition, according to an aspect of the present invention, the light energy on the reflective electrode surface can be prevented from being dissipated by the plasmon, the light from the plasmon in which the light energy is absorbed on the reflective electrode surface can be re-extracted, and the light can be reflected by the reflective electrode on the trench side faces. Thus, according to an aspect of the present invention, the attenuation of the guided light within the light-emitting layer can be suppressed and the light extraction efficiency can be greatly improved.

Thus, according to an aspect of the present invention, a light-emitting element, a display panel, a display device, and an electronic device capable of extracting light generated in the light-emitting layer to the outside with good efficiency, and a method for producing a light-emitting element can be provided.

BRIEF DESCRIPTION OF DRAWINGS

FIG. 7A is a plan view illustrating a schematic configuration of a pixel circuit part of a display panel according to a second embodiment of the present invention. FIG. 7B is a plan view illustrating a schematic configuration of a sub pixel circuit portion of the display panel according to the second embodiment of the present invention. FIG. 7C is a cross-section arrow view taken along line D-D of the sub pixel circuit portion of the display panel illustrated in FIG. 7B. FIG. 7D is a cross-sectional view illustrating an example of a schematic configuration of a cross section S surrounded by a two-dot chain line in the display panel illustrated in FIG. 7C.

FIG. 9A is a plan view illustrating a schematic configuration of a pixel circuit part of a display panel according to a third embodiment of the present invention, illustrated alongside the sub pixel circuit portion of the first embodiment of the present invention for comparison purposes. FIG. 9B is a plan view illustrating a schematic configuration of a sub pixel circuit portion of the display panel according to the third embodiment of the present invention. FIG. 9C is a cross-section arrow view taken along line E-E of the sub pixel circuit portion of the display panel illustrated in FIG. 9B. FIG. 9D is a cross-sectional view illustrating an example of a schematic configuration of a cross section S surrounded by a two-dot chain line in the display panel illustrated in FIG. 9C.

FIG. 14A is a diagram illustrating, arranged above and below, a plan view illustrating a schematic configuration of a sub pixel circuit portion according to a first modification of the fourth embodiment of the present invention, and a cross-section arrow view taken along line G-G of the sub pixel circuit portion illustrated in the plan view. FIG. 14B is a diagram illustrating, arranged above and below, a plan view illustrating a schematic configuration of a sub pixel circuit portion according to a second modification of the fourth embodiment of the present invention, and a cross-section arrow view taken along line H-H of the sub pixel circuit portion illustrated in the plan view.

DESCRIPTION OF EMBODIMENTS

A detailed description follows regarding embodiments of the present invention.
First Embodiment
A description follows regarding an embodiment of the present invention, with reference to FIGS. 1A to 1C through FIGS. 6A and 6B.

In the following, a description is given of an example of a case in which light-emitting elements including an EL element according to the present embodiment are employed as pixel circuits (sub pixel circuit portions) in a display device.
Schematic Configuration of Display Device
The display device according to the present embodiment includes an active electroluminescence display panel (EL panel) including active pixels, or a passive EL panel without active elements within pixels. The display device of the present embodiment may also further include a driver, such as a gate scan driver or source driver, depending on the design scheme of the display device.

In the present embodiment, a description is given of an example of an organic EL display device, as an example of a display device according to the present embodiment. The organic EL display device is provided with an active matrix organic EL panel using, as a substrate for mounting EL elements, a substrate (active matrix substrate, semiconductor substrate) formed with thin film transistors (TFTs) as active elements. The active matrix organic EL panel includes, as respective pixel circuits (sub pixel circuit portions), a plurality of light-emitting elements configured by organic EL elements provided, as EL elements, above the substrate with an interlayer insulating layer interposed between the organic EL elements and the substrate.

Moreover, in the following, a description is given of an example of a case in which an EL panel includes, as sub pixels, pixel circuits (sub pixel circuit portions) formed from light-emitting elements of red (R), green (G), and blue (B). In the following, the light-emitting elements (pixel circuits) according to the present embodiment are referred to as "sub pixel circuit portions".

Figure 2A:
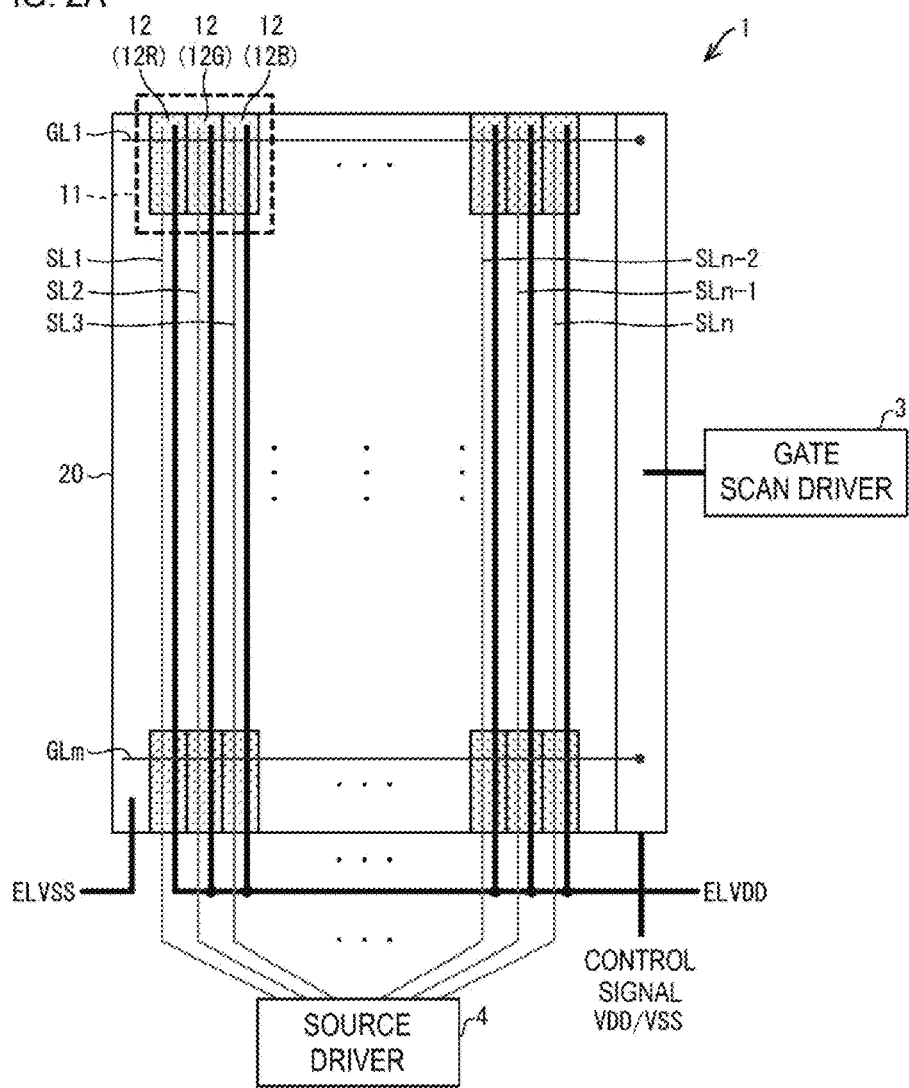
FIG. 2A is a plan view illustrating a schematic configuration of a display device according to a first embodiment of the present invention.
Figure 2B:
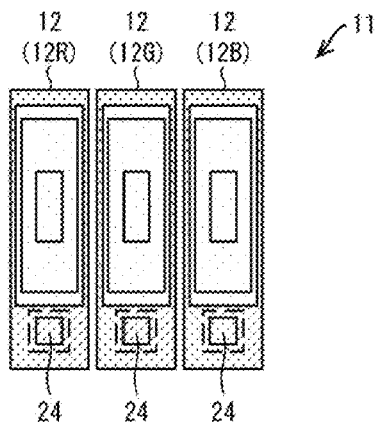
FIG. 2B is a plan view illustrating a schematic configuration of a pixel circuit part illustrated in FIG.2A.

FIG. 2A is a plan view (transparent view) illustrating a schematic configuration of a display device 1 according to the present embodiment. FIG. 2B is a plan view illustrating a schematic configuration of a pixel circuit portion 11 illustrated in FIG. 2A.

The display device 1 according to the present embodiment is an organic EL display device for color display using the three primary colors RGB.

The display device 1 according to the present embodiment includes, as illustrated in FIG. 2A: a display panel 2 (display part) formed from an active matrix organic EL panel; drivers, such as a gate scan driver 3 (gate driver) and a source driver 4; a power source circuit part, such as a high level power source circuit part, a low level power source circuit part, and a logic power source circuit part, which is not illustrated; and a display control circuit part, which is not illustrated. More detailed description follows.
Display Panel 2
The display panel 2 includes a plurality of (m) scanning lines GL1 to GLm, and a plurality of (n) data lines SL1 to SLn, each orthogonal to the scanning lines GL1 to GLm, the plurality of (m) of scanning lines GL1 to GLm and the plurality of (n) data lines SL1 to SLn being provided in a predetermined position. Note that in the present embodiment, m and n are both integers of 2 or greater.

In the following, when there is no particular need to discriminate, the scanning lines GL1 to GLm are referred to collectively as "scanning lines GL", and the data lines SL1 to SLn are referred to collectively as "data lines SL".

The display panel 2 includes a plurality of (m×n) sub pixel circuit portions 12 provided as sub pixels corresponding to respective intersection points in which the scanning lines GL (scanning lines GL1 to GLm) and the data lines SL (data lines SL1 to SLn) intersect.

In the present embodiment, the display panel 2 includes, as illustrated in FIGS. 2A and 2B, pixel circuit portions 11 each formed from the sub pixel circuit portions 12 (light-emitting elements, pixel circuits) of each of three colors for the three different colors RGB to be exhibited. The pixel circuit portions 11 are provided as pixels in a matrix pattern, as illustrated in FIG. 2A.

In the following, the sub pixel circuit portions 12 configuring R sub pixels are referred to as "R sub pixel circuit portions 12R", the sub pixel circuit portions 12 configuring G sub pixels are referred to as "G sub pixel circuit portions 12G", and the sub pixel circuit portions 12 configuring B sub pixels are referred to as "B sub pixel circuit portions 12B".

The R sub pixel circuit portions 12R, the G sub pixel circuit portions 12G, and the B sub pixel circuit portions 12B are arranged in the extension direction of the scanning lines GL, repeatedly in this order.

The R sub pixel circuit portions 12R, the G sub pixel circuit portions 12G, and the B sub pixel circuit portions 12B are each arranged side by side in plural for each color in the extension direction of the respective data lines SL.

The display panel 2 includes a plurality of power source lines to supply a high level potential ELVDD (referred to below as "high level power source lines" and indicated by the same reference sign as the high level power source potential, ELVDD) to drive EL elements 40 (see FIG. 1) in each of the respective sub pixel circuit portions 12, the plurality of power source lines being provided in a predetermined position. The display panel 2 also includes a plurality of power source lines to supply a low level potential ELVSS (referred to below as "low level power source lines" and indicated by the same reference sign as the low level potential, ELVSS), lower than the high level potential ELVDD, to drive EL elements 40 in each of the respective sub pixel circuit portions 12, the plurality of power source lines being provided in a predetermined position. The high level potential ELVDD and the low level potential ELVSS are each fixed potential.

The high level power source lines ELVDD are wired parallel to the data lines SL, and, while not illustrated, the low level power source lines ELVSS are wired parallel to the scanning lines GL.

The display panel 2 includes a plurality of (m) emission lines (light emission control lines, not illustrated) wired parallel to the respective scanning lines GL to control the timing of light emission/non-light-emission of the EL elements 40 in the sub pixel circuit portions 12.

Each of the sub pixel circuit portions 12 according to the present embodiment has a configuration including an EL element 40 provided on a semiconductor substrate 20, with an interlayer insulating layer 31, stated later, interposed between the semiconductor substrate 20 and the EL element 40 (see FIG. 1B). At each of the sub pixel circuit portions 12, the semiconductor substrate 20 includes respective wiring, such as the scanning line GL, the data line SL, the high level power source line ELVDD, the low level power source line ELVSS, and the emission line (not illustrated), and a TFT circuit portion 22 (see FIGS. 1A and 1B), serving as a drive circuit part (pixel circuit parts) to drive the EL element 40 in each of the sub pixel circuit portions 12.

The high level power source lines ELVDD are connected to the high level power source circuit part (not illustrated). A voltage of the high level potential ELVDD, this being a higher potential than the voltage of the low level potential ELVSS applied to a second electrode 43 (negative electrode) of the EL element 40, is applied to the first electrode 41 (positive electrode) of the EL element 40 in each of the sub pixel circuit portions 12 in order to supply a drive current (light emission current) depending on display data. The low level power source lines ELVSS are connected to the low level power source circuit part (not illustrated).

The high level power source line ELVDD in each of the sub pixel circuit portions 12 is wiring for supplying the high level potential ELVDD, supplied from the high level power source circuit part, to the EL element 40 in each of the sub pixel circuit portions 12. The low level power source line ELVSS in each of the sub pixel circuit portions 12 is wiring for supplying the low level potential ELVSS, supplied from the low level power source circuit part, to the EL element 40 in each of the sub pixel circuit portions 12.

Moreover, each of the scanning lines GL and each of the emission lines are each connected to the gate scan driver 3, and the data lines SL are connected to the source driver 4.

The scanning line GL is wiring for supplying a scanning signal, to select the EL element 40 of the sub pixel circuit portion 12 for which light emission is desired, to the TFT circuit portion 22 of the sub pixel circuit portion 12. The emission line is wiring for supplying a light emission control signal, to control the timing of light emission/non-light-emission of the EL element 40, to the TFT circuit portion 22 of the sub pixel circuit portion 12.

The data line SL is wiring for supplying a data signal (data voltage), determined on the basis of a source control signal output from the display control circuit part (not illustrated), to the TFT circuit portion 22 of the sub pixel circuit portion 12.

Driver

As stated above, the display device 1 includes drivers, including the gate scan driver 3 and the source driver 4, provided therein.

The gate scan driver 3 drives each of the scanning lines GL and each of the emission lines on the basis of a control signal, such as a clock signal clk, received from the display control circuit part (not illustrated).

The gate scan driver 3 includes a plurality of shift registers (not illustrated) and a plurality of buffers (not illustrated), and the scanning lines GL1 to GLm are selected in sequence from the scanning line GL1 by output signals being supplied from each stage of the shift registers to the corresponding scanning line GL via corresponding buffers.

The gate scan driver 3 includes a plurality of control transistors to change the potential of each of the emission lines to high level (VDD) or to low level (VSS), a plurality of power source lines (referred to below as "high level logic power source lines VDD") to supply the high level potential VDD to each of the emission lines via the control transistors, and a plurality of power source lines (referred to below as "low level logic power source lines VSS) to supply a low level potential VSS to each of the emission lines via the control transistors. The gate scan driver 3 allows each of the sub pixel circuit portions 12 to be in a light emission or non-light-emission state by sequentially supplying light emission control signals at a potential of either the high level (VDD) or the low level (VSS) to each of the emission lines on the basis of control signals, such as the clock signal clk.

The source driver 4 is connected to each of the data lines SL and drives each of the data lines SL.

The source driver 4 includes shift registers, sampling circuits, latch circuits, D/A converters, buffers, and the like (not illustrated). The source driver 4 sequentially stores one row's worth of display data (video data) on the basis of the source control signals output from the display control unit, converts display data (gradation data) for each of the sub pixels included in the one row's worth of display data into data voltages (gradation voltages), and supplies the data voltages to the corresponding data lines SL.

FIG. 2A illustrates a case, as an example, in which the gate scan driver 3 is a monolithic circuit (monolithic gate) fabricated monolithically on the display panel 2 at, for example, one side of the display panel 2, and in which the source driver 4 is formed by an integrated circuit (IC) chip (source driver IC) provided at an external portion of the display panel 2. However, the present embodiment is not limited thereto.

For example, gate scan drivers 3 may be disposed at both sides of the display panel 2 (namely, at two opposing sides thereof). In such cases, of gate scan drivers 3 being disposed at both sides of the display panel 2, the odd numbered rows of scanning lines GL and the even numbered rows of scanning lines GL may be driven by different gate scan drivers 3, or what is referred to as an interlaced structure may be adopted in which the plurality of scanning lines GL are treated as a set, connection terminals are alternately lead out to the two respective sides of the display panel 2, and the gate drivers 3 on the two respective sides of the display panel 2 drive the corresponding scanning lines GL.

The source driver 4 may also be formed monolithically on the display panel 2, or source drivers 4 may be formed on both sides of the display panel 2. The gate scan driver 3 may also be formed by an IC chip (gate driver IC).

In the present embodiment, the gate scan driver and an emission driver are formed integrated together. However, it goes without saying that the gate scan driver and the emission driver may each be provided separately.

Power Source Circuit Part

As stated above, the display device 1 includes the power source circuit parts, such as the high level power source circuit part, the low level power source circuit part, and the logic power source circuit part.

The high level power source circuit part supplies the high level potential ELVDD to the high level power source lines ELVDD and the low level power source circuit part supplies the low level potential ELVSS to the low level power source lines ELVSS.

The logic power source circuit part supplies either the high level potential VDD or the low level potential VSS as logic power source potentials to the high level logic power source line VDD and the low level logic power source line VSS provided in the gate scan driver 3.

Display Control Circuit Part

The display control circuit part controls the source driver 4 and the gate scan driver 3 by sending the display data (video data) and the source control signals to the source driver 4 and by sending scan control signals to the gate scan driver 3. The source control signals include, for example, control signals such as a source start pulse and a source clock. The scan control signals include, for example, control signals such as a scan start pulse and a scan clock (clock signal clk).

Sub Pixel Circuit Portion 12 Configuration

Next, more detailed description follows regarding a configuration of the sub pixel circuit portions 12 in the above display panel 2.

Note that, as illustrated in FIG. 2B, the configuration is basically the same in the R sub pixel circuit portion 12R, the G sub pixel circuit portion 12G, and the B sub pixel circuit portion 12B.

Figure 1A:
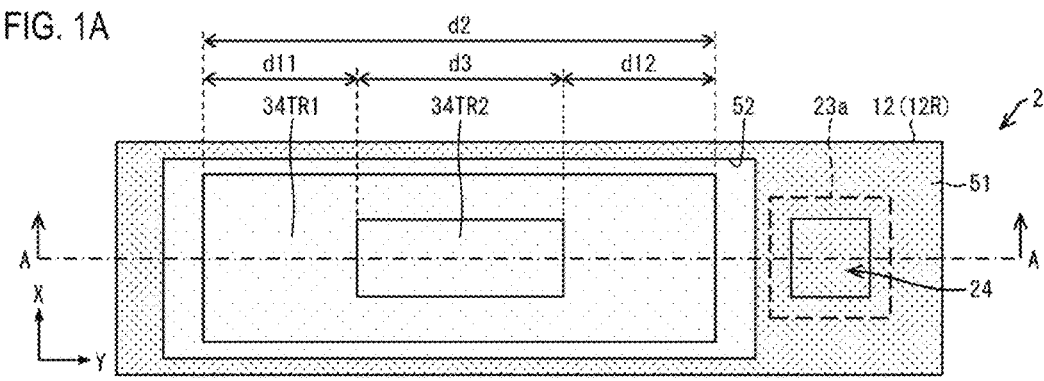
FIG. 1A is a plan view illustrating a schematic configuration of a sub pixel circuit portion of a display panel according to a first embodiment of the present invention.
Figure 1B:
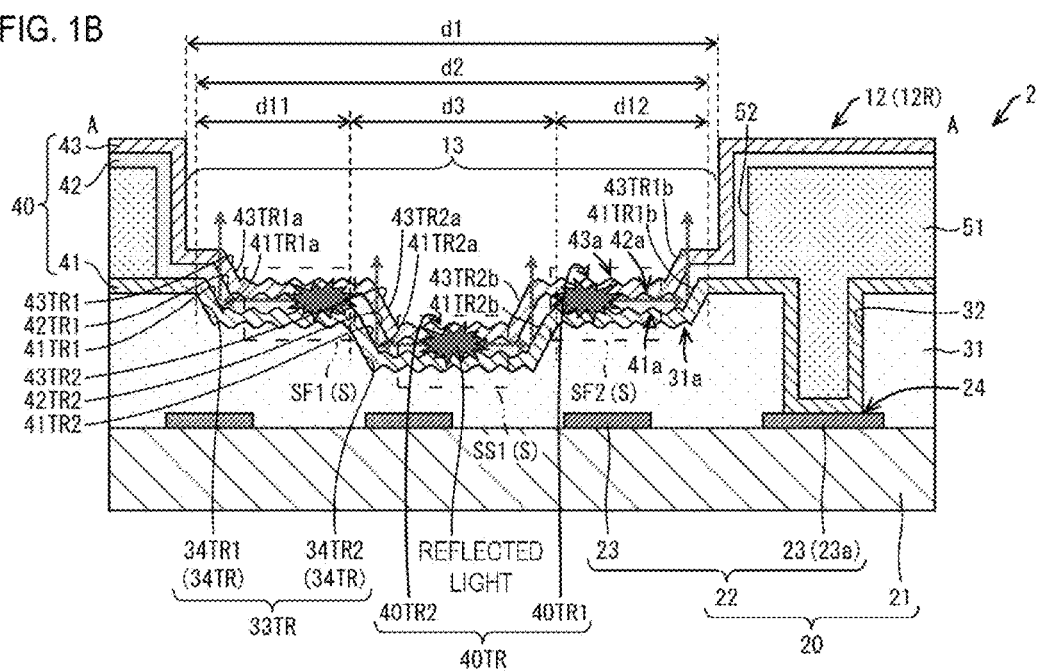
FIG. 1B is a cross-section arrow view taken along line A-A of the sub pixel circuit portion of the display panel illustrated in FIG. 1A.
Figure 1C:
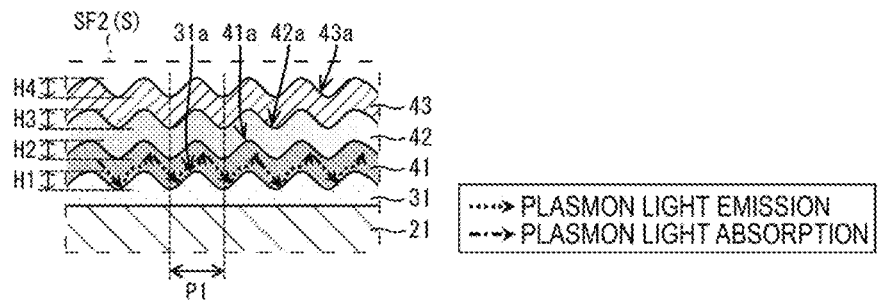
FIG. 1C is a cross-sectional view illustrating an example of a schematic configuration of a cross section S surrounded by a two-dot chain line in the display panel illustrated in FIG. 1B.

Accordingly, FIGS. 1A to 1C illustrates a configuration of the sub pixel circuit portion 12 by employing the R sub pixel circuit portion 12R as an example of the sub pixel circuit portion 12.

FIG. 1A is a plan view (transparent view) illustrating a schematic configuration of the sub pixel circuit portion 12 of the display panel 2 according to the present embodiment. FIG. 1B is a cross-section arrow view taken along line A-A of the sub pixel circuit portion 12 of the display panel 2 illustrated in FIG. 1A. FIG. 1C is a cross-sectional view illustrating an example of a schematic configuration of a cross section S surrounded by a two-dot chain line in the display panel 2 illustrated in FIG. 1B.

Note that all of the cross sections S illustrated in FIG. 1B (cross sections SF1, SF2 that are cross sections of a first trench portion 40TR1, and a cross section SS1 that is a cross section of a second trench portion 40TR2) have the same configuration. Thus, in FIG. 1C, the configuration of the cross section S is illustrated by employing the cross section SF2 as an example of the cross section S.

As illustrated in FIG. 1B, the display panel 2 includes the EL element 40 layered on the semiconductor substrate 20 with the interlayer insulating layer 31 interposed between the EL element 40 and the semiconductor substrate 20.

The EL element 40 has a configuration in which the first electrode 41, the EL layer 42, and the second electrode 43 are layered in this order.

An edge cover 51 is formed at end portions (pattern end portions) of the first electrode 41 in each of the sub pixel circuit portions 12 and covers the end portions.

Although not illustrated, the display panel 2 preferably has a sealing structure including a sealing member, such as a sealing film or a sealing substrate. The EL elements 40 can be protected from water or the like by covering the EL elements 40 with a sealing film such as an inorganic film (not illustrated), or by covering the EL elements 40 with a sealing substrate such as a cover glass (not illustrated). As required, a filler resin layer may be employed to fill between the EL elements 40, and the sealing film or sealing substrate.

Next, detailed description follows regarding each of the configurations illustrated in FIGS. 1A and 1B.

Semiconductor Substrate 20

The semiconductor substrate 20 includes an insulating substrate 21, serving as a base, and, on the insulating substrate 21, the TFT circuit portions 22 (drive circuit parts, pixel circuit parts) and the various wiring lines stated above, such as the scanning lines GL, the data lines SL, the high level power source lines ELVDD, the low level power source lines ELVSS, and the emission lines (not illustrated in FIGS. 1A and 1B) to drive the EL elements 40.

Examples of the insulating substrate 21 include: inorganic substrates formed from inorganic materials, such as glass, quartz, or a ceramic; and also plastic substrates formed from a plastic, such as polyethylene terephthalate, a polycarbazole, or a polyimide. As an example, a glass substrate, such as an alkali-free glass substrate may be employed for the insulating substrate 21. As the insulating substrate 21, for example, a substrate may be employed in which a surface of a metal substrate formed from a metal, such as aluminum (Al) or iron (Fe), is coated with an insulating material, such as silicon oxide ($SiO_2$) or an organic insulating material, or a substrate such as a metal substrate containing Al or the like, the surface of which has been subjected to insulation treatment using a method such as anode oxidation, may be employed.

The insulating substrate 21 employed is not limited to a specific substrate when the display panel 2 is a top-emitting display panel in which light is emitted from the upper side of the EL elements 40, namely, from the opposite side of the EL elements 40 to the semiconductor substrate 20 side. However, when the display panel 2 is a bottom-emitting display panel in which light is emitted from the lower side of the EL elements 40, namely, from the semiconductor substrate 20 at the back face side of the insulating substrate 21, a transparent or semi-transparent substrate material is employed for the insulating substrate 21.

The TFT circuit portion 22 is provided for each of the sub pixel circuit portions 12. The TFT circuit portion 22 controls current to the EL element 40 according to the gradation voltage. The configuration of the TFT circuit portion 22 is not limited to a specific configuration, as long as the TFT circuit portion 22 is able to drive the sub pixel circuit portion 12 individually. Examples of the TFT circuit portion 22 include a TFT circuit portion having only a switch function such as a function to switch ON/OFF, a TFT circuit portion having a memory function, a TFT circuit portion having only a function to supply current to unit pixels, a TFT circuit portion having a function to regulate a supplied current amount, and a TFT circuit portion having two or more of the above functions.

The TFT circuit portion 22 having such functions can be configured by, for example, drive transistors, control transistors, storage capacitors, or the like, either as a single element or a freely-selected combination of the plurality of elements thereof. These elements may be connected in a freely-selected way, such as to the scanning lines GL, the data lines SL, or the high level power source lines ELVDD, so as to achieve the desired function.

The TFT circuit portion 22 includes a plurality of TFTs 23 as elements such as a drive transistor, a control transistor, and a storage capacitor.

From out of these TFTs 23, a drive TFT 23a, which is a drive transistor to supply drive current to the EL element 40, forms a drive TFT-first electrode contact portion 24 by making an electrical connection to the first electrode 41 of the EL element 40 through a contact hole 32 formed in the interlayer insulating layer 31, as illustrated in FIGS. 1A and 1B.

The drive TFT-first electrode contact portion 24 electrically connected to the TFT circuit portion 22 and the first electrode 41 of the EL element 40 allows the EL element 40 to be supplied with, as drive current to drive the EL element 40, a fixed amount of current generated by a high level positive voltage applied from the high level power source line ELVDD and a data voltage (gradation voltage) applied from the data line SL.

The interlayer insulating layer 31 is provided on the TFT circuit portion 22.

Interlayer Insulating Layer 31

The interlayer insulating layer 31 is, as illustrated in FIG. 1B, an insulating film for electrically isolating the TFT circuit portion 22 and the first electrode 41 of the EL element 40 from each other, except at the drive TFT-first electrode contact portion 24.

Known materials may be employed for the material of the interlayer insulating layer 31, and examples thereof include inorganic insulating materials, such as silicon oxide ($SiO_2$), silicon nitride (SiN or $Si_2N_4$), and tantalum oxide (TaO or $Ta_2O_5$), and organic insulating materials, such as acrylic resin and resist materials.

When the display panel 2 is a top-emitting display panel, a light blocking insulating layer having light blocking properties may be formed as the interlayer insulating layer 31. This can prevent a change in TFT characteristics even if external light is made incident on the TFT circuit portion 22.

Examples of materials for a light blocking interlayer insulating layer include: materials with a pigment or dye, such as phthalocyanine or quinacridone, dispersed in a polymer resin, such as polyimide; inorganic insulating material such as color resists and black matrix materials; and the like.

The interlayer insulating layer 31 may have a single layer structure, or may have a layered structure formed from a plurality of layers.

The interlayer insulating layer 31 is formed on the semiconductor substrate 20, across the entire display region of the semiconductor substrate 20.

In the interlayer insulating layer 31, at a position corresponding to the light-emitting region 13 of the respective sub pixel circuit portions 12 (namely, a light emission effective area within a sub pixel), a trench having a step shape (referred to below as "step-shaped trench") 33TR is formed from a plurality of trench portions 34TR (dips, insulating trench portions) each having an indented shape (trench shape) serving as a plurality of walls and banks.

The step-shaped trench 33TR has a trench-in-trench structure (step-shaped trench structure) in which within one trench portion 34TR, another trench portion 34TR is formed. The step-shaped trench 33TR has side walls formed in a step shape.

The step-shaped trench 33TR according to the present embodiment has a configuration in which, in plan view, within a first trench portion 34TR1 (trench portion 34TR) serving as a main trench, there is a second trench portion 34TR2 (trench portion 34TR) formed as a sub trench and having a size (namely, plan view size, referred to below as "length-and-width size") smaller than that of the first trench portion 34TR1 in the longitudinal direction (Y direction) and transverse direction (X direction) of the sub pixel circuit portion 12.

As illustrated in FIG. 1B, the step-shaped trench 33TR has a cross-section profile in which the second trench portion 34TR2 is located further to the semiconductor substrate 20 side than the first trench portion 34TR1. Namely, the second trench portion 34TR2 is located further toward the semiconductor substrate 20 than the first trench portion 34TR1 in a direction perpendicular to the substrate surface of the semiconductor substrate 20.

For ease of illustration, FIG. 1A illustrates, as the main trench and the sub trench, only the first trench portion 34TR1 and the second trench portion 34TR2 in the interlayer insulating layer 31.

The step-shaped trench 33TR is, as illustrated in FIGS. 1A and 1B, formed in a region adjacent to the region for forming the contact hole 32 to form the drive TFT-first electrode contact portion 24.

The interlayer insulating layer 31 having such a configuration may, for example, be formed using a photolithographic method or the like by patterning a layer formed of insulating material deposited using a method such as a chemical vapor deposition (CVD) method, a sputtering method, or a spin coating method.

The side wall of each of the trench portions 34TR preferably includes an inclined face. The angle of the inclined face (taper angle), that is, the angle formed between the inclined face and a face parallel to the substrate face of the insulating substrate 21, is particularly preferably set at 45° or near 45°. This enables light being reflected at interfaces and guided within the EL layer 42 to be reflected by the reflective electrode of the EL element 40 formed in each of the trench portions 34TR, and extracted at the front face side (namely, the display face side) of the display panel 2 with good efficiency. However, the above taper angle is not limited to the above angle because light at various angles is present in the light being guided by the EL layer interfaces.

The plan view area ratio and the surface area ratio of the second trench portion 34TR2 with respect to those of the first trench portion 34TR1, and the length and width dimensions and depth of the second trench portion 34TR2 are preferably set such that the length-and-width size of the second trench portion 34TR2 does not exceed a light propagation distance limit.

To obtain the desired number of trenches-in-trenches (in other words, the step-shaped trench 33TR having the desired number of steps), the layer thickness of the interlayer insulating layer 31 may be set as appropriate according to the number of trench portions 34TR to be formed within the first trench portions 34TR1, and is not limited to a specific layer thickness.

The depth of each of the trench portions 34TR is also not limited to a specific depth. However, the overall thickness of the interlayer insulating layer 31 increases as the depth of the trench portions 34TR becomes deeper, leading to an increase in the thickness of the finally obtained sub pixel circuit portions 12 and the thickness of the display panel 2 including the sub pixel circuit portions 12. Thus, the layer thickness of the interlayer insulating layer 31 is preferably set as appropriate within a range in which shorting does not occur between the EL element 40 and each of the lines and the TFT circuit portion 22 on the semiconductor substrate 20, such that the thickness of the sub pixel circuit portions 12 is the desired thickness.

Although the thickness of the interlayer insulating layer 31 is not limited to a specific layer thickness, the interlayer insulating layer 31 is formed such that the layer thickness of the interlayer insulating layer 31 in the non-light-emitting regions outside the light-emitting regions 13 (in other words, the layer thickness of the interlayer insulating layer 31 prior to forming the step-shaped trench 33TR) is generally a layer thickness in the order of a few Further, a concave-convex portion 31a is provided on the surface of the interlayer insulating layer 31 in the light-emitting region 13, as illustrated in FIGS. 1B and 1C. In FIGS. 1B and 1C, an example is given of a case in which the concave-convex portion 31a is provided on a bottom wall (plane portion) of each of the trench portions 34TR in the interlayer insulating layer 31.

The concave-convex portion 31a is preferably provided on the entire surface of the bottom wall of each of the trench portions 34TR in the interlayer insulating layer 31. However, the present embodiment is not limited thereto, and the concave-convex portion 31a may be provided on at least a part of the surface of the interlayer insulating layer 31 in the light-emitting regions 13. For example, the concave-convex portion 31a may be provided on a part of the bottom wall of each of the trench portions 34TR in the interlayer insulating layer 31, or the concave-convex portion 31a may be provided on the entire surface of the interlayer insulating layer 31 in the light-emitting regions 13 including side walls in each of the trench portion 34TR.

The pitch P1 and the concave-convex height H1 of the concave-convex portion 31a (the concave-convex height, that is, the height from a valley (bottom surface of concave portion) to a peak (tip of convex portion) of the concave-convex portion 31a) are not particularly limited to specific values; however, the pitch P and the concave-convex height H1 are formed on a submicron order level.

Note that in FIG. 1C, the pitch P1 is illustrated as the width of the convex portion (convex width (convex portion skirt width), that is, a distance between adjacent concave portions) in the concave-convex portion 31a; however, the pitch P1 may also be referred to as the width of the concave portion (concave width, that is, a distance between adjacent convex portions) in the concave-convex portion 31a.

In other words, the convex width and the concave width in the concave-convex portion 31a are not particularly limited to specific values; however, the convex width and the concave width are formed on a submicron order level.

A method for forming the concave-convex portion 31a on the surface of the interlayer insulating layer 31 is not particularly limited to a specific method; however, the method includes, for example, a method for patterning the surface of the interlayer insulating layer 31 in each of the trench portions 34TR by using a photolithographic method or the like. However, the present embodiment is not limited thereto, and for example, the concave-convex portion 31a may be formed on the surface of the interlayer insulating layer 31 by applying, for example, a thermal nanoimprint or an ultraviolet (UV) nanoimprint to the surface of the interlayer insulating layer 31 in each of the trench portions 34TR.

In addition, for example, a mold (stamp) may be used for forming the concave-convex portion 31a. The mold includes a convex portion corresponding to each of the trench portions 34TR and a fine concave-convex structure corresponding to the concave-convex portion 31a is provided on the surface of the convex portion. In this case, it may be possible to simultaneously form each of the trench portions 34TR and the concave-convex portion 31a by pressing the mold on the surface of a layer formed from an insulating material, the layer being deposited by using, for example, a CVD method, a sputtering method, a spin-coating method, or the like.

Further, the concave-convex portion 31a may be formed each time when each of the trench portions 34TR is formed, or may be formed at once after each trench portion 34TR is formed.

For example, as stated later, a main trench may be first formed and then the concave-convex portion 31a may be formed on the main trench, and a sub trench may be first formed and then the concave-convex portion 31a may be formed on the sub trench. Alternatively, a main trench and a sub trench may be first formed and then the concave-convex portion 31a may be collectively formed on the main trench and the sub trench.

EL Element 40

As stated above, the EL element 40 has a configuration in which the first electrode 41, the EL layer 42, and the second electrode 43 are layered in this order.

The EL element 40 is layered on the step-shaped trench 33TR in the interlayer insulating layer 31 along the step-shaped trench 33TR. Thus, the EL element 40 includes a step-shaped trench 40TR (reflective trench) on the step-shaped trench 33TR in the interlayer insulating layer 31 having an indented shape in conformance with the shape of the step-shaped trench 33TR.

The step-shaped trench 40TR according to the present embodiment has a configuration in which, in plan view, within the first trench portion 40TR1 serving as a main trench, the second trench portion 40TR2 is formed as a sub trench having a length-and-width size smaller than that of the first trench portion 40TR1.

As illustrated in FIG. 1B, the step-shaped trench 40TR has an indented shape with a cross-section profile in which the second trench portion 40TR2 is located further to the semiconductor substrate 20 side than the first trench portion 40TR1. Namely, the second trench portion 40TR2 is located further toward the semiconductor substrate 20 than the first trench portion 40TR1 in a direction perpendicular to the substrate surface of the semiconductor substrate 20.

The step-shaped trench 40TR includes the first electrode 41, the EL layer 42, and the second electrode 43, these being layered in this order and in contact with each other, and does not include a partition (insulating layer) on a reflection structure as in the case of the trench 530 in the sub pixel 510R of PTL 1.

Thus, the sub pixel circuit portion 12 according to the present embodiment has only a single light-emitting region 13 and does not have a configuration such as that of PTL 1 in which the light-emitting region is partitioned into a plurality of light-emitting regions by non-light-emitting regions.

Therefore, the sub pixel circuit portion 12 according to the present embodiment reflects light from the light-emitting region 13 using the reflective electrode without interposing an insulating layer, and so superfluous reflection such as that of PTL 1 does not occur.

Within the light-emitting region 13, the first electrode 41, the EL layer 42, and the second electrode 43 configuring the step-shaped trench 40TR each have a shape in conformance with the shape of the step-shaped trench 33TR.

More specifically, the first electrode 41 includes a step-shaped trench (step-shaped trench structure) having a shape in conformance with the shape of the step-shaped trench 33TR. The EL layer 42 includes a step-shaped trench (step-shaped trench structure) having a shape in conformance with the step-shaped trench structure of the first electrode 41. The second electrode 43 includes a step-shaped trench (step-shaped trench structure) having a shape in conformance with the step-shaped trench structure of the EL layer 42.

Accordingly, within the light-emitting region 13, the first electrode 41 has a step-shaped trench structure in which, within a first trench portion 41TR1 formed as a main trench by the first electrode 41, a second trench portion 41TR2 is formed as a sub trench having a length-and-width size smaller than that of the first trench portion 41TR1.

Similarly, within the light-emitting region 13, the EL layer 42 has a step-shaped trench structure in which, within a first trench portion 42TR1 formed as a main trench by the EL layer 42, a second trench portion 42TR2 is formed as a sub trench having a length-and-width size smaller than that of the first trench portion 42TR1.

Moreover, within the light-emitting region 13, the second electrode 43 has a step-shaped trench structure in which, within a first trench portion 43TR1 formed as a main trench by the second electrode 43, a second trench portion 43TR2 is formed as a sub trench having a length-and-width size smaller than that of the first trench portion 43TR1.

Thus, the EL element 40 is layered on the step-shaped trench 33TR in the interlayer insulating layer 31 along the step-shaped trench 33TR. Hence, in the EL element 40, the side walls of the first trench portions 41TR1, 42TR1, 43TR1 and the second trench portions 41TR2, 42TR2, 43TR2 of each of the first electrode 41, the EL layer 42, and the second electrode 43 have respective inclined faces (inclined portion), and the angle (taper angle) of each of the inclined faces is set, for example, to 45° or near 45°.

Moreover, in the first electrode 41, the EL layer 42, and the second electrode 43 of the EL element 40, the plan view area ratio and the surface area ratio of each of the second trench portions 41TR2, 42TR2, 43TR2 with respect to each of the first trench portions 41TR1, 42TR1, 43TR1, and the length and width dimensions and depth of the second trench portions 41TR2, 42TR2, 43TR2, are preferably set such that the length-and-width sizes of the second trench portions 41TR2, 42TR2, 43TR2 do not exceed the light propagation distance limit.

As illustrated in FIGS. 1B and 1C, on the surface of the EL element 40, concave-convex portion is formed along the concave-convex portion 31a provided to each of the trench portions 34TR configuring the step-shaped trench 33TR. The shape of the interface of lower layers with which each of the first electrode 41, the EL layer 42, and the second electrode 43 contacts is reflected onto the first electrode 41, the EL layer 42, and the second electrode 43 configuring the EL element 40. Thus, the first electrode 41, the EL layer 42, and the second electrode 43 are formed so as to have a thickness of each layer greater than or equal to the concave-convex height of the concave-convex portion in the lower layers with which each of the first electrode 41, the EL layer 42, and the second electrode 43 contacts, and have a uniform thickness (note that, thickness of each layer may be different). Hence, the shape of the concave-convex portion in the lower layers with which each of the first electrode 41, the EL layer 42, and the second electrode 43 contacts is reflected as it is onto the first electrode 41, the EL layer 42, and the second electrode 43.

In the present embodiment, for example as illustrated in FIG. 1C, the first electrode 41 has a uniform thickness and the thickness of the first electrode 41 is formed greater than or equal to the thickness of concave-convex height H1, and thus, in the first electrode 41, a concave-convex portion 41a having the same shape as the concave-convex portion 31a is formed on a portion located on the concave-convex portion 31a. Further, the EL layer 42 has a uniform thickness and the thickness of the EL layer 42 is formed greater than or equal to the thickness of concave-convex height H2, and thus, in the EL layer 42, a concave-convex portion 42a having the same shape as the concave-convex portion 41a is formed on a portion located on the concave-convex portion 41a. Further, the second electrode 43 has a uniform thickness and the thickness of the second electrode 43 is formed greater than or equal to the thickness of concave-convex height H3, and thus, in the second electrode 43, a concave-convex portion 43a having the same shape as the concave-convex portion 42a is formed on a portion located on the concave-convex portion 42a.

More detailed description follows regarding the first electrode 41, the EL layer 42, and the second electrode 43.

First Electrode 41 and Second Electrode 43

The first electrode 41 serving as a lower layer electrode, and the second electrode 43 serving as an upper layer electrode, serve as a pair of electrodes, with one functioning as a positive electrode and the other functioning as a negative electrode.

The positive electrode functions as an electrode for injecting (supplying) holes into the EL layer 42. The negative electrode functions as an electrode for injecting (supplying) electrons into the EL layer 42.

One electrode out of the first electrode 41 and the second electrode 43 is an electrode (reflective electrode) including a reflective electrode layer (reflective electrode).

The present embodiment illustrates an example in which the first electrode 41 is the positive electrode (specifically, a patterned positive electrode, a pixel electrode) and the second electrode 43 is the negative electrode (specifically, a common negative electrode, a common electrode). However, the present embodiment is not limited thereto, and a negative electrode may be provided as the lower layer electrode on the semiconductor substrate 20.

Electrode materials capable of being employed as the positive electrode and the negative electrode are not particularly limited to a specific material, and, for example, known electrode materials may be employed therefor.

The positive electrode may, for example, be formed from an electrode material having a large work function (for example, approximately 4 eV or greater), such as a metal, an alloy, a conductive material, or a conductive polymer. Specific examples include aluminum, vanadium, cobalt, nickel, tungsten, palladium, silver, gold, platinum, and alloys thereof; conductive materials such as indium tin oxide (ITO), tin oxide ($SnO_2$), or indium zinc oxide (IZO); and conductive polymers such as poly(3-methylthiophene), polypyrrole, poly(p-phenylene), or polyfuran.

The negative electrode may, for example, be formed from a metal, an alloy, a conductive material, a conductive polymer, or the like having a small work function (for example, approximately 4 eV or less). Specific examples include metals such as calcium, aluminum, silver, titanium, yttrium, sodium, ruthenium, manganese, indium, magnesium, lithium, ytterbium, and LiF; alloys such as magnesium/copper, magnesium/silver, sodium/potassium, At/AtO$_2$, potassium/aluminum, lithium/calcium/aluminum, and LiF/calcium/aluminum; the conductive materials listed above; and the conductive polymers listed above.

The light emitted from the EL layer 42 is extracted from one electrode side of the EL layer 42 out of the positive electrode and negative electrode side. Thus, an electrode material with transparent properties (a transparent electrode material) is preferably employed for one electrode. An electrode material with reflecting properties (a reflective electrode material) is preferably employed for the other electrode, in order to reflect light reflected at the interfaces and guided within the EL layer 42, as stated above, and to extract the light at the front face side of the display panel 2.

Namely, although various conductive materials may be employed as the first electrode 41 and the second electrode 43, for cases in which the EL elements 40 is a top-emitting EL element, the first electrode 41 is preferably formed from a reflective electrode material such as a metal or alloy having reflecting properties, and the second electrode 43 is preferably formed from a transparent electrode material which is transparent or semi-transparent. As a transparent electrode material, for example, a transparent electrode material such as ITO, SnO$_2$, or IZO may be employed, and a semi-transparent electrode material may also be employed, such as a thin film of Ag.

The first electrode 41 and the second electrode 43 may each have a single layer structure formed from one electrode material or may each have a layered structure formed from a plurality of electrode materials.

Thus, when the EL element 40 is a top-emitting EL element as stated above, the first electrode 41 may have a layered structure configured by a reflective electrode formed from a reflective electrode material and a transparent electrode formed from a transparent electrode material.

In either case, as illustrated in FIGS. 1B and 1C, the concave-convex portion 41a having the pitch P1 and concave-convex height H2 of submicron order level is provided to the first electrode 41 in the light-emitting region 13.

Further, as illustrated in FIGS. 1B and 1C, the concave-convex portion 43a having the pitch P1 and concave-convex height H4 of submicron order level is provided to the second electrode 43 in the light-emitting region 13.

The concave-convex height H2 refers to the height from a valley to a peak of the concave-convex portion 41a, and the concave-convex height H4 refers to the height from a valley to a peak of the concave-convex portion 43a. As illustrated in FIGS. 1B and 1C, the pitch P1 may also be referred to as the width of the convex portion or width of the concave portion of the concave-convex portion 41a or the concave-convex portion 43a.

The first electrode 41 and the second electrode 43 may be formed in the desired shape by, for example: forming a thin film of the electrode materials stated above using a method such as vapor deposition or sputtering, and then using a known method such as photolithography or etching as a method in which the thin film is patterned in the desired shape; or by employing vapor deposition or sputtering using a mask.

The thickness of the positive electrode (positive electrode metal layer) and negative electrode (negative electrode metal layer) are not limited to a specific thickness, and the thickness may be set similar to that of a conventional EL element. The thickness of the positive electrode (positive electrode metal layer) is generally from approximately several nm to several hundreds of nm, and the thickness of the negative electrode (negative electrode metal layer) is also generally from approximately several nm to several hundreds of nm.

The first electrode 41 of the EL element 40 is formed on the interlayer insulating layer 31 for each of the sub pixel circuit portions 12. As stated above, the first electrode 41 is electrically connected, through the drive TFT-first electrode contact portion 24, to the drive TFT 23a, this being a portion of the TFT circuit portion 22. The first electrode 41 is connected through the drive TFT 23a to the high level power source line ELVDD, this being the line to supply a positive voltage at the high level potential ELVDD.

The second electrode 43 of the EL element 40 is formed common to all of the sub pixel circuit portions 12. The second electrode 43 is electrically connected to the low level power source line ELVSS, this being the line to supply a negative voltage at the low level potential ELVSS. The negative voltage at the low level potential ELVSS is supplied from the TFT circuit portion 22 to the second electrode 43 through a contact hole (not illustrated) provided in the interlayer insulating layer 31.

EL Layer 42

The EL layer 42 is a light-emitting unit including a light-emitting layer. In the present embodiment, an organic layer including at least a light-emitting layer is employed as the EL layer 42.

The light-emitting layer is a layer having a function to cause holes (positive holes) injected from the positive electrode (in the present embodiment, the first electrode 41) and electrons injected from the negative electrode (in the present embodiment, the second electrode 43) to recombine so as to emit light.

Various known types of light-emitting material may be employed as the material of the light-emitting layer (namely, a light-emitting substance), and the material is not limited to a specific material. A light-emitting material having a high light-emitting efficiency is preferably employed therefor, such as a low molecular weight fluorescent colorant or a metal complex.

Examples of the light-emitting material include: anthracene, naphthalene, indene, phenanthrene, pyrene, naphthacene, triphenylene, perylene, picene, fluoranthene, acephenanthrylene, pentaphene, pentacene, coronene, butadiene, coumarin, acridine, stilbene, and derivatives thereof; a tris(8-quinolinolato)aluminum complex; a bis(benzoquinolinolato) beryllium complex; a tri(dibenzoylmethyl)phenanthroline europium complex; and ditoluylvinylbiphenyl.

The layer thickness of the light-emitting layer is appropriately set according to the light-emitting material, and is not limited to a specific value. The layer thickness is generally from approximately several nm to several hundreds of nm.

The EL layer 42 according to the present embodiment may include an organic compound as the light-emitting substance, and layers other than the light-emitting layer are not limited to a specific layer. Thus, any type of layer for layers that are not the light-emitting layer is employed for the EL layer 42.

Typical examples of layers other than the light-emitting layer include layers such as a hole injecting layer, a hole transport layer, an electron transport layer, and an electron injecting layer.

A hole injecting layer is a layer including a material with hole injecting properties and having the function to increase the efficiency of hole injection from the positive electrode to the light-emitting layer. The hole transport layer is a layer including a material with hole transport properties and having the function to increase the efficiency of hole transport to the light-emitting layer. The electron injecting layer is a layer including a material with electron injecting properties and having the function to increase the efficiency of electron injection from the negative electrode to the light-emitting layer. The electron transport layer is a layer including a material having electron transport properties and having the function to increase the efficiency of electron transport to the light-emitting layer.

The hole injecting layer and the hole transport layer may be formed as mutually independent layers, or may be integrated together as a hole injection-cum-transport layer. Similarly, the electron injecting layer and the electron transport layer may be formed as mutually independent layers, or may be integrated together as an electron injection-cum-transport layer. Only one out of the hole injecting layer and the hole transport layer may be provided. Similarly, only one out of the electron injecting layer and the electron transport layer may be provided.

Moreover, other than the layers stated above, the EL layer 42 may also include a carrier block layer, an intermediate layer, or the like, and may include a plurality of layers of light-emitting layer.

The material of layers other than the light-emitting layer is also not limited to a specific material, and known conventional materials may be employed as each such layer. Any layers other than the light-emitting layer are not essential layers, and the layer thicknesses thereof is not limited to a specific value. Thus, the description thereof is omitted in the present embodiment.

Further, as illustrated in FIGS. 1B and 1C, the concave-convex portion 42a having the pitch P1 and concave-convex height H3 of submicron order level (for example, several tens to hundreds nm level) is provided on the EL layer 42 in the light-emitting region 13.

The concave-convex height H3 refers to the height from a valley (bottom surface of concave portion) to a peak (tip of convex portion) of the concave-convex portion 42a. As illustrated in FIGS. 1B and 1C, the pitch P1 may also be referred to as the width of the convex portion or width of the concave portion of the concave-convex portion 42a. Note that the concave-convex heights H2, H3, H4 are each equal to the concave-convex height H1.

Edge Cover 51

The edge cover 51 isolates the respective RGB light emitting regions 13 from each other within a single pixel (namely, the pixel circuit portion 11), and is an insulating layer functioning as a light emitting region isolation layer (element isolation layer, partition).

An opening 52 is provided in the edge cover 51 for each of the sub pixel circuit portions 12. Thus, the portion where there is no edge cover 51 present (the opening 52) is the light-emitting region 13 in the respective sub pixel circuit portion 12 (namely, in the R sub pixel circuit portion 12R, the G sub pixel circuit portion 12G, and the B sub pixel circuit portion 12B).

The edge cover 51 is accordingly formed in a shape defining each of the light-emitting regions 13 in the respective sub pixel circuit portions 12.

The edge cover 51 is layered on the first electrode 41 and surrounds the plurality of trench portions in the first electrode 41 (the first trench portion 41TR1 and the second trench portion 41TR2 in the present embodiment). The edge cover 51 covers the end portions (pattern end portions) of the first electrode 41 in each of the respective sub pixel circuit portions 12, where the trench portions (the first trench portion 41TR1 and the second trench portion 41TR2) are not formed.

The edge cover 51 functions as a barrier wall to prevent shorting between the first electrode 41 and the second electrode 43 in the EL elements 40 due to thinning of the EL layer 42 or to a concentration of electric field arising at the end portions (pattern end portions) of the first electrode 41.

Similar insulating materials to those of the interlayer insulating layer 31 may be employed for the edge cover 51. Thus, although the shape is different from that of the interlayer insulating layer 31, the edge cover 51 may also, similarly to the interlayer insulating layer 31, be formed into a desired shape by, for example, using a photolithographic method or the like to pattern a layer formed from an insulating material deposited by a CVD method, a sputtering method, a spin-coating method, or the like.

Although the layer thickness of the edge cover 51 is not limited to a specific value, generally, the edge cover 51 is formed such that the layer thickness is the order of several μm thick.

Method for Producing Display Panel 2

Next, a description follows regarding an example of a method for producing the display panel 2 stated above, with reference to FIGS. 3A to 3I and FIGS. 4A to 4H. A description follows regarding the method for producing the above display panel 2, focusing on a method for producing the sub pixel circuit portions 12 of the display panel 2.

FIGS. 3A to 3I are cross-sectional views of main portions illustrating a sequence of processes in a process for producing the display panel 2 according to the present embodiment. FIGS. 4A to 4H are cross-sectional views of main portions illustrating a sequence of processes in a process for producing the display panel 2 according to the present embodiment, performed after the process illustrated in FIG. 3I. Note that FIGS. 3A to 3I and FIGS. 4A to 4H illustrate cross-sectional structures of the sub pixel circuit portion 12.

Figure 3A:
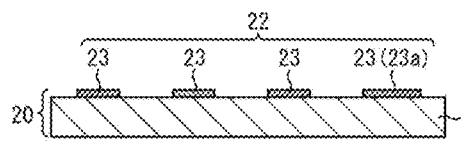
FIGS. 3A to 3I are cross-sectional views of main portions illustrating a sequence of processes in a process for producing the display panel according to the first embodiment of the present invention.

First, as illustrated in FIG. 3A, the semiconductor substrate 20 is prepared by forming, on the insulating substrate 21, a TFT circuit portion 22 including the drive TFT 23a and the various lines stated above (not illustrated), such as the scanning lines GL, the data lines SL, the high level power source lines ELVDD, the low level power source lines ELVSS, and the emission lines.

Figure 3F:
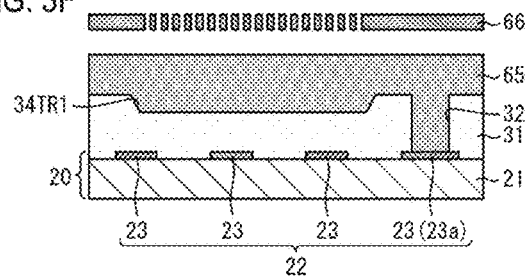
Figure 3B:
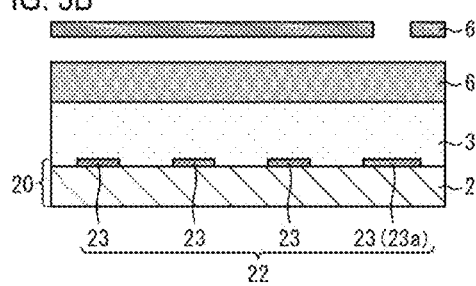

Next, as illustrated in FIG. 3B, an insulating material, such as a photosensitive resin is deposited on the above semiconductor substrate 20. As a result, the interlayer insulating layer 31 is formed across the entire display region of the semiconductor substrate 20.

Then, as illustrated in FIG. 3B, the interlayer insulating layer 31 is coated with a photosensitive resist 61, and the photosensitive resist 61 is exposed with a drive TFT contact photomask 62 for opening a contact hole 32 in the interlayer insulating layer 31 to form the drive TFT-first electrode contact portion 24, and developed.

Figure 3G:
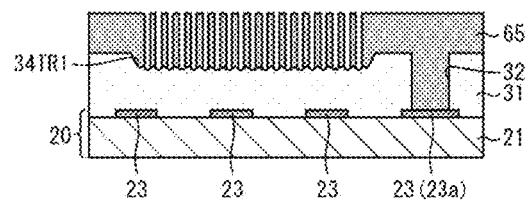
Figure 3C:
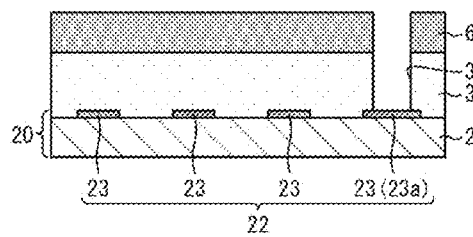

Next, as illustrated in FIG. 3C, the contact hole 32 is formed in the interlayer insulating layer 31 by etching (either dry etching or wet etching) the interlayer insulating layer 31 above the drive TFT 23a using the developed photosensitive resist 61 as a mask. As a result, the drive TFT 23a is exposed.

Figure 3H:
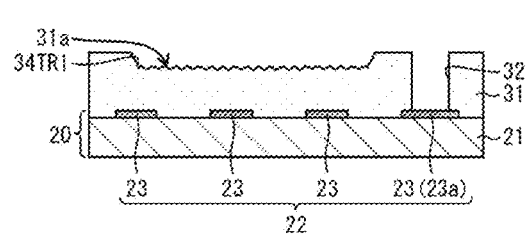
Figure 3D:
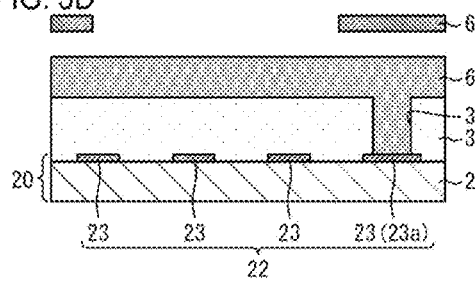

Next, as illustrated in FIG. 3D, after the photosensitive resist 61 stated above has been removed, the interlayer insulating layer 31 is coated with a photosensitive resist 63, with the photosensitive resist 63 covering the contact hole 32 and the interlayer insulating layer 31. In the present embodiment, the method for removing the photosensitive resist (the method for removing the photosensitive resist 61 in the current process) is not limited to a specific method. The photosensitive resist may normally be removed, for example, by stripping the photosensitive resist with a resist stripper and washing the substrate.

Next, as illustrated in FIG. 3D, the photosensitive resist 63 is exposed with a main trench photomask 64 for forming the first trench portion 34TR1, serving as a main trench, within a region corresponding to the light-emitting region 13, and developed.

Figure 3I:
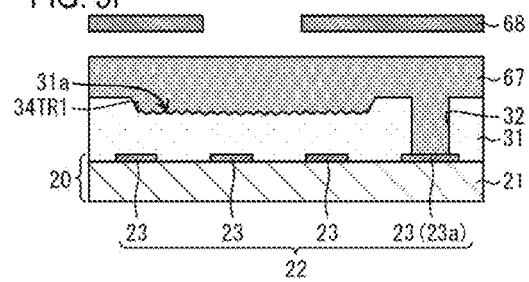
Figure 3E:
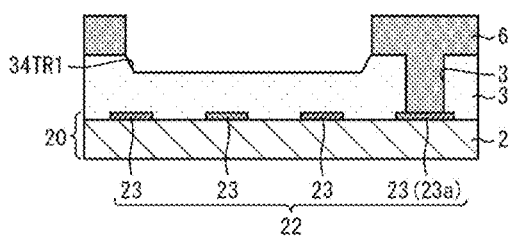

Then, as illustrated in FIG. 3E, the first trench portion 34TR1 is formed in the interlayer insulating layer 31 by half etching (dry etching or wet etching) the interlayer insulating layer 31 using the developed photosensitive resist 63 as a mask. There are no particular stipulations regarding the taper angle of the first trench portion 34TR1. However, the first trench portion 34TR1 is formed such that the taper angle is generally 45°.

Then, as illustrated in FIG. 3F, after the photosensitive resist 63 has been removed, the interlayer insulating layer 31 is coated with a photosensitive resist 65, with the photosensitive resist 65 covering the contact hole 32 and the interlayer insulating layer 31. Next, as illustrated in FIG. 3F, the photosensitive resist 65 is exposed with a concave-convex forming photomask 66 for forming the concave-convex portion 31a in the first trench portion 34TR1, and developed.

Note that for the concave-convex forming photomask 66, a mask of submicron rule used for single-crystal large scale integrated circuit (LSI), or the like may be employed, for example.

Then, as illustrated in FIG. 3G, the surface of the interlayer insulating layer 31 within the first trench portion 34TR1 is etched (by dry etching or wet etching) using the developed photosensitive resist 65 as a mask.

Thereafter, as illustrated in FIG. 3H, the photosensitive resist 65 is removed, and thereby forming, on the surface of the interlayer insulating layer 31 of the bottom wall portion (plane portion) of the first trench portion 34TR1, the concave-convex portion 31a having the pitch P1 (concave width and convex width) and concave-convex height H1 (see FIG. 1C) of several tens to hundreds nm level.

Note that as illustrated in FIG. 3G for example, in the forming process of the concave-convex portion 31a, when the interlayer insulating layer 31 is wet-etched for example, the etching proceeds from a contact surface side of the interlayer insulating layer 31 with the photosensitive resist 65, due to the wet etching properties. The line width of a mask portion in the photosensitive resist (for example, photosensitive resist 65) for forming the concave-convex portion 31a is extremely narrow as illustrated in FIG. 3G for example, and the contact surface side of the interlayer insulating layer 31 with the photosensitive resist 65 is exposed earlier to etching solution. Thus, as illustrated in FIGS. 3G, 3H and FIGS. 1B, 1C, the concave-convex portion 31a having a wave-like shape (for example, sine wave-like shape), for example, in a cross-sectional view is formed on the surface of the interlayer insulating layer 31. Note that the shape illustrated in FIGS. 3G, 3H and FIGS. 1B, 1C are only an example, and the shape of the concave-convex portion 31a is not limited thereto.

Next, as illustrated in FIG. 3I, the interlayer insulating layer 31 is coated with a photosensitive resist 67, with the photosensitive resist 67 covering the contact hole 32 and the interlayer insulating layer 31. Then, the photosensitive resist 67 is exposed with a sub trench photomask 68 for forming the second trench portion 34TR2 serving as a sub trench within the first trench portion 34TR1, and developed.

Figure 4A:
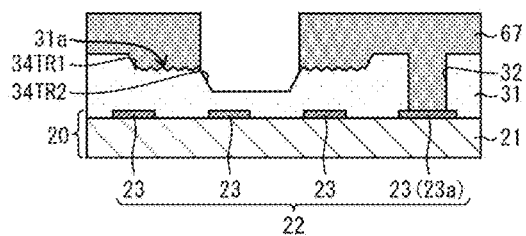
FIGS. 4A to 4H are cross-sectional views of main portions illustrating a sequence of processes in a process for producing the display panel according to the first embodiment of the present invention, performed after the process illustrated in FIG. 3I.
Figure 4F:
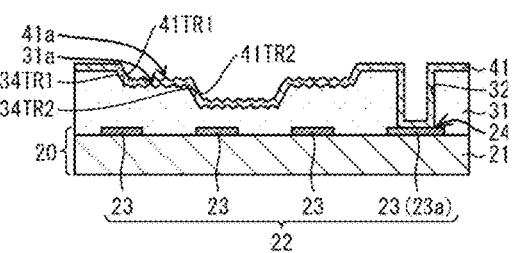
Figure 4B:
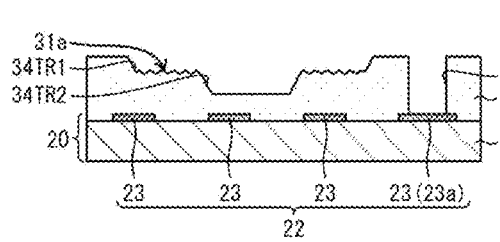

Then, as illustrated in FIG. 4A, after the interlayer insulating layer 31 within the first trench portion 34TR1 is half-etched (by dry etching or wet etching) using the developed photosensitive resist 67 as a mask, as illustrated in FIG. 4B, the photosensitive resist 67 is removed.

By doing so, the second trench portion 34TR2 is formed within the first trench portion 34TR1 in the interlayer insulating layer 31. There are no particular stipulations regarding the taper angle of the second trench portion 34TR2. However, the second trench portion 34TR2 is formed such that the taper angle is generally 45°.

As illustrated in FIGS. 4A and 4B, the second trench portion 34TR2 is formed within the first trench portion 34TR1 in the interlayer insulating layer 31. As a result, the concave-convex portion 31a is removed that is formed in the forming region of the second trench portion 34TR2 in the first trench portion 34TR1.

Figure 4G:
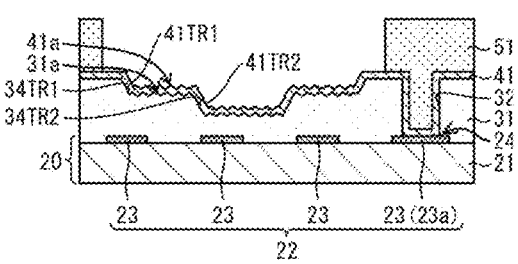
Figure 4C:
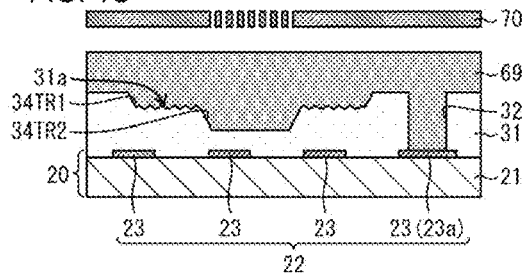

Thus, to form the concave-convex portion 31a also within the second trench portion 34TR2, in a subsequent process, as illustrated in FIG. 4C, the interlayer insulating layer 31 is coated with the photosensitive resist 69, with the photosensitive resist 69 covering the contact hole 32 and the interlayer insulating layer 31.

Then, the photosensitive resist 69 is exposed with a concave-convex forming photomask 70 for providing the second trench portion 34TR2 with the concave-convex portion 31a, and developed.

Note that for example, the mask of submicron rule used for single-crystal LSI or the like may be used also for the concave-convex forming photomask 70.

Figure 4H:
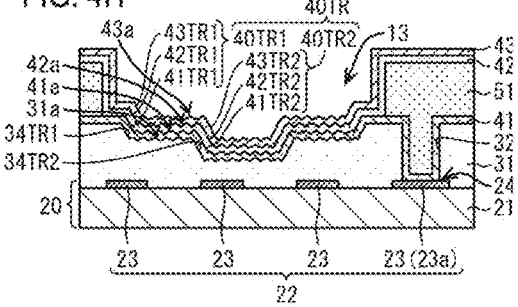
Figure 4D:
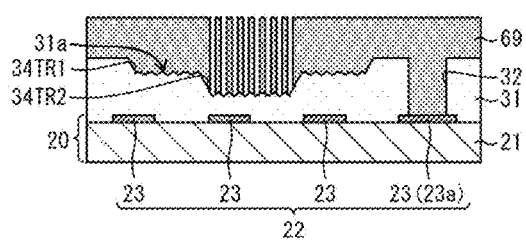

Then, as illustrated in FIG. 4D, the surface of the interlayer insulating layer 31 within the second trench portion 34TR2 is etched (by dry etching or wet etching) using the developed photosensitive resist 69 as a mask.

Figure 4E:
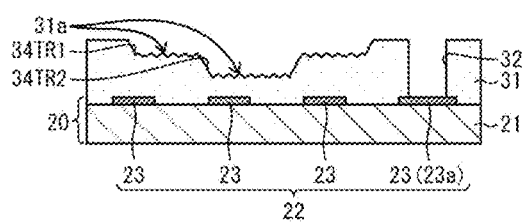

Thereafter, as illustrated in FIG. 4E, the photosensitive resist 69 is removed, and thereby forming, on the surface of the interlayer insulating layer 31 of the bottom wall portion (plane portion) of the second trench portion 34TR2, the concave-convex portion 31a having the pitch P1 (concave width and convex width) and concave-convex height H1 (see FIG. 1C) of several tens to hundreds nm level, like the concave-convex portion 31a in the first trench portion 34TR1.

Thereafter, as illustrated in FIG. 4F, an electrode material for forming the first electrode 41 (positive electrode metal layer) is deposited on the interlayer insulating layer 31 using a sputtering method, for example, with the electrode material covering the contact hole 32 and the interlayer insulating layer 31. An electrode material having reflecting properties such as, for example, an Ag/Al alloy, is employed as the electrode material.

Next, a photosensitive resist on the layer formed from the electrode material is patterned to form a resist pattern (not illustrated) by a photolithography method, and after the layer formed from the electrode material has been etched using the resist pattern as a mask, the resist pattern is removed. As a result, the first electrode 41 including the first trench portion 41TR1 and the second trench portion 41TR2 and being isolated for each sub pixel circuit portion 12 is formed, and at the same time, the drive TFT-first electrode contact portion 24 is also formed in which the drive TFT 23a and the first electrode 41 are electrically connected through the contact hole 32.

Note that the shape of the concave-convex portion 31a of the surface of the interlayer insulating layer 31 is reflected as it is onto the layer formed from the electrode material. Therefore, a concave-convex portion 41a having the same pitch P1 (convex width and concave width) and concave-convex height H2 (see FIG. 1C) as that of the concave-convex portion 31a is formed on the first electrode 41 at the first trench portion 41TR1 and the second trench portion 41TR2.

Next, as illustrated in FIG. 4G, the edge cover 51 is formed across the entire display region of the semiconductor substrate 20 in which the first electrode 41 is formed, by depositing an insulating material, with the insulating material covering the first electrode 41 and the interlayer insulating layer 31. The insulating material may be deposited using a method such as a CVD method, a sputtering method, or a spin-coating method, as stated above.

Then, a photosensitive resist on the layer formed from the insulating material (edge cover 51) is patterned to form a resist pattern (not illustrated) by a photolithography method, and after the layer formed from the insulating material has been etched using the resist pattern as a mask, the resist pattern is removed. The edge cover 51 is thereby patterned in a shape defining the light-emitting region of each of the sub pixel circuit portions 12.

Then, as illustrated in FIG. 4H, the EL layer 42 including the first trench portion 42TR1 and the second trench portion 42TR2 is formed on the first electrode 41 along the first trench portion 41TR1 and the second trench portion 41TR2. The EL layer 42 is formed by separately coating the EL layer 42 for each respective color of the sub pixel circuit portions 12. For example, RGB light-emitting layers are separately coated as the EL layer 42 for each respective color of the sub pixel circuit portions 12.

The EL layer 42 may, as required, include functional layers, such as a hole injecting layer, a hole transport layer, an electron transport layer, and an electron injecting layer. When, for example, the EL layer 42 includes a hole injecting layer, a hole transport layer, an electron transport layer, and an electron injecting layer, the EL layer 42 is formed by layering the hole injecting layer, the hole transport layer, the light-emitting layer, the electron transport layer, and the electron injecting layer in this order from the first electrode 41 side.

Separately coating of the EL layer 42 may, for example, be achieved by using technology such as mask vapor deposition technology or ink-jet technology.

Next, the second electrode 43 (negative electrode metal layer) including the first trench portion 43TR1 and the second trench portion 43TR2 along the first trench portion 42TR1 and the second trench portion 42TR2 of the EL layer 42 is formed, for example by using a sputtering method, over the entire display region of the semiconductor substrate 20 in which the EL layer 42 is formed. As a result, the EL element 40 including the step-shaped trench 40TR is formed within the light-emitting region 13 not covered by the edge cover 51, and the step-shaped trench 40TR includes the second trench portion 40TR2 configured by the second trench portions 41TR2, 42TR2, 43TR2, formed within the first trench portion 40TR1 configured by the first trench portions 41TR1, 42TR1, 43TR1.

Note that the shape of the concave-convex portion 41a of the surface of the first electrode 41 is reflected as it is onto the EL layer 42, and the shape of the concave-convex portion 42a of the surface of the EL layer 42 is reflected as it is onto the second electrode 43. Therefore, the concave-convex portion 42a having the same pitch P1 (convex width and concave width) and concave-convex height H3 (see FIG. 1C) as that of the concave-convex portions 31a, 41a is formed on the EL layer 42 at the first trench portion 42TR1 and the second trench portion 42TR2. Further, a concave-convex portion 43a having the same pitch P1 (convex width and concave width) and concave-convex height H4 (see FIG. 1C, concave-convex height H4=concave-convex height H3=concave-convex height H2=concave-convex height H1) as that of the concave-convex portions 31a, 41a, 42a is formed on the second electrode 43 at the first trench portion 43TR1 and the second trench portion 43TR2.

Then, the EL element 40 is sealed by covering the EL element 40 with a sealing substrate such as, for example, a cover glass (not illustrated), serving as a sealing member. The sealing method is not limited to a specific method, and the EL element 40 may be sealed by placing an opposing sealing substrate, such as a cover glass, over the semiconductor substrate 20 with a sealant (not illustrated) interposed therebetween. The EL element 40 may also be sealed by forming a sealing film over the EL element 40 using an inorganic film (not illustrated).

Configuration of Each of Concave-Convex Portions 31a, 41a, 42a, 43a In the present embodiment, to suppress the loss of light due to the surface plasmon, the concave-convex portions 31a, 41a, 42a, 43a of submicron order level (that is, less than 1μm, for example, several tens to hundreds nm level) are provided onto the surface of each layer at each trench portion in the light-emitting region 13, as stated above.

According to the present embodiment, as stated above, the concave-convex portion 41a having a fine concave-convex structure is formed at the interface with the EL layer 42 at the first electrode 41 into which the light radiated from the light-emitting layer in the EL layer 42 enters, thereby re-extracting the energy once absorbed by the surface plasmon generated on the surface of the first electrode 41 by converting the energy into propagation light as the light energy.

A more specific description follows.

Generally, the surface plasmon is attenuated as a result of propagation and absorption by the metal. However, the lifespan of the surface plasmon is sub-pico-second, which is relatively long.

Thus, forming the above-stated concave-convex portion 41a as the structure to extract the light from the surface plasmon (plasmonic structure) onto the metal surface at which the surface plasmon is induced, that is, the surface of the reflective electrode on the EL layer 42 side thereof configuring the first electrode 41 into which the light radiated from the light-emitting layer in the EL layer 42 enters (for example, the interface with the first electrode at the EL layer 42) enables the energy once absorbed by the surface plasmon to be re-extracted as the light.

The energy once absorbed by the surface plasmon is converted into propagation light by the concave-convex structure (concave-convex portion 31a) of the reflective electrode surface configuring the first electrode 41, and is reflected in a normal direction of the concave-convex portion 41a, at the reflective electrode (positive electrode metal layer having reflecting properties) of the trench portion side faces (in the present embodiment, the side faces of the first trench portion 41TR1 and the second trench portion 41TR2 configuring the first trench portion 40TR1 and the second trench portion 40TR2).

That is, in the present embodiment, the light once absorbed by the surface plasmon and converted into propagation light by the first electrode 41 is reflected to the upper face of the insulating substrate 21 by the first electrode 41.

Thus, in the present embodiment, this configuration can suppress the loss of light due to the surface plasmon, and greatly improve the light extraction efficiency as compared with a case in which the concave-convex portion 41a is not formed.

The concave-convex portion 41a is used as a diffraction lattice (concave-convex diffraction lattice) that diffracts (diffracts and outputs) the surface plasmon.

A concave-convex portion (concave-convex structure, concave-convex diffraction lattice) that diffracts and outputs the surface plasmon is formed on the reflective electrode surface in this way and diffracts the surface plasmon. This allows the energy absorbed by the surface plasmon to be extracted into a free space, as the light.

For example, when a wavevector of the surface plasmon is $k_{SP}$ and a wavevector of the metal surface structure (spatial frequency vector×2π) is K, the in-plane wavenumber of the diffraction light $k_\parallel$ (that is, the in-plane wavevector of the light wave acquired by diffraction of the concave-convex structure of the metal surface) is given by $k_\parallel = k_{SP} + mK$ (wherein, m is an integer providing a diffraction order).

When the absolute value $|k_\parallel|$ of the in-plane wavenumber of the diffraction light $k_\parallel$ is less than the wavenumber k of the light propagating the EL layer 42 being in contact with the reflective electrode (k=nω/c, wherein, n is the refractive index of the EL layer 42 being in contact with the metal, ω is an angular frequency of the light, and c is the velocity of light in vacuum), the diffraction light is radiated to the EL layer 42 side as propagation light.

Note that the above-stated concave-convex portion 41a may be one-dimensional lattice (one-dimensional diffraction lattice) provided only in the one-dimensional direction on the plan view; however, more preferably is two-dimensional lattice (two-dimensional diffraction lattice) provided in the two-dimensional direction on the plan view.

As also stated in NPL 1, in the case of a single color element, the energy of the exciton is dissipated into the surface plasmon having a single frequency.

Thus, in the case of a single color element, a concave-convex lattice having a single frequency is suitable for extracting the light. However, of the surface plasmon propagating in all directions of the inner face, only half the surface plasmon is diffracted as the propagation light by the one-dimensional lattice. Thus, to convert all the surface plasmon into propagation light, it is desirable to provide a two-dimensional concave-convex lattice having two-dimensional periodic structure on the reflective electrode surface.

Note that when a two-dimensional periodic structure is formed on the metal surface, and two fundamental reciprocal lattice vectors of the two-dimensional periodic structure are $K_1$ and $K_2$, the in-plane wavenumber of diffraction light $k_\parallel$ is given by $k_\parallel = k_{SP} + mK_1 + nK_2$ (wherein, m and n are integers providing the diffraction order). In this case, when the absolute value $|k_\parallel|$ of the in-plane wavenumber of diffraction light $k_\parallel$ is less than the wavenumber k of the light propagating the EL layer 42 being in contact with the reflective electrode, the diffraction light is radiated to the EL layer 42 side as propagation light.

Note that in FIGS. 1B, 1C and FIG. 3G through FIG. 4H, an example is given of a case in which each of the concave-convex portions 31a, 41a, 42a, 43a are formed with a constant pitch P1 (convex width and concave width) and concave-convex height. However, the present embodiment is not limited thereto.

Figure 5:
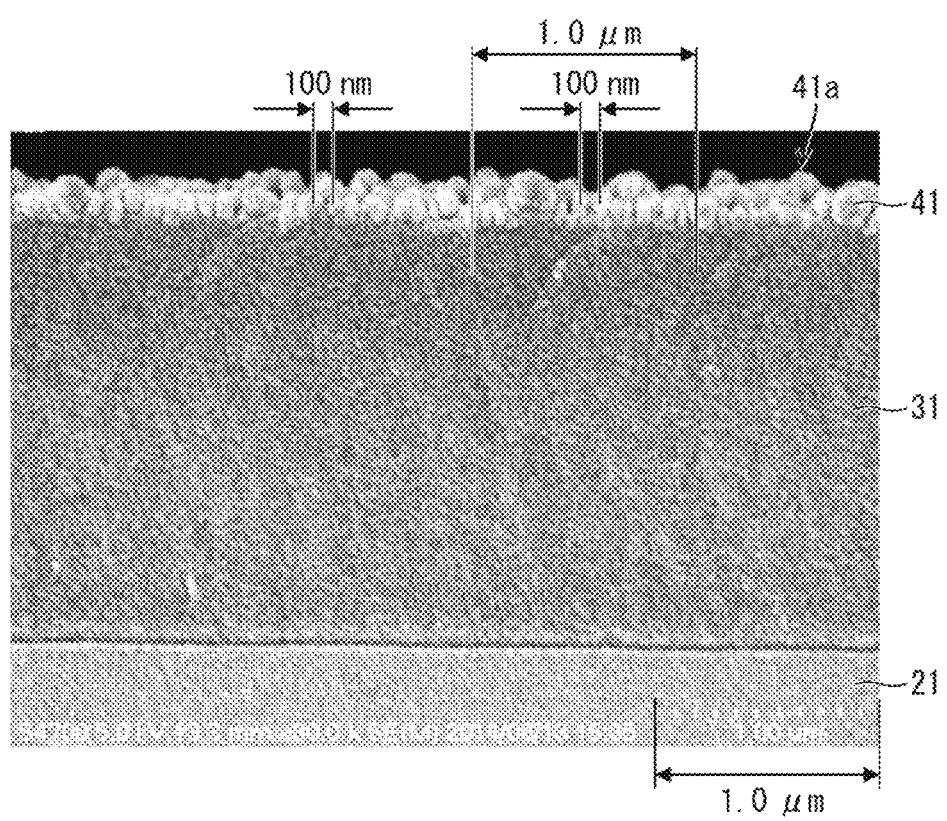
FIG. 5 is a diagram illustrating a scanning electron microscope (SEM) image illustrating an example of a concave-convex structure of a positive electrode surface of the display panel illustrated in FIG. 1C.

FIG. 5 is a diagram illustrating a scanning electron microscope(SEM) image illustrating an example of the concave-convex structure of the surface of the first electrode 41 in the display panel 2 illustrated in FIG. 1C.

FIG. 5 illustrates a case in which the concave-convex portion 41a having random convex width and concave width is provided on the surface of the first electrode 41.

Note that even in this case, the EL layer 42 and the second electrode 43 are formed so as to have a thickness of each layer greater than or equal to the concave-convex height of the concave-convex portion in the lower layers with which each of the EL layer 42 and the second electrode 43 contacts, and have a uniform thickness (not that, thickness of each layer may be different). This allows a concave-convex portion to be formed on the EL layer 42 and the second electrode 43. The concave-convex portion has a shape in conformance with the shape of the concave-convex portion in the lower layers with which each of the EL layer 42 and the second electrode 43 contacts.

That is, each of the concave portions and convex portions in each of the concave-convex portions 31a, 41a, 42a, 43a may have a certain fixed width of several tens to hundreds nm level, as stated above for example, or may have random width of several tens to hundreds nm level.

The convex width, concave width, pitch, concave-convex height in each of the concave-convex portions 31a, 41a, 42a, 43a are preferably configured uniformly or periodically, when the wavelength dependency or emission angle dependency, for example, is required.

A vibration wave (propagation-type surface plasmon) propagating the metal surface by the vibration of the free electron of the metal surface being combined with the light may be propagated freely on the metal surface by changing the structure of the metal (for example, convex width, concave width, pitch, concave-convex height).

Further, a diffraction lattice that is provided on the metal surface and is smaller than the wavelength of light causes localized surface plasmon resonance by interacting with the light, and induces the coloration due to the light-emitting transition of the plasmon and the localized enhancement of the electric field on the metal surface.

Accordingly, a diffraction lattice having a periodic structure smaller than the wavelength (in other words, the wavelength of incident light from the EL layer 42) of the emitted light (that is, the emitted light of EL element 40 and sub pixel circuit portion 12 that is a light-emitting element including the EL element 40) is provided on the surface of the reflective electrode on the EL layer 42 side thereof, thereby enhancing the light generated in the light-emitting layer by the surface plasmon resonance and improving luminous efficiency. This also enables the excitation life to be shortened, thereby improving the durability.

Thus, for example, the concave-convex portion 41a (specifically, the convex width, concave width, pitch, and concave-convex height of the concave-convex portion 41a) is preferably provided with a periodic structure smaller than the wavelength of the emitted light.

As an example, the luminescence enhancement effect of G color may be obtained by the convex width being set to about 100 nm, the concave width being set to about 100 nm, and the concave-convex height being set to about 40 to 60 nm in the concave-convex portion 41a.

Further, the luminescence enhancement effect of R color may be obtained by the convex width being set to about 400 nm, the concave width being set to about 10 to 400 nm, and the concave-convex height being set to about 40 to 60 nm in the concave-convex portion 41a.

On the other hand, the convex width, concave width, pitch, and concave-convex height in each of the concave-convex portions 31a, 41a, 42a, 43a are preferably configured randomly, when the light extraction efficiency in a broad wavelength and in all emission angles are improved uniformly.

Randomly forming each of the concave-convex portions 31a, 41a, 42a, 43a may suppress the light absorption in RGB as a whole, for example.

Further, in FIG. 1C, an example is given of a case in which each of the concave-convex portions 31a, 41a, 42a, 43a are formed to have the sine wave-like shape in the cross-sectional view; however, the present embodiment is not limited thereto. Each of the concave-convex portions 31a, 41a, 42a, 43a may be a lattice having a wave-like shape such as the sine wave-like shape (curved shape), and may be a square lattice, a triangular (hexagonal) lattice, or a lattice having a rectangular wave shape.

Further, in the present embodiment, an example is given of a case in which each of the concave-convex portions 41a, 42a, 43a has a shape in conformance with the shape of the respective concave-convex portions directly thereunder, and each of the concave-convex portions 31a, 41a, 42a, 43a has the same shape (same concave width, convex width, pitch, and concave-convex height).

However, the present embodiment is not limited thereto, and each of the concave-convex portions 31a, 41a, 42a, 43a may have different concave width, convex width, pitch, and concave-convex height to each other.

For example, the concave width, convex width, pitch and concave-convex height of each of the concave-convex portions 31a, 41a, 42a, 43a may be formed to become smaller toward upper layers. Further, when the EL layer 42 includes a plurality of layers, the concave width, convex width, pitch, and concave-convex height of each of the layers configuring the EL layer 42 may be formed to become smaller toward upper layers.

Forming the first electrode 41, the EL layer 42, and the second electrode 43 with a uniform film thickness on the concave-convex portion 31a allows the concave-convex portion to be formed in a similar shape or in the same shape with respect to the concave-convex portion directly under the first electrode 41, the EL layer 42, and the second electrode 43.

Light-Emitting/Improved Light Extraction Action of Display Panel 2

A description follows regarding the light-emitting action and the improved light extraction action of the sub pixel circuit portions 12 in the display panel 2 according to the present embodiment.

The light-emitting action of the display panel 2 is as follows.

First, when any one of the scanning lines GL illustrated in FIG. 2A is selected, a gradation voltage is supplied from the source driver 4 to the TFT circuit portion 22. A drive current (light emission current) corresponding to the gradation voltage is thereby supplied through the drive TFT-first electrode contact portion 24 and the first electrode 41 to the EL element 40, and flows to the second electrode 43. As a result, a light emission phenomenon occurs within the light-emitting layer of the EL layer 42 of the EL element 40.

A more specific description follows.

For example, a gate terminal of the drive TFT 23a is connected to a drain terminal of the TFT 23 serving as the control transistor out of the TFTs 23. A drain terminal of the drive TFT 23a is connected to the high level power source line ELVDD. A source terminal of the drive TFT 23a is connected to the first electrode 41, this being the positive electrode (positive electrode terminal) of the EL element 40.

The source terminal of the TFT 23 serving as the control transistor is connected to the data line SL, and the gate terminal of the TFT 23 serving as the control transistor is connected to the scanning line GL.

A voltage holding capacitor is, for example, provided between the drain terminal of the TFT 23 serving as the control transistor and the gate terminal of the drive TFT 23a.

Thus, when writing data, the TFT 23 serving as the control transistor is ON when the scanning line GL is H (high), namely, when the scanning line GL becomes active, and a data voltage signal from the data line SL is written into the voltage holding capacitor. The TFT 23 serving as the control transistor is OFF when the scanning line GL is L (low). The capacitor and the data line SL are thereby isolated, and the capacitor holds the data voltage (gradation voltage) signal written during data writing.

The current of the drive TFT 23a is determined by the magnitude of the voltage between the two ends of the capacitor.

Thus, the current corresponding to the gradation voltage (the light emission current) flows from the drain terminal of the drive TFT 23a connected to the high level power source line ELVDD, to the source terminal of the drive TFT 23a. The current is then supplied from the source terminal of the drive TFT 23a, through the first electrode 41 of the EL element 40, to the EL layer 42, and flows to the second electrode 43, this being the negative electrode (cathode terminal) connected to the low level power source line ELVSS. The EL element 40 thereby emits light at a desired luminance according to the current flowing into the second electrode 43.

At this time, a portion of light from the light generated in the light-emitting layer of the EL element 40 is reflected by interfaces between the EL layer 42 and the first electrode 41 or the second electrode 43, and the like, and propagates (is guided) within the EL element 40.

In the present embodiment, attenuated light, which has been attenuated by the light propagation distance limit due to such reflection at the interfaces and guiding within the EL element 40, is reflected by the trench edges of the reflective first electrode 41 toward the second electrode 43 side, this being the front face side (display face side) of the display panel 2. The light reflected by the trench edges of the first electrode 41 can thereby be extracted outside from the trench edges of the second electrode 43.

FIG. 1B illustrates a situation in which the attenuated light is reflected by the trench edges of the first electrode 41, i.e. by each side wall 41TR1a, 41TR1b of the first trench portion 41TR1 and each side wall 41TR2a, 41TR2b of the second trench portion 41TR2, and then is extracted outside from the trench edges of the second electrode 43, i.e. from each side wall 43TR1a, 43TR1b of the first trench portion 43TR1 and each side wall 43TR2a, 43TR2b of the second trench portion 43TR2.

Note that in FIG. 1B, the attenuated light is illustrated as being reflected by each of the side walls (trench edges) of the respective trench portions 41TR1, 41TR2 in the length direction (Y direction) of the sub pixel circuit portion 12. However, the attenuated light is also reflected in a similar manner by each of the side walls (trench edges) of the respective trench portions 41TR1, 41TR2 in the width direction (X direction) of the sub pixel circuit portion 12.

Namely, in the present embodiment, reflective walls are present in the trench portions 41TR1, 41TR2 of the first electrode 41 at a total of four locations in the Y direction and at a total of four locations in the X direction. The attenuated light can be reflected and extracted outside by each of the reflective walls.

Further, in the present embodiment, as illustrated in FIG. 1C, due to the plasmon effect (free electron vibration of the positive electrode metal layer) by the surface plasmon generated at the interface between the light-emitting layer in the EL layer 42 and the reflective electrode (positive electrode metal layer) in the first electrode 41, the light (light energy) having the same wavelength as that of the resonant frequency of the surface plasmon, out of the light made incident into the reflective electrode, is absorbed into the surface of the reflective electrode.

However, the lifespan of the surface plasmon is relatively long, and the concave-convex portion 41a is provided on the surface of the first electrode 41, and thus, the absorbed light energy is extracted as the light again in the normal direction of the concave-convex portion 41a, due to the light-emitting transition of the plasmon.

At this time, new light emission is added because the light radiated from the EL layer 42 induces the plasmon toward the reflective electrode surface and is re-radiated after absorbing the energy, and thus, the luminescent is enhanced.

Advantageous Effects

Light Energy Absorption-Reducing Effect by Plasmon at Interface Between Positive Electrode and EL Layer 42

As stated above, at the interface between the positive electrode metal layer and the EL layer 42, when the light energy radiated from the light-emitting layer has the same resonant frequency as that of the surface plasmon due to the vibration (plasmon) of the free electron of the positive electrode metal atom, the light energy radiated from the light-emitting layer is absorbed by the plasmon and converted into heat energy, and thus, the light extraction efficiency significantly decreases.

According to NPL 1, actually about half of the light energy radiated from the light-emitting layer is absorbed by the plasmon.

The plasmon absorption notably occurs in a case where the surfaces of a positive electrode and a negative electrode made of metal is flat, the positive electrode and the negative electrode serving as reflective electrodes.

Thus, in the present embodiment, the surface of the positive electrode metal layer is made uneven, thereby re-extracting the energy once absorbed by the surface plasmon, as the light energy, by using the concave-convex structure of the positive electrode metal layer surface.

As stated above, in the present embodiment, this configuration can at least prevent the light energy from being dissipated by the plasmon at the flat portion of the positive electrode metal layer, and re-extract the light (propagation light) from the plasmon in which the light energy is absorbed at the interface between the light-emitting layer and the positive electrode metal layer. Thus, this can suppress the attenuation of the guided light within the light-emitting layer and significantly improve the light extraction efficiency.

Further, in PTL 1, the guided light within the light-emitting layer in the organic EL layer 528 of the organic EL display device 500 is attenuated due to the plasmon absorption and only the attenuated guided light is possible to be reflected to the upper face (panel upper face) side of the organic EL display device 500.

In the organic EL display device 500 of PTL 1, the surface of the first electrode 525 disposed under the organic EL layer 528 including the light-emitting layer is flat, and thus, about 50% of the energy from the exciton generated in the light-emitting layer is dissipated into the surface plasmon and lost as heat.

On the contrast, in the present embodiment, the light is re-extracted from the plasmon in which the light energy is absorbed at the interface between the light-emitting layer and the positive electrode metal layer, and is reflected toward the substrate upper face in the positive electrode metal layer that has reflecting properties and is at the trench side faces. According to the present embodiment, this allows the light once absorbed by the plasmon to be extracted to the upper face side of the substrate.

According to the present embodiment, this allows about 50% of the energy from the exciton generated in the light-emitting layer, which is lost as heat in the conventional elements, to be re-extracted to the upper face side of the substrate. Therefore, this can increase the amount of light extracted of the guided light within the light-emitting layer, as compared to PTL 1.

Advantage of Increasing Light Extraction Efficiency Due to Not Having Insulating Layer within Reflective Trench As stated above, PTL 1 states a configuration in which an insulating film is provided within the trenches 530. Accordingly, superfluous reflection occurs in which a portion of the light generated in the organic EL layer 528 may be reflected by an interface between the first electrode 525 and the insulating layer (partition 527) forming the reflection structure 526 or the like, and propagates within the insulating layer without being extracted outside.

In contrast thereto, the sub pixel circuit portion 12 according to the present embodiment includes, within the light-emitting region 13, the step-shaped trench 40TR in which the first electrode 41, the EL layer 42, and the second electrode 43 are layered in this order and in contact with each other. The step-shaped trench 40TR does not include a partition (insulating layer) on the reflection structure as in the case of the trenches 530 in the sub pixel 510R of PTL 1.

Thus, the sub pixels according to the present embodiment include only a single light-emitting region 13 and do not have a configuration, such as in PTL 1, in which a plurality of light-emitting regions are provided within a sub pixel and are isolated from each other by non-light-emitting regions (for example, the configuration in which the plurality of light-emitting regions 510Ra are provided within the sub pixel 510R). Namely, the sub pixel circuit portion 12 according to the present embodiment includes only a single light-emitting region 13 and does not have a configuration in which the light-emitting region is partitioned into a plurality of light-emitting regions by non-light-emitting regions as in PTL 1.

Therefore, the sub pixel circuit portion 12 according to the present embodiment reflects light from the light-emitting region 13 using the reflective electrode without interposing an insulating layer, and so superfluous reflection such as that of PTL 1 does not occur. Thus, light generated in the EL layer 42 (light-emitting layer) can be extracted outside with good efficiency.

Advantage of Increasing Light Extraction Efficiency Due to Forming Trench in Step Shape The organic EL display device stated in PTL 1 has a configuration in which, within a single sub pixel (for example, the sub pixel 510R), a plurality of light-emitting regions (for example, the light-emitting regions 510Ra) defined by the trenches 530 are provided in a straight line along the Y direction.

Therefore, the organic EL display device stated in PTL 1 includes a plurality of the trenches 530 arranged in the Y direction and twice as many reflection structures 526 as the number of the trenches 530 arranged in the Y direction. However, the organic EL display device stated in PTL 1 includes only two reflection structures 526 (more specifically, rows of the reflection structures 526 intermittently provided along the Y direction) provided in the X direction.

In contrast thereto, in the present embodiment, the sub pixel circuit portion 12 has a trench-in-trench structure (step-shaped trench 40TR), and thus, in both the X direction and the Y direction, twice as many reflective walls as the number of trenches (with the reflective walls moreover being continuous along the Y direction) are provided. Thus, from the perspective of the X direction, the present embodiment has the advantage of, for example, obtaining the light extraction efficiency of about twice that of PTL 1.

Advantage of Increased Lifespan of Light-Emitting Layer

Figure 16A:
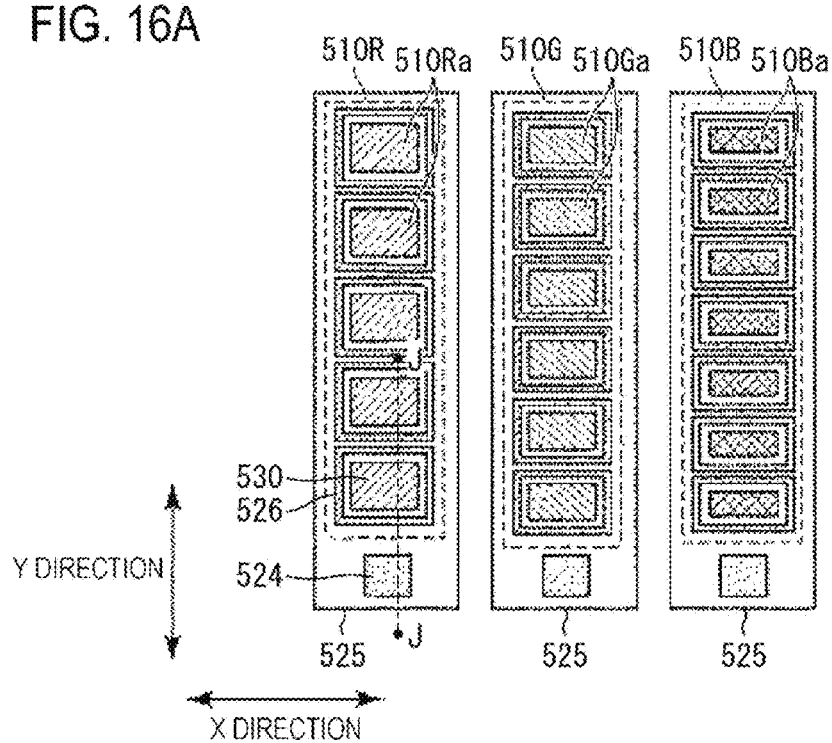
FIG. 16A is a plan view illustrating a schematic configuration of a sub pixel group of an organic EL display device stated in PTL 1.
Figure 16B:
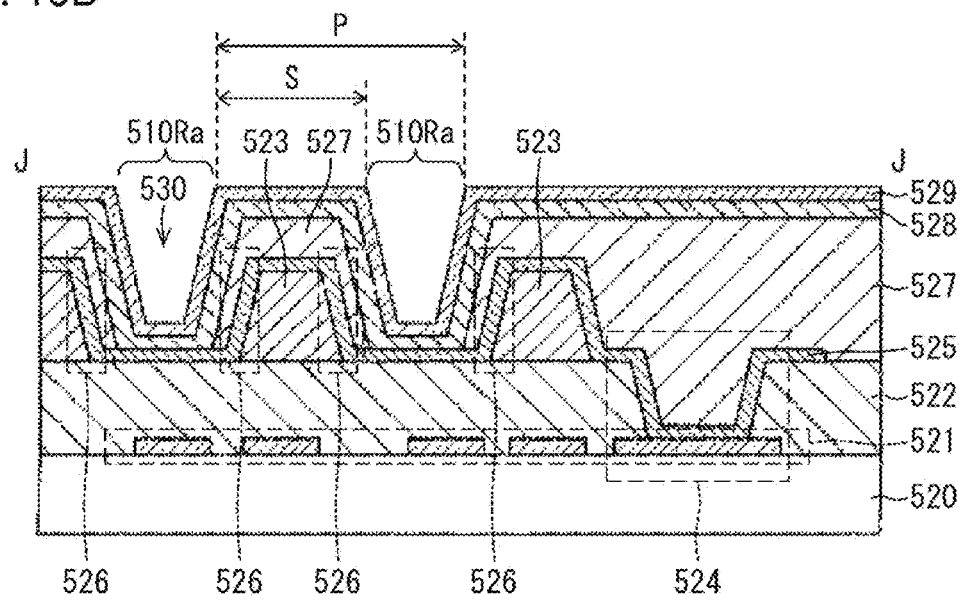
FIG. 16B is a cross-sectional view taken along line J-J of the sub pixel illustrated in FIG. 16A.

As stated above, as illustrated in FIG. 16B, since the partitions 527 are disposed on the first electrode 525, the organic EL layer 528 above the reflection structures 526 does not emit light (current does not flow) in PTL 1.

Thus, in PTL 1, the light-emitting layer of the organic EL layer 528 on the side faces of the trenches 530 does not emit light. Accordingly, when the sub pixel 510R is exemplified, within a single sub pixel in PTL 1, the plurality of light-emitting regions 510Ra, 510Ga, 510Ba are provided isolated from each other by the non-light-emitting regions.

Meanwhile, in the present embodiment, as illustrated in FIG. 1B, the side faces of each of the trench portions 43TR1, 43TR2 of the second electrode 43 (namely, the side walls 43TR1a, 43TR1b, 43TR2a, 43TR2b) are also employed as light-emitting regions.

Namely, the organic EL display device 500 in PTL 1 has a structure equivalent to a structure in which the plurality of light-emitting regions 510Ra, 510Ga, 510Ba are provided within the respective light-emitting regions 13 of the present embodiment, and non-light-emitting regions are provided between each of the light-emitting regions 510Ra, 510Ga, 510Ba.

Accordingly, the present embodiment enables the light-emitting regions (light-emitting surface area) to be made larger than those of PTL 1 and enables the current density required to emit light to be lower than that of PTL 1.

Generally, the lifespan of a light-emitting element is said to deteriorate in inverse proportion to from 1 to 2 powers of the current density ratio. Thus, the present embodiment enables the lifespan of the sub pixel circuit portion 12, and moreover the lifespan of the display panel 2 and the display device 1 including the sub pixel circuit portions 12, to be extended.

Advantage Regarding Higher Definition in Display Panels

Moreover, in PTL 1, the surface area of light-emitting regions within each of the sub pixels 510R, 510G, and 510B is defined by the size of the openings between the respective partitions 527 in plan view, in other words, by the surface area in plan view of the trenches 530 within each of the sub pixels 510R, 510G, and 510B.

Thus, the higher the definition of the display panel in the organic EL display device, the smaller the effective surface area of a single sub pixel and the more difficult it is to form a plurality of trenches in a single sub pixel. As a result, the advantageous effects stated above cannot be obtained to a sufficient degree.

For example, the sub pixel size of a 5.0-inch full high definition (FHD) display panel having a scale factor of about 440 pixels per inch (ppi) has a length-to-width ratio (Y/X ratio) as illustrated in FIG. 16A of about 58 µm×19 µm. The effective region for disposing the trench shape depends on the process rules and is smaller than this size. Accordingly, it is difficult to form the plurality of trenches 530 of PTL 1 within a sub pixel in such a display panel. In such cases, the size of a single trench is 10 µm square, as estimated from the drawings of PTL 1. Thus, it is difficult to dispose the plurality of the trenches 530 in the length (Y) direction as in PTL 1, and extremely high patterning accuracy is required.

However, in the present embodiment, a plurality of trenches are not formed in an island pattern partitioned in the horizontal direction by non-light-emitting regions as in PTL 1, but instead, a trench-in-trench structure (step-shaped trench structure) is formed within the light-emitting region 13, as stated above, by indenting the interlayer insulating layer 31 in a step shape.

Namely, in the present embodiment, it is sufficient to, within a first formed trench, namely, within a trench (upper-step-side trench, front-step-side trench) located in a shallow position from the surface of the sub pixel circuit portion 12 (in other words, at positions further from the surface of the semiconductor substrate 20), form a trench smaller in plan view than the above upper-step-side trench indented toward the semiconductor substrate 20 side (lower-step-side trench, rear-step-side trench).

Accordingly, as an extreme example, in the present embodiment, the lower-step-side trench may be disposed at any given position within the upper-step-side trench. For example, looking at the configuration illustrated in FIG. 1B, the second trench portion 40TR2 may be disposed at any given location within the first trench portion 40TR1.

Thus, the present embodiment does not require the high accuracy alignment technology (in particular, high accuracy alignment technology in the Y direction) such as that of PTL 1.

In the present embodiment, inter-trench spaces d11, d12 are sufficient to be produced with mask alignment in a range capable of forming the side walls (trench edges) serving as banks for reflecting the attenuated light (guided light within the organic layer). Accordingly, a high accuracy grade mask is not required, enabling production cost to be lowered.

Advantage of Light Extraction Efficiency for Ultra-High Definition Panels

Generally, when display panels become higher in definition, the size of a single pixel becomes smaller as the definition becomes higher. For example, in a display panel of ultra-high definition at a level of 600 ppi, the size of a single sub pixel is 42 µm×14 µm.

For such ultra-high definition display panels, it is difficult to secure the inter-trench space S if trenches 530 having the same size are arranged at a predetermined trench pitch P as in PTL 1.

As a result, the plurality of trenches 530 merge together to form a single trench. As a result, the desired number of trenches 530 cannot be formed.

In contrast thereto, in the present technology where the alignment accuracy of high accuracy photolithography is not required as stated above, a trench-in-trench (for example, the step-shaped trench 40TR in which the second trench portion 40TR2 is formed within the first trench portion 40TR1) can be formed within the light-emitting region 13 in a sub pixel area for an ultra-high definition pixel.

The present embodiment accordingly enables a plurality of reflective walls to be provided in the Y direction and the X direction even in cases in which the display panel 2 is high definition as stated above.

A description follows regarding a modification of the present embodiment.

First Modification

Schematic Configuration of Display Panel 2

Figure 6A:
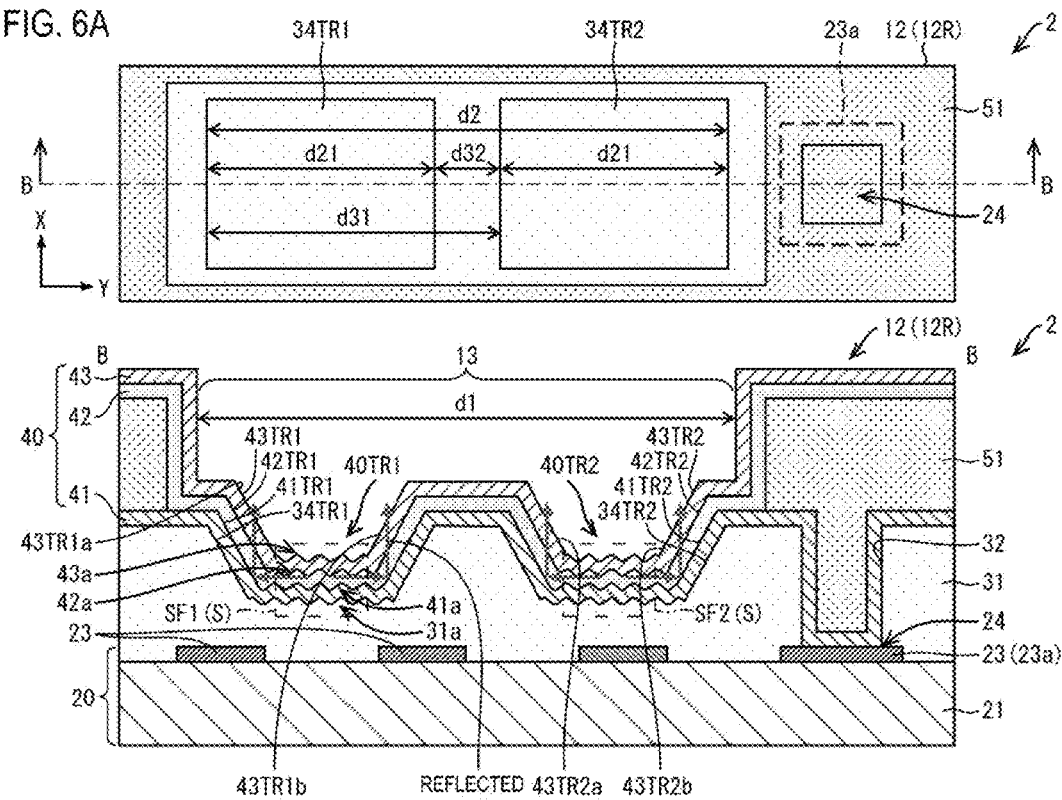
FIG. 6A is a diagram illustrating, arranged above and below, a plan view illustrating a schematic configuration of a sub pixel circuit portion according to a first modification of the first embodiment of the present invention, and a cross-section arrow view taken along line B-B of the sub pixel circuit portion illustrated in the plan view.

FIG. 6A is a diagram illustrating, arranged above and below, a plan view (transparent view) illustrating a schematic configuration of the sub pixel circuit portion 12 according to the present modification, and a cross-section arrow view taken along line B-B of the sub pixel circuit portion illustrated in the plan view. In FIG. 6A, the plan view is illustrated at the top of the diagram, and the cross-sectional view is illustrated at the bottom of the diagram. For ease of illustration, the plan view (transparent view) in FIG. 6A also illustrates, as trenches, only the first trench portion 34TR1 and the second trench portion 34TR2 in the interlayer insulating layer 31.

As stated above, in the present embodiment, a description has mainly been given of an example of a case, as illustrated in FIG. 1B, in which a plurality of trenches having reflecting properties are provided in the vertical direction (namely, a direction perpendicular to the substrate surface) within the light-emitting region 13.

However, the present embodiment is not limited thereto. The EL element 40 may include at least one trench within the light-emitting region 13. The at least one trench has an indented shape and includes the first electrode 41, the EL layer 42, and the second electrode 43, these being layered in this order and in contact with each other.

A description follows regarding the present modification, for an example of a case in which the first trench portion 40TR1 and the second trench portion 40TR2 are disposed within the light-emitting region 13 and side-by-side in the horizontal direction.

As an example of the present modification, as illustrated in FIG. 6A, an example is given of a case in which the first trench portion 34TR1 and the second trench portion 34TR2 having the same size as each other are formed in the interlayer insulating layer 31 side-by-side in the horizontal direction with a trench pitch of d31 and an inter-trench space of d32.

The display panel 2 according to the present modification has the same configuration as that of the display panel 2 illustrated in FIGS. 1A to 1C, and FIG. 2, except in that, within the light-emitting region 13 of each of the sub pixel circuit portions 12, the first trench portion 40TR1 and the second trench portion 40TR2 formed by the first trench portion 34TR1 and the second trench portion 34TR2 are provided side-by-side in the horizontal direction. Thus, both of the configurations of cross sections S (cross sections SF1, SF2) illustrated in FIG. 6A are the same as the configuration of cross section S illustrated in FIG. 1C.

Method for Producing Display Panel 2

The display panel 2 according to the present modification can be produced by a similar method to that of FIGS. 3A to 3I and FIGS. 4A to 4H, except in that the first trench portion 40TR1 and the second trench portion 40TR2 are formed in the horizontal direction.

Namely, in the present modification, in the processes of FIGS. 3D and 3E, the photosensitive resist 63 is exposed with a photomask in which openings having the same size as each other are provided side-by-side in the horizontal direction, instead of the photomask 64, and developed. The first trench portion 34TR1 and the second trench portion 34TR2 are then formed in the horizontal direction in the interlayer insulating layer 31 by etching the interlayer insulating layer 31 using the developed photosensitive resist 63 as a mask.

Then, in the process illustrated in FIG. 3F, the photosensitive resist 65 is exposed with a concave-convex forming photomask for forming the concave-convex portion 31a at the first trench portion 34TR1 and the second trench portion 34TR2, instead of the photomask 66, and developed.

Next, similarly to the process illustrated in FIG. 3G, each of the surface of the interlayer insulating layer 31 within the first trench portion 34TR1 and the second trench portion 34TR2 is etched (by dry etching or wet etching) using the developed photosensitive resist 65 as a mask.

Thereafter, similarly to the process illustrated in FIG. 3H, the photosensitive resist 65 is removed, thereby, as illustrated in FIG. 6A, forming the concave-convex portion 31a (for example, the concave-convex portion 31a having the pitch P1 (concave width and convex width) and concave-convex height H1 of several tens to hundreds nm level), on the surface of the interlayer insulating layer 31 at the bottom wall portion (plane portion) of the first trench portion 34TR1 and second trench portion 34TR2.

Then, similarly to the processes illustrated in FIGS. 4F to 4H, after the first electrode 41, the edge cover 51, the EL layer 42, and the second electrode 43 are formed on the interlayer insulating layer 31, the resultant EL element 40 is sealed by covering the obtained EL element 40 with a sealing member. The display panel 2 according to the present modification can thereby be produced.

Light Energy Absorption-Reducing Effect by Plasmon at Interface Between Positive Electrode and EL Layer 42

As stated above, in the present modification too, on the surface of the first electrode 41 in the light-emitting region 13, that is, at the interface between the positive electrode (positive electrode metal layer) and the EL layer 42, the concave-convex portion 41a having the pitch P1 (convex width and concave width) and concave-convex height H2 of submicron order level is provided as a diffraction lattice for diffracting the surface plasmon, as illustrated in FIG. 6A. Thus, in the present modification too, similar advantageous effects to those of the display panel 2 illustrated in FIGS. 1A to 1C can be obtained.

Advantage of Increasing Light Extraction Efficiency due to Not Having Insulating Layer within Reflective Trench As stated above, in the present modification too, the first trench portion 40TR1 and the second trench portion 40TR2 each include the first electrode 41, the EL layer 42 and the second electrode 43, these being layered in this order and in contact with each other, and do not include a partition (insulating layer) on a reflection structure as in the case of the trenches 530 in the sub pixel 510R of PTL 1.

Thus, the sub pixel circuit portion 12 according to the present modification also includes only a single light-emitting region 13 and do not have a configuration, as in PTL 1, in which the light-emitting region is partitioned into a plurality of light-emitting regions by non-light-emitting regions. Thus, in the present modification too, similar advantageous effects to those of the display panel 2 illustrated in FIGS. 1A to 1C can be obtained.

In the present modification too, similarly to the sub pixel circuit portion 12 illustrated in FIG. 1B, an example is given of a case in which two trench portions within the light-emitting region 13 are provided. The number of trenches within the light-emitting region 13 is not especially limited thereto, and the similar number of trenches to that in PTL 1 may be provided.

Advantage of Increased Lifespan of Light-Emitting Layer

As stated above, in the present modification too, the sub pixel circuit portion 12 does not have a configuration, as in PTL 1, in which the light-emitting region is partitioned into a plurality of light-emitting regions by non-light-emitting regions.

Moreover, in the present modification too, as illustrated in FIG. 6A and similarly to the sub pixel circuit portion 12 illustrated in FIG. 1B, the respective side faces of the trench portions 43TR1 and 43TR2 of the second electrode 43 (namely, the side walls 43TR1$a$, 43TR1$b$, 43TR2$a$, 43TR2$b$) are employed as the light-emitting region. Thus, in the present modification too, similar advantageous effects to those of the display panel 2 illustrated in FIGS. 1A to 1C can be obtained.

Second Modification

Schematic Configuration of Display Panel 2

Figure 6B:
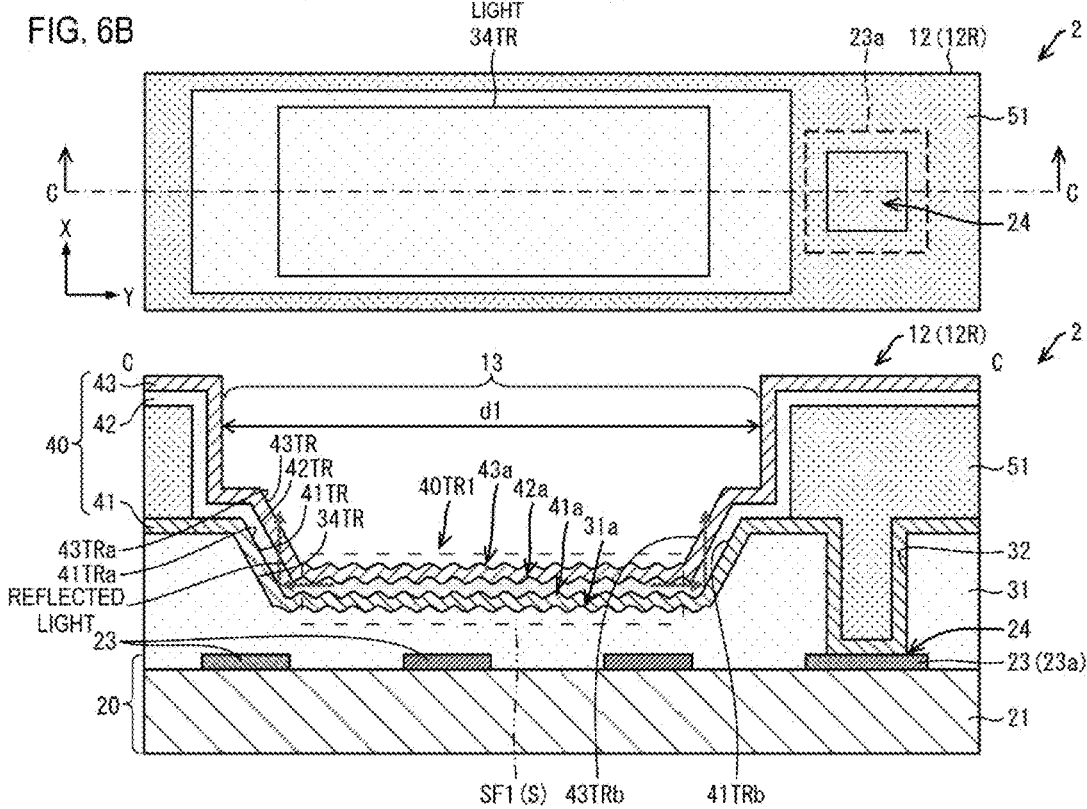
FIG. 6B is a diagram illustrating, arranged above and below, a plan view illustrating a schematic configuration of a sub pixel circuit portion according to a second modification of the first embodiment of the present invention, and a cross-section arrow view taken along line C-C of the sub pixel circuit portion illustrated in the plan view.

FIG. 6B is a diagram illustrating, arranged above and below, a plan view (transparent view) of illustrating a schematic configuration of a sub pixel circuit portion 12 according to a second modification, and a cross-section arrow view taken along line C-C of the sub pixel circuit portion illustrated in the plan view. In FIG. 6B also, the plan view is illustrated at the top of the diagram, and the cross-sectional view is illustrated at the bottom of the diagram. For ease of illustration, the plan view (transparent view) in FIG. 6B also illustrates, as the trench, only the trench portion 34TR in the interlayer insulating layer 31.

In the present modification, within the light-emitting region 13, only a single trench is provided as a trench having reflecting properties (namely, a trench in the EL element 40). The single trench has an indented shape and includes the first electrode 41, the EL layer 42, and the second electrode 43, these being layered in this order and in contact with each other. Specifically, in the present modification, within the light-emitting region 13, only the first trench portion 40TR1 is provided as a trench having reflecting properties. The first trench portion 40TR1 includes trench portions 41TR, 42TR, 43TR respectively formed to the first electrode 41, the EL layer 42, and the second electrode 43 along the trench portion 34TR in the interlayer insulating layer 31.

The display panel 2 according to the present modification, as illustrated in FIG. 6B, has the same configuration as the display panel 2 illustrated in FIGS. 1A and 1B, and FIG. 2, except in that only a single trench having reflecting properties is provided within the light-emitting region 13 of each of the sub pixel circuit portions 12 in plan view. Therefore, the configuration of the cross section S (cross section SF1) illustrated in FIG. 6B is also the same as the configuration of the cross section S illustrated in FIG. 1C.

Method for Producing Display Panel 2

The display panel 2 according to the present modification can be produced by a similar method to that of FIGS. 3A to 3I and FIGS. 4A to 4H, except in that only the first trench portion 40TR1 is formed within the light-emitting region 13.

Namely, the display panel 2 of the present modification can be produced by, for example, performing a process similar to that of FIG. 4F as the next process after the process illustrated in FIG. 3H, and then performing processes similar to the processes illustrated in FIGS. 4G and 4H. The display panel 2 thereby has only the first trench portion 40TR1 including the trench portions 41TR, 42TR, 43TR provided within the light-emitting region 13, with the concave-convex portions (that is, the concave-convex portions 41$a$, 42$a$, 43$a$) being provided on the surface of each of the layers in the first trench portion 40TR1.

Light Energy Absorption-Reducing Effect by Plasmon at Interface Between Positive Electrode and EL Layer 42

In the present modification too, on the surface of the first electrode 41 in the light-emitting region 13, that is, at the interface between the positive electrode metal layer and the EL layer 42, the concave-convex portion 41$a$ having the pitch P1 (convex width and concave width) and concave-convex height H2 of submicron order level (for example, several tens to hundreds nm level) is provided as a diffraction lattice for diffracting the surface plasmon, as illustrated in FIG. 6B. Thus, in the present modification too, similar advantageous effects to those of the display panel 2 illustrated in FIGS. 1A to 1C can be obtained.

Advantage of Increasing Light Extraction Efficiency Due to Not Having Insulating Layer within Reflective Trench In the present modification too, the first trench portion 40TR1 includes the first electrode 41, the EL layer 42, and the second electrode 43, these being layered in this order and in contact with each other, and does not include a partition (insulating layer) on the reflection structure as in the case of trenches 530 in the sub pixel 510R of PTL 1.

Thus, the sub pixel circuit portion 12 according to the present modification also includes only a single light-emitting region 13 and do not have a configuration, as in PTL 1, in which the light-emitting region is partitioned into a plurality of light-emitting regions by non-light-emitting regions. Thus, in the present modification too, similar advantageous effects to those of the display panel 2 illustrated in FIGS. 1A to 1C can be obtained.

Advantage of Increased Lifespan of Light-Emitting Layer

As stated above, in the present modification too, the sub pixel circuit portion 12 does not have a configuration, as in PTL 1, in which the light-emitting region is partitioned into a plurality of light-emitting regions by non-light-emitting regions.

Moreover, in the present modification, as illustrated in FIG. 6B, the side faces of the trench portion 43TR of the second electrode 43 (namely, the side walls 43TRa, 43TRb illustrated in FIG. 6B) are also employed as light-emitting regions. Thus, in the present modification too, similar advantageous effects to those of the display panel 2 illustrated in FIGS. 1A to 1C can be obtained.

Advantage of the Step-shaped Trench 40TR for First and Second Modifications

A description follows regarding the advantage of the step-shaped trench 40TR illustrated in FIGS. 6A and 6B for the first and second modifications illustrated in FIGS. 6A and 6B.

As stated above, generally, when display panels become higher in definition, the size of a single pixel becomes smaller as the definition becomes higher. For the display panel 2 with higher definition, it might be difficult to secure the inter-trench space d32 between the first trench portion 34TR1 and the second trench portion 34TR2 when, as illustrated in FIG. 6A, the first trench portion 34TR1 and the second trench portion 34TR2 are formed side-by-side in plan view within a region of the interlayer insulating layer 31 corresponding to the light-emitting region 13. In this case, it might be difficult to form the first trench portion 34TR1 and the second trench portion 34TR2 isolated from each other.

However, when, as illustrated in FIGS. 1A and 1B, the second trench portion 34TR2 having a length-and-width size smaller than that of the first trench portion 34TR1 is formed as a sub trench within the first trench portion 34TR1 serving as a main trench, the inter-trench spaces d11, d12 may be secured as main trench-sub trench spaces within the first trench portion 34TR1.

A more specific description follows. A description follows by employing, as an example, the width in the longitudinal direction (Y direction) of the sub pixel circuit portion 12 corresponding to a direction in which the trenches are arranged in the sub pixel circuit portion.

In the configuration illustrated in FIGS. 6A and 6B, d1≥d21×2+d32=d31+d21 is satisfied, wherein, as illustrated in FIG. 6A, the width in the Y direction of the light-emitting region 13, this being a trench forming region, is d1, the widths in the Y direction of the trench portions 34TR1, 34TR2 are d21, the trench pitch is d31, and the inter-trench space is d32. So, for example, the value obtained by subtracting d21×2 from d1 is the inter-trench space d31. Thus, when the display panel 2 is made higher definition, depending on the size of d21 with respect to d1, it becomes difficult to secure the inter-trench space d31 and it becomes difficult to form the two trench portions 34TR1, 34TR2 within the light-emitting region 13.

In contrast thereto, when the step-shaped trench 40TR is formed as the reflective trench, then d1≥d2=d3+d11+d12 is satisfied, wherein, as illustrated in FIG. 1B, the width in the Y direction of the light-emitting region 13, this being a trench forming region, is d1, as illustrated in FIG. 1A, the width in the Y direction of the first trench portion 43TR1 serving as the main trench according to the present embodiment is d2, the width in the Y direction of the second trench portion 34TR2 serving as the sub trench according to the present embodiment is d3, the distance in the Y direction from one end portion of the first trench portion 34TR1 to the end portion of the second trench portion 34TR2 located at the one end portion side is d11 (first inter-trench space), and the distance in the Y direction from the other end portion of the first trench portion 34TR1 to the end portion of the second trench portion 34TR2 located at the other end portion side is d12 (second inter-trench space).

Therefore, in the configuration illustrated in FIGS. 1A and 1B, for example, the value obtained by subtracting d3 from d1 (more precisely, d2) is the inter-trench spaces d11, d12. Thus, in the configuration illustrated in FIGS. 1A and 1B, to secure the inter-trench spaces d11, d12, within the first trench portion 34TR1, the second trench portion 34TR2 having a length-and-width size smaller than that of the first trench portion 34TR1 may be formed, enabling the two trench portions 34TR1, 34TR2 to be easily formed within the light-emitting region 13.

As stated above, as an extreme example, in the case of the configuration illustrated in FIGS. 1A and 1B, the second trench portion 34TR2 may be disposed at any given position within the first trench portion 34TR1, and high accuracy alignment technology (particularly, as a conventional high accuracy alignment technology in the Y direction) is not required. In FIGS. 1A and 1B, the inter-trench spaces d11, d12 are sufficient to be produced with mask alignment in a range capable of forming the side walls (trench edges) serving as banks for reflecting the above attenuated light (guided light within the organic layer). Accordingly, a high accuracy grade mask is not required, enabling production cost to be lowered.

Moreover, when the display panel 2 is made higher in definition, such as when the display panel 2 is made ultra-high definition at a level of 600 ppi as stated above, the size of a single sub pixel is 42 µm×14 µm.

In such an ultra-high definition display panel 2, it is difficult to form the first trench portion 34TR1 and the second trench portion 34TR2 illustrated in FIG. 6A isolated from each other. As a result, the first trench portion 34TR1 and the second trench portion 34TR2 illustrated in FIG. 6A merge together, forming a single trench portion 34TR as illustrated in FIG. 6B, and therefore, only a single trench portion can be formed within the light-emitting region 13.

As a result, only the trench portion 41TR of the first electrode 41 is formed on the trench portion 34TR in which the first trench portion 41TR1 and the second trench portion 41TR2 merge together as illustrated in FIG. 6A; only the trench portion 42TR of the EL layer 42 is formed on the trench portion 41TR in which the first trench portion 42TR1 and the second trench portion 42TR2 merge together as illustrated in FIG. 6A; and only the trench portion 43TR of the second electrode is formed on the trench portion 42TR in which the first trench portion 43TR1 and the second trench portion 43TR2 merge together as illustrated in FIG. 6A. Obviously, the advantageous effects exhibited by the second modification can still be obtained in such cases.

However, in such cases, as illustrated in FIG. 6B, the sub pixel circuit portion includes reflective walls only at two locations in the Y direction. The reflective walls are side walls 41TRa, 41TRb of the trench portion 41TR in the Y direction. The side walls 41TRa, 41TRb are trench edges of the first electrode 41 having reflectivity in the Y direction.

Therefore, in such cases, the attenuated light attenuated within a single sub pixel by the light propagation distance limit can only be extracted outside by being reflected at the side walls 41TRa, 41TRb (trench edges) at two locations on the trench portion 41TR of the first electrode 41. The light reflected by the side wall 41TRa of the trench portion 41TR of the first electrode 41 is extracted outside via the side wall 43TRa of the trench portion 43TR of the second electrode 43. The light reflected at the side wall 41TRb of the trench portion 41TR of the first electrode 41 is extracted outside via the side wall 43TRb of the trench portion 43TR of the second electrode 43.

In contrast thereto, the configuration illustrated in FIGS. 1A and 1B does not, as stated above, require an alignment accuracy of high accuracy photolithography, and enables the step-shaped trench 40TR with the second trench portion 40TR2 formed within the first trench portion 40TR1 to be formed within the light-emitting region 13 having a sub pixel area for an ultra-high definition pixel.

Hence, as stated above, when the step-shaped trench 40TR is formed as a reflective trench within the light-emitting region 13, reflective walls are present in four locations in the Y direction, as illustrated in FIG. 1B: at the trench edges of the first electrode 41, i.e. at each of the Y direction side walls 41TR1*a*, 41TR1*b* of the first trench portion 41TR1 and at each of the Y direction side walls 41TR2*a*, 41TR2*b* of the second trench portion 41TR2. Hence, in such cases, the attenuated light reflected by the reflective walls in the four locations can be extracted outside via the trench edges of the second electrode 43, i.e. via each of the Y direction side walls 43TR1*a*, 43TR1*b* of the first trench portion 43TR1 and via each of the Y direction side walls 43TR2*a*, 43TR2*b* of the second trench portion 43TR2.

Accordingly, when the display panel 2 with ultra-high definition is formed as stated above, the light extraction efficiency in the Y direction of the display panel 2 in which the step-shaped trench 40TR is formed as stated above is about twice compared to the case illustrated in FIG. 6B. Thus, the display panel 2 in which the step-shaped trench 40TR is formed as stated above can obtain the light extraction effect of about twice that of the conventional display panel in the Y direction.

Although the effect on light extraction has been discussed with respect to the Y direction, obviously a similar improvement in light extraction effect can be obtained in the X direction.

Third Modification

In the present embodiment, as stated above, an example has been stated for a case in which the light-emitting element is an organic EL element. However, the light-emitting element is not necessarily an organic EL element, and may be an inorganic EL element.

Fourth Modification

In the present embodiment, an example has been stated for a case in which the display panel 2 includes the RGB sub pixel circuit portions 12. However, the present embodiment is not limited thereto, and the display panel 2 may include sub pixel circuit portions 12 of other colors. The sub pixel circuit portions 12 may be sub pixel circuit portions formed from light-emitting elements configured to exhibit, for example, light emission colors of magenta (M), yellow (Y), and cyan (C), and may be sub pixel circuit portions formed from light-emitting elements configured to exhibit a light emission color of white (W).

Fifth Modification

In the present embodiment, an example has been stated for a case in which the display panel 2 is an active EL panel, and the display device 1 is an active EL display device. However, the display panel 2 according to the present embodiment is not limited thereto. As stated above, the display panel 2 may be a passive EL panel, and the display device 1 may be a passive EL display device.

Sixth Modification

Examples of methods of implementing the display panel 2 employing EL elements in full color include: (1) a method in which sub pixel circuits, including EL elements including light-emitting layers for emitting light of each color used to realize full color (each RGB color, for example), are arranged on a semiconductor substrate; (2) a method in which white-light-emitting EL elements, employing a light-emitting layer with a light emission color of W, are combined with color filter (CF) layers to select the light emission color in each sub pixel; and (3) a method of realizing a full color picture display by using a light-emitting layer with a light emission color of W, and incorporating a micro cavity structure for each of the respective sub pixels. Note that employing the method (3) in combination with a CF layer enables the spectra of light emitted from the EL elements to be regulated using the CF.

In the present embodiment, an example has been stated for a case in which the display panel 2 is implemented in full color by employing the method (1) by separately coating a light-emitting layer, for example, as the EL layer 42, onto each sub pixel circuit portion 12 for each respective color. However, the present embodiment is not limited thereto, and any of the above methods (1) to (3) may be employed.

Although not illustrated, when a CF layer is formed in a display panel 2 as indicated in (2) or (3), which is a top-emitting display panel 2 in which light is emitted from the top side of the semiconductor substrate 20 as stated above, a sealing film formed with a CF layer or a sealing substrate formed with a CF layer may be employed as the sealing film or sealing substrate. However, a bottom-emitting display panel 2 may include a CF layer formed on the semiconductor substrate 20 side of the display panel 2.

In the present embodiment, to form the EL elements 40 including light-emitting layers to emit light of each respective color, the EL layer 42 is separately coated onto the sub pixel circuit portions 12 for each respective color.

However, an EL display device in which a light-emitting layer that emits W-light and a CF layer are combined eliminates the need for separately coating the EL layer 42 onto the sub pixel circuit portions 12 for each respective color, because the light emission color of each of the sub pixel circuit portions is changed by another method, such as by the CF layer or the micro cavity structure.

W light emission can be obtained by, for example, superposition of a plurality of light emission colors (namely, superposition of light-emitting layers of the plurality of light emission colors). Examples of combinations of light emission colors include a combination of blue light emission and orange light emission, a combination of blue light emission and yellow light emission, or the like. W light emission can also be obtained by a superposition of red light emission, blue light emission, and green light emission.

Seventh Modification

In the present embodiment, a description has been given of an example in which light-emitting elements including EL elements according to the present embodiment are employed as pixel circuits (specifically, the sub pixel circuit portions 12 in the display panel 2).

The above EL elements and light-emitting elements (pixel circuits) including the EL elements may, for example, be suitably employed in display panels in electronic devices, such as portable terminals of mobile phones, smartphones, tablet personal computers (PCs), mobile personal computers, or electronic papers. However, the present embodiment is not limited thereto.

The EL elements according to the present embodiment, and the light-emitting elements including the EL elements according to the present embodiment, may also be suitably employed in applications other than display panels of display devices. Namely, the EL elements according to the present embodiment, and the light-emitting elements including the EL elements according to the present embodiment may be suitably employed as EL elements and light-emitting elements in various known electronic devices conventionally employing EL elements and light-emitting elements such as illumination devices.

For the light-emitting elements according to the present embodiment, the substrate on which the EL elements are mounted may accordingly have a configuration according to the application of the light-emitting elements, and may include various drive circuits according to the design scheme of the electronic device in which the light-emitting elements are installed.

Second Embodiment

A description follows regarding another embodiment of the present invention, with reference to FIGS. 7A to 7D and FIGS. 8A to 8I.

The present embodiment will be stated by the differences between the present embodiment and the first embodiment, and components having the same function as the components stated in the first embodiment are appended with the same reference signs, and the description thereof is omitted. Obviously, the same modifications as those of the first embodiment may also be applied to the present embodiment.

Display Panel 2

FIG. 7A is a plan view (transparent view) illustrating a schematic configuration of the pixel circuit portion 11 of the display panel 2 according to the present embodiment. FIG. 7B is a plan view (transparent view) illustrating a schematic configuration of the sub pixel circuit portion 12 of the display panel 2 according to the present embodiment. FIG. 7C is a cross-section arrow view taken along line D-D of the sub pixel circuit portion 12 of the display panel 2 illustrated in FIG. 7B. FIG. 7D is a cross-sectional view illustrating an example of a schematic configuration of a cross section S surrounded by a two-dot chain line in the display panel 2 illustrated in FIG. 7C.

In the present embodiment, as illustrated in FIG. 7A, the configuration is also basically the same in the R sub pixel circuit portions 12R, the G sub pixel circuit portions 12G, and the B sub pixel circuit portions 12B.

Thus, in the present embodiment too, FIGS. 7B and 7C are diagrams illustrating a configuration of the sub pixel circuit portion 12 by employing the R sub pixel circuit portion 12R as an example of the sub pixel circuit portion 12.

Further, in the present embodiment too, all of the cross sections S illustrated in FIG. 7C (cross sections SF1, SF2 that are cross sections of the first trench portion 40TR1, cross sections SS1, SS2 that are cross sections of the second trench portion 40TR2, and cross section ST1 that is cross section of the third trench portion 40TR3) have the same configuration. Thus, in FIG. 7D, the configuration of the cross section S is illustrated by employing the cross section SF2 as an example of the cross section S.

The display panel 2 according to the present embodiment is, as illustrated in FIGS. 7A to 7D, the same as the display panel 2 according to the first embodiment except in the following points: the step-shaped trench 40TR includes, within the second trench portion 40TR2 formed within the first trench portion 40TR1, the third trench portion 40TR3 having a length-and-width size smaller than that of the second trench portion 40TR2 in plan view; and the interlayer insulating layer 31 includes, within the light-emitting region 13, the step-shaped trench 33TR having a shape corresponding to that of the step-shaped trench 40.

As illustrated in FIG. 7C, the step-shaped trench 40TR has an indented shape with a cross-section profile in which the third trench portion 40TR3 is located further to the semiconductor substrate 20 side than the second trench portion 40TR2, and the second trench portion 40TR2 is located further to the semiconductor substrate 20 side than the first trench portion 40TR1.

In the present embodiment too, the step-shaped trench 40TR has a shape in conformance with the shape of the step-shaped trench 33TR within the light-emitting region 13.

As illustrated in FIGS. 7A to 7C, in the present embodiment, the interlayer insulating layer 31 has, within the second trench portion 34TR2 formed within the first trench portion 34TR1, a third trench portion 34TR3 having a length-and-width size smaller than that of the second trench portion 34TR2 in a plan view, as the trench portion 34TR. The step-shaped trench 33TR is formed by the first trench portion 34TR1, the second trench portion 34TR2, and the third trench portion 34TR3. The step-shaped trench 33TR has an indented shape with a cross-section profile in which the third trench portion 33TR3 is located further to the semiconductor substrate 20 side than the second trench portion 33TR2, and the second trench portion 33TR2 is located further to the semiconductor substrate 20 side than the first trench portion 33TR1.

The first electrode 41 has a step-shaped trench structure in which, within the light-emitting region 13, the second trench portion 41TR2 having a length-and-width size smaller than that of the first trench portion 41TR1 is formed as a first sub trench within the first trench portion 41TR1 formed as a main trench by the first electrode 41, and the third trench portion 41TR3 having a length-and-width size smaller than that of the second trench portion 41TR2 is formed as a second sub trench within the second trench portion 41TR2.

Similarly, the EL layer 42 has a step-shaped trench structure in which, within the light-emitting region 13, the second trench portion 42TR2 having a length-and-width size smaller than that of the first trench portion 42TR1 is formed as a first sub trench within the first trench portion 42TR1 formed as a main trench by the EL layer 42, and the third trench portion 42TR3 having a length-and-width size smaller than that of the second trench portion 42TR2 is formed as a second sub trench within the second trench portion 42TR2.

Further, the second electrode 43 has a step-shaped trench structure in which, within the light-emitting region 13, the second trench portion 43TR2 having a length-and-width size smaller than that of the first trench portion 43TR1 is formed as a first sub trench within the first trench portion 43TR1 formed as a main trench by the second electrode 43, and the third trench portion 43TR3 having a length-and-width size smaller than that of the second trench portion 43TR2 is formed as a second sub trench within the second trench portion 43TR2.

Thus, similarly to the first embodiment, in the present embodiment too, the step-shaped trench 40TR includes the first electrode 41, the EL layer 42, and the second electrode 43, these being layered in this order and in contact with each other, and does not include a partition (insulating layer) on the reflection structure as in the case of the trench 530 in the sub pixel 510R of PTL 1.

The sub pixel circuit portion 12 according to the present embodiment therefore also has only a single light-emitting region 13 and do not have a configuration such as that of PTL 1 in which the light-emitting region is partitioned into a plurality of light-emitting regions by non-light-emitting regions.

The sub pixel circuit portion 12 according to the present embodiment therefore also uses the reflective electrode to reflect light from the light-emitting region 13 without interposing an insulating layer, and so superfluous reflection like that in PTL 1 does not occur.

In the present embodiment, the side walls of the third trench portion 34TR3 of the interlayer insulating layer 31 preferably include inclined faces, similarly to the first trench portion 34TR1 and the second trench portion 34TR2. The angle of the inclined faces (taper angle) is particularly preferably set at 45° or near 45°.

In the EL element 40, the first electrode 41, the EL layer 42, and the second electrode 43 of the EL element 40 are layered on the step-shaped trench 33TR of the interlayer insulating layer 31 along the step-shaped trench 33TR. The first electrode 41, the EL layer 42, and the second electrode 43 accordingly each include inclined faces at each of their side walls, i.e. at the first trench portions 41TR1, 42TR1, 43TR1, at the second trench portions 41TR2, 42TR2, 43TR2, and at the third trench portions 41TR3, 42TR3, 43TR3. The angle of each inclined face (taper angle) is set, for example, at 45° or near 45°.

The present embodiment accordingly also enables light reflected by the reflective electrode of the EL element 40 i.e. light reflected at the interfaces and guided within the EL layer 42 to be extracted at the front face side (namely, the display face side) of the display panel 2 with good efficiency. However, in the present embodiment too, the above taper angle is not limited to the above angles.

In the present embodiment too, the plan view area ratio and the surface area ratio of the second trench portions 34TR2, 41TR2, 42TR2, 43TR2 with respect to the first trench portions 34TR1, 41TR1, 42TR1, 43TR1 of each of the interlayer insulating layer 31, the first electrode 41, the EL layer 42, and the second electrode 43, and the length and width dimensions and depth of the second trench portions 34TR2, 41TR2, 42TR2, 43TR2, are suitably set such that the length-and-width sizes of the second trench portions 34TR2, 41TR2, 42TR2, 43TR2 do not exceed the light propagation distance limit.

Similarly, the plan view area ratio and the surface area ratio of the third trench portions 34TR3, 41TR3, 42TR3, 43TR3 with respect to the second trench portions 34TR2, 41TR2, 42TR2, 43TR2 of each of the interlayer insulating layer 31, the first electrode 41, the EL layer 42, and the second electrode 43, and the length and width dimensions and depth of the third trench portions 34TR3, 41TR3, 42TR3, 43TR3, are suitably set such that the length-and-width sizes of the third trench portions 34TR3, 41TR3, 42TR3, 43TR3 do not exceed the light propagation distance limit.

In the present embodiment too, as illustrated in FIGS. 7C and 7D, the concave-convex portion 31a similar to that in the first embodiment is provided on the surface of the interlayer insulating layer 31 in the light-emitting region 13, and the concave-convex portion 41a similar to that in the first embodiment is provided on the surface of the first electrode 41 in the light-emitting region 13. Further, the concave-convex portion 42a similar to that in the first embodiment is provided on the surface of the EL layer 42 in the light-emitting region 13, and the concave-convex portion 43a similar to that in the first embodiment is provided on the surface of the second electrode 43 in the light-emitting region 13.

Note that in the present embodiment, as illustrated in FIGS. 7B and 7C, an example is given of a case in which: each of the concave portions 31a, 41a, 42a, 43a is provided, with the uniform pitch P1 (convex width and concave width), on the bottom walls (plane portion) of the first trench portions 34TR1, 41TR1, 42TR1, 43TR1, the second trench portions 34TR2, 41TR2, 42TR2, 43TR2, and the third trench portions 34TR3, 41TR3, 42TR3, 43TR3; and the concave-convex heights H1, H2, H3, H4 are equal to each other.

However, similarly to the first embodiment, the present embodiment is not limited thereto. Obviously, same modifications as those of the first embodiment may also be applied to the present embodiment.

Method for Producing Display Panel 2

Next, a description follows regarding a method for producing the display panel 2, with reference to FIGS. 8A to 8I.

FIGS. 8A to 8I are cross-sectional views of main portions illustrating a sequence of processes for a part of a process for producing the display panel 2 according to the present embodiment. FIGS. 8A to 8I illustrate processes performed after the process illustrated in FIG. 4E. FIGS. 8A to 8I also illustrate cross-sectional structures of the sub pixel circuit portion 12.

In the present embodiment, processes illustrated in FIGS. 3A to 3I and FIGS. 4A to 4E are performed first.

Figure 8A:
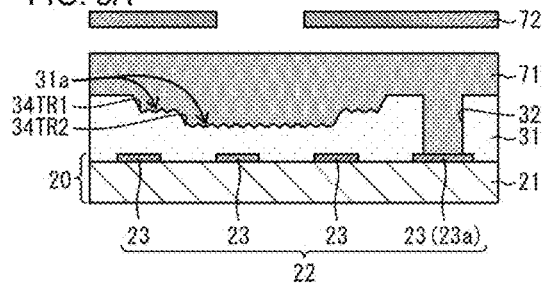
FIGS. 8A to 8I are cross-sectional views of main portions illustrating a sequence of processes for a part of a process for producing the display panel according to the second embodiment of the present invention.

Then, as illustrated in FIG. 8A, the interlayer insulating layer 31 is coated with a photosensitive resist 71, with the photosensitive resist 71 covering the contact hole 32 and the interlayer insulating layer 31.

Next, as illustrated in FIG. 8A, the photosensitive resist 71 is exposed with a second sub trench photomask 72 for forming the third trench portion 34TR3, this being the second sub trench, and developed.

Figure 8F:
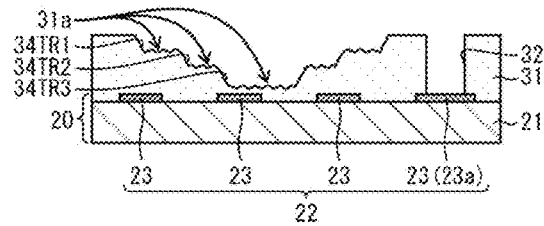
Figure 8B:
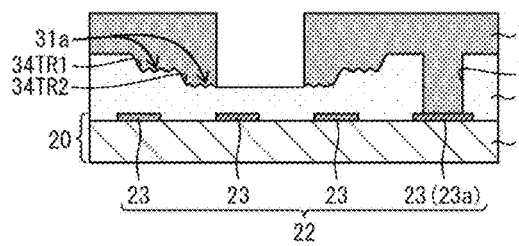

Then, as illustrated in FIG. 8B, the interlayer insulating layer 31 is half etched (by dry etching or wet etching) using the developed photosensitive resist 71 as a mask.

Figure 8G:
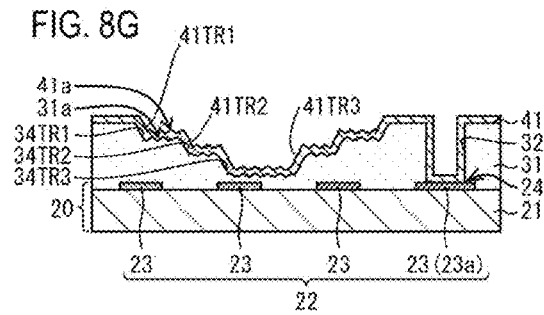
Figure 8C:
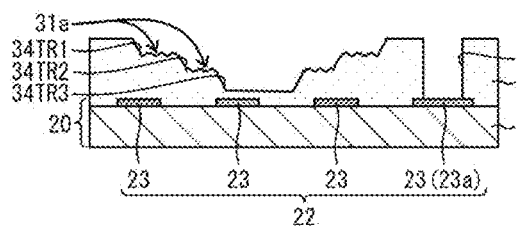

The third trench portion 34TR3 is thereby formed in the interlayer insulating layer 31, as illustrated in FIG. 8C. There are no particular stipulations regarding the taper angle of the third trench portion 34TR3; however, the taper angle is generally set to be 45°. Then, as illustrated in FIG. 8C, the photosensitive resist 71 is removed. In the present embodiment too, the method for removing the photosensitive resist is not limited to a specific method. The photosensitive resist may, for example, be removed by a similar method to that in the first embodiment.

Figure 8H:
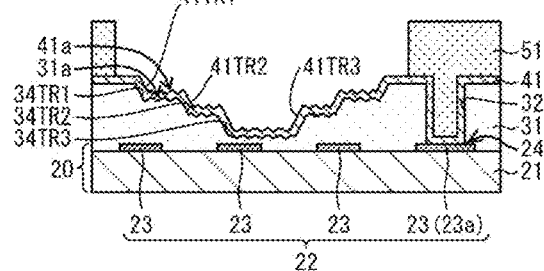
Figure 8D:
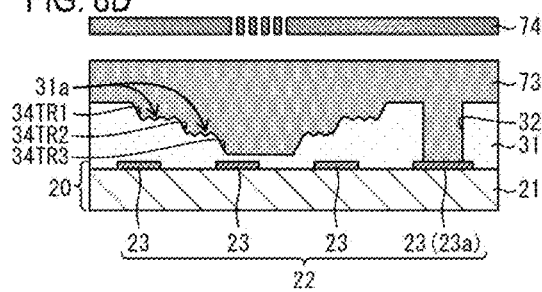

Next, as illustrated in FIG. 8D, the interlayer insulating layer 31 is coated with a photosensitive resist 73, with the photosensitive resist 73 covering the contact hole 32 and the interlayer insulating layer 31. Then, the photosensitive resist 73 is exposed with a concave-convex forming photomask 74 for forming the concave-convex portion 31a at the third trench portion 34TR3, and developed.

Note that for example, the mask of submicron rule used for single-crystal LSI or the like may be used also for the concave-convex forming photomask 74.

Figure 8I:
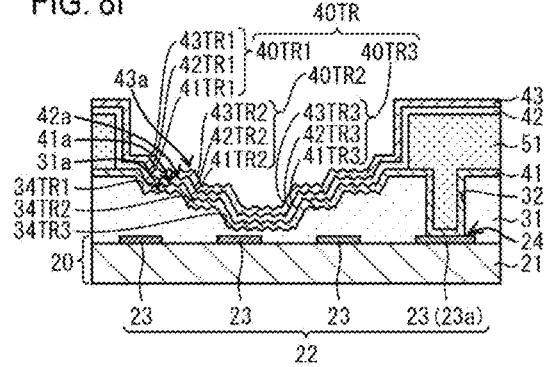
Figure 8E:
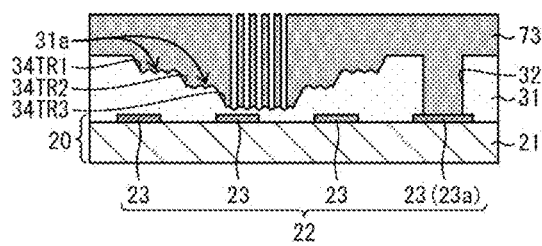

Then, as illustrated in FIG. 8E, the surface of the interlayer insulating layer 31 within the third trench portion 34TR3 is etched (by dry etching or wet etching) using the developed photosensitive resist 73 as a mask.

Thereafter, the photosensitive resist 73 is removed, thereby, as illustrated in FIG. 8F, forming, on the surface of the interlayer insulating layer 31 at the bottom wall portion (plane portion) of the third trench portion 34TR3, the concave-convex portion 31a having the pitch P1 (concave width and convex width) and concave-convex height H1 (see FIG. 7D) of several tens to hundreds nm level, as that of the concave-convex portion 31a in the first trench portion 34TR1 and second trench portion 34TR2.

Then, as illustrated in FIG. 8G, similarly to the first embodiment, an electrode material for forming the first electrode 41 (positive electrode metal layer) is deposited on the interlayer insulating layer 31 using a sputtering method, for example, with the electrode material covering the contact hole 32 and the interlayer insulating layer 31.

Next, a photosensitive resist on the layer formed from the electrode material is patterned to form a resist pattern (not illustrated) by a photolithography method, and after the layer formed from the electrode material has been etched using the resist pattern as a mask, the resist pattern is removed. As a result, the first electrode 41 including the first trench portion 41TR1, the second trench portion 41TR2, and the third trench portion 41TR3 and being isolated for each sub pixel circuit portion 12 is formed, and at the same time, the drive TFT-first electrode contact portion 24 is also formed in which the drive TFT 23a and the first electrode 41 are electrically connected through the contact hole 32.

In the embodiment too, the shape of the concave-convex portion 31a of the surface of the interlayer insulating layer 31 is reflected as it is onto the layer formed from the electrode material. Therefore, the concave-convex portion 41a having the same pitch P1 (convex width and concave width) and concave-convex height H2 (see FIG. 7D) as that of the concave-convex portion 31a is formed on the first electrode 41 at the first trench portion 41TR1, the second trench portion 41TR2, and the third trench portion 41TR3.

Next, as illustrated in FIG. 8H, similarly to the first embodiment, the edge cover 51 is formed across the entire display region of the semiconductor substrate 20 in which the first electrode 41 is formed, by depositing an insulating material, with the insulating material covering the first electrode 41 and the interlayer insulating layer 31.

Then, similarly to the first embodiment, a photosensitive resist on the layer formed from the insulating material (edge cover 51) is patterned to form a resist pattern (not illustrated) by a photolithography method, and after the layer formed from the insulating material has been etched using the resist pattern as a mask, the resist pattern is removed, and the edge cover 51 is thereby patterned in a shape defining the light emitting region of each of the sub pixel circuit portions 12.

Thereafter, as illustrated in FIG. 8I, similarly to the first embodiment, the EL layer 42 including the first trench portion 42TR1, the second trench portion 42TR2, and the third trench portion 42TR3 along the first trench portion 41TR1, the second trench portion 41TR2, and the third trench portion 41TR3 is formed on the first electrode 41.

Next, similarly to the first embodiment, the second electrode 43 (negative electrode metal layer) including the first trench portion 43TR1, the second trench portion 43TR2, and the third trench portion 43TR3 along the first trench portion 42TR1, the second trench portion 42TR2, and the third trench portion 42TR3 in the EL layer 42 is formed over the entire display region of the semiconductor substrate 20 in which the EL layer 42 is formed, by using, for example, a sputtering method. As a result, the EL element 40 including the step-shaped trench 40TR, in which the second trench portion 40TR2 configured from the second trench portions 41TR2, 42TR2, 43TR2 is formed within the first trench portion 40TR1 configured from the first trench portions 41TR1, 42TR1, 43TR1 and the third trench portion 40TR3 configured from the third trench portions 41TR3, 42TR3, 43TR3 is formed within the second trench portion 43TR2, is formed within the light-emitting region 13 not covered by the edge cover 51.

In the embodiment too, the shape of the concave-convex portion 41a of the surface of the first electrode 41 is reflected as it is onto the EL layer 42, and the shape of the concave-convex portion 42a of the surface of the EL layer 42 is reflected as it is onto the second electrode 43. Therefore, the concave-convex portion 42a having the same pitch P1 (convex width and concave width) and concave-convex height H3 (see FIG. 7D) as that of the concave-convex portions 31a, 41a is formed on the EL layer 42 at the first trench portion 41TR1, the second trench portion 41TR2, and the third trench portion 41TR3. Further, the concave-convex portion 43a having the same pitch P1 (convex width and concave width) and concave-convex height H4 (see FIG. 7D) as that of the concave-convex portions 31a, 41a, 42a is formed on the second electrode 43 at the first trench portion 41TR1, the second trench portion 41TR2, and the third trench portion 41TR3.

Then, similarly to the first embodiment, the EL element 40 is sealed by covering the EL element 40 with a sealing member such as, for example, a cover glass (not illustrated).

Light-Emitting/Improved Light Extraction Action of Display Panel 2

The light-emitting action and improved light extraction action of the sub pixel circuit portion 12 in the display panel 2 according to the present embodiment is basically the same as that of first embodiment.

However, in the present embodiment, reflective walls are present in each of the trench portions 41TR1, 41TR2, 41TR3 of the first electrode 41 at a total of six locations in the Y direction and a total of six locations in the X direction, enabling the attenuated light to be reflected by each of the reflective walls and extracted outside.

In the present embodiment, FIG. 7C illustrates a situation in which the attenuated light is reflected by the trench edges of the first electrode 41, i.e. by each side wall 41TR1a, 41TR1b of the first trench portion 41TR1, by each side wall 41TR2a, 41TR2b of the second trench portion 41TR2, and by each side wall 41TR3a, 41TR3b of the third trench portion 41TR3, and then is extracted outside from the trench edges of the second electrode 43, i.e. from each side wall 43TR1a, 43TR1b of the first trench portion 43TR1, from each side wall 43TR2a, 43TR2b of the second trench portion 43TR2, and from each side wall 43TR3a, 43TR3b of the third trench portion 43TR3.

Thus, in FIG. 7C, the attenuated light is illustrated as being reflected by each of the side walls (trench edges) of the respective trench portions 41TR1, 41TR2, 41TR3 in the length direction (Y direction) of the sub pixel circuit portion 12. The attenuated light is also reflected in a similar manner by each of the side walls (trench edges) of the respective trench portions 41TR1, 41TR2, 41TR3 in the width direction (X direction) of the sub pixel circuit portion 12.

Advantageous Effects

As stated above, similarly to the first embodiment, the present embodiment also does not form a trench shape serving as walls and banks for reflecting light in an island pattern partitioned in the horizontal direction by non-light-emitting regions as in PTL 1, but instead, the step-shaped trench 40TR is provided within the light-emitting region 13. The step-shaped trench 40TR has a step shape at the inside and does not include an insulating layer between the first electrode 41 and the second electrode 43.

In the present embodiment too, on the surface of the first electrode 41 in the light-emitting region 13, that is, at the interface between the positive electrode metal layer and the EL layer 42, the concave-convex portion 41a having the pitch P1 (convex width and concave width) and concave-convex height H2 of submicron order level (for example, several tens to hundreds nm level) is provided as a diffraction lattice for diffracting the surface plasmon.

Accordingly, the present embodiment can also obtain similar advantageous effects to those of the first embodiment.

The present embodiment enables reflection points to be increased compared to in the first embodiment by providing the third trench portion 34TR3 within the second trench portion 34TR2.

A more detailed description follows regarding an advantage related to the number of reflection points, with reference to the first and second modifications of the first embodiment.

As stated in the first embodiment, generally, when display panels become higher in definition, the size of a single pixel becomes smaller as the definition becomes higher. For the display panel 2 with higher definition, it might be difficult to secure the inter-trench space d32 when, as illustrated in FIG. 6A, the first trench portion 34TR1 and the second trench portion 34TR2 are formed side-by-side in the length direction (Y direction) in plan view within a region of the interlayer insulating layer 31 corresponding to the light-emitting region 13.

Thus, as illustrated in FIG. 6A, depending on the size of the light-emitting region 13, the minimum number of divided trenches in the Y direction due to the limitations of photolithography is two. Namely, reflection points for the light attenuated by the light propagation distance limit inside each of the sub pixels are present at four locations in the Y direction of the first electrode 41.

However, in the present embodiment, as illustrated in FIG. 7C, due to the formation of the double sub trench structure including the first sub trench and the second sub trench within the main trench, the reflection points for the light attenuated by the light propagation distance limit can be increased to six locations in the Y direction of the first electrode 41. Thus, the sub pixel circuit portion 12 of the present embodiment can obtain the light extraction effect of 1.5 times that of the sub pixel circuit portion 12 illustrated in FIG. 6A in the Y direction. The sub pixel circuit portion 12 of the present embodiment can also obtain the light extraction effect of about three times that of the sub pixel circuit portion 12 illustrated in FIG. 6B.

Although the effect on light extraction has been discussed with respect to the Y direction, obviously a similar improvement in light extraction effect can be obtained in the X direction.

Basically, the light extraction effect can be increased as the number of reflective wall of the trenches is increased. Accordingly, the present embodiment enables the light extraction effect to be improved more than that in the first embodiment.

First Modification

In the present embodiment, an example has been stated for a case in which the reflection points for the light attenuated by the light propagation distance limit is increased in the Y direction of the first electrode 41 by forming the double sub trench structure including the first sub trench and the second sub trench within the main trench.

However, the method for increasing the number of sub trenches within the main trench is not limited to the above method.

In cases in which Z trenches (Z is a freely-selected integer of 1 or greater) are formed within the light-emitting region 13, each of the trenches is preferably formed such that the zth sub trench (z is a freely-selected integer of from 2 to Z) is formed in the z−1th trench, as in the present embodiment, for the reasons stated in the first and second embodiments, and in particular from the viewpoint of the limitations of photolithography.

However, as stated above, the plan view area ratio and the surface area ratio of the zth trench (for example, the second trench portion 34TR2) with respect to the z−1th trench (for example, the first trench portion 34TR1), and the length and width dimensions and depth of the zth trench are preferably set such that the length-and-width size of the zth trench does not exceed the light propagation distance limit.

Thus, a plurality of sub trenches may be provided side-by-side within the main trench, depending on the minimum number of divided trenches in the Y direction due to the limitations of photolithography and the light propagation distance limit.

For example, when the minimum number of divided trenches in the Y direction due to the limitations of photolithography is two, then two sub trenches may be provided side-by-side within the main trench, and these two sub trenches provided side-by-side may each be formed in a step shape. Namely, a configuration may be adopted in which there are a plurality of step-shaped trenches provided side-by-side in plan view within a step-shaped trench.

Second Modification

The method for increasing the number of trenches within the light-emitting region 13 is not limited to the method stated above. In cases in which the minimum number of divided trenches in the Y direction due to the limitations of photolithography is two as stated above, the first trench portion 34TR1 and the second trench portion 34TR2 may, as illustrated in FIG. 6A, be provided side-by-side in plan view within the light-emitting region 13, and these two trenches provided side-by-side may each be formed in a step shape.

Namely, a configuration may be adopted in which there are a plurality of step-shaped trenches provided side-by-side in plan view within the light-emitting region 13.

For example, in FIG. 6A, a configuration may be adopted in which the third trench portion 40TR3 having a length-and-width size smaller than that of the first trench portion 34TR1 is provided within the first trench portion 34TR1, and a similar trench portion to the third trench portion 40TR3 having a length-and-width size smaller than that of the second trench portion 34TR2 is provided within the second trench portion 34TR2.

Obviously, in FIG. 6A, a step-shaped trench may be provided in only one out of the first trench portion 34TR1 and the second trench portion 34TR2, and the first trench portion 34TR1 and the second trench portion 34TR2 may be different in size from each other.

Namely, a plurality of main trenches may be provided in the horizontal direction. Reference here to main trench is not restricted by size or number, and merely indicates a trench furthest to the outside (having the outermost outline) in plan view in a step-shaped trench having another trench as a sub trench inside the main trench.

Third Embodiment

A description follows regarding yet another embodiment of the present invention, with reference to FIGS. 9A to 9D through FIGS. 11A to 11F.

The present embodiment will be stated by the differences between the present embodiment and the first embodiment, and components having the same function as the components stated in the first embodiment are appended with the same reference signs, and the description thereof is omitted. Obviously, similar modifications to those of the first and second embodiments may also be applied to the present embodiment.

Display Panel 2

FIG. 9A is a plan view (transparent view) of a schematic configuration of the pixel circuit portion 11 of the display panel 2 according to the present embodiment, illustrated alongside the sub pixel circuit portion 12 of the first embodiment for comparison purposes. FIG. 9B is a plan view (transparent view) illustrating a schematic configuration of the sub pixel circuit portion 12 of the display panel 2 according to the present embodiment. FIG. 9C is a cross-section arrow view taken along line E-E of the sub pixel circuit portion 12 of the display panel 2 illustrated in FIG. 9B. FIG. 9D is a cross-sectional view illustrating an example of a schematic configuration of a cross section S surrounded by a two-dot chain line in the display panel 2 illustrated in FIG. 9C.

In the present embodiment too, as illustrated in FIG. 9A, the configuration is basically the same in the R sub pixel circuit portions 12R, the G sub pixel circuit portions 12G, and the B sub pixel circuit portions 12B.

Thus, in the present embodiment too, FIGS. 9B and 9C illustrate the configuration of the sub pixel circuit portion 12 by employing the R sub pixel circuit portion 12R as an example of the sub pixel circuit portion 12.

In the present embodiment too, all of the cross sections S illustrated in FIG. 9C (cross sections SF1, SF2 that are the cross section of the first trench portion 40TR1) have the same configuration. Thus, in FIG. 9D, the configuration of the cross section S is illustrated by employing the cross section SF2 as an example of the cross section S.

The display panel 2 according to the present embodiment is, as illustrated in FIGS. 9A to 9D, the same as the display panel 2 according to the first embodiment except in the following points: in each sub pixel circuit portions 12, the drive TFT-first electrode contact portion 24 is provided in a sub trench area (sub trench portion), not outside the light-emitting region 13; and the concave-convex portions 31a, 41a, 42a, 43a are provided only within the first trench portion 34TR1, 40TR1.

Namely, in the present embodiment, the drive TFT 23a is disposed within the second trench portion 34TR2 of the interlayer insulating layer 31, and the first electrode 41 is electrically connected to the drive TFT 23a at the second trench portion 41TR2 in the first electrode 41. Thus, the concave-convex portions 31a 41a, 42a, 43a are not provided in the sub trench area (that is, the second trench portions 34TR2, 40TR2).

The present embodiment eliminates the need for providing a drive TFT-first electrode contact portion 24 in a non-light-emitting region outside the light emitting region 13. The sub pixel circuit portion 12 of the present embodiment has a configuration in which the region provided outside the light emitting region 13 for forming the drive TFT-first electrode contact portion 24 in the sub pixel circuit portion 12 according to the first embodiment has been removed.

Method for Producing Display Panel 2

A description follows regarding the method for producing the display panel 2, with reference to FIGS. 10A to 10F and FIGS. 11A to 11F.

FIGS. 10A to 10F are cross-sectional views of main portions illustrating a sequence of processes in a process for producing the display panel 2 according to the present embodiment. FIGS. 11A to 11F are cross-sectional views of main portions illustrating a sequence of processes in a process for producing the display panel 2 according to the present embodiment, performed after the process illustrated in FIG. 10F. Note that FIGS. 10A to 10F and FIGS. 11A to 11F illustrate cross-sectional structures of the sub pixel circuit portion 12

Figure 10A:
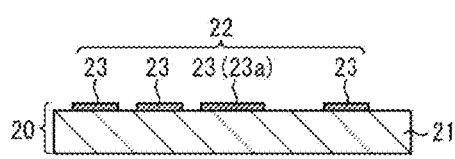
FIGS. 10A to 10F are cross-sectional views of main portions illustrating a sequence of processes in a process for producing the display panel according to the third embodiment of the present invention.

First, as illustrated in FIG. 10A, the semiconductor substrate 20 is prepared by forming, on the insulating substrate 21, the TFT circuit portion 22 including the drive TFT 23a and the various lines stated above (not illustrated), such as the scanning lines GL, the data lines SL, the high level power source lines ELVDD, the low level power source lines ELVSS, and the emission lines.

At this time, in the present embodiment, the drive TFT 23a is disposed within the region for forming the second trench portion 43TR2 such that the first electrode 41 in the second trench portion 41TR2 forms the drive TFT-first electrode contact portion 24.

Figure 10B:
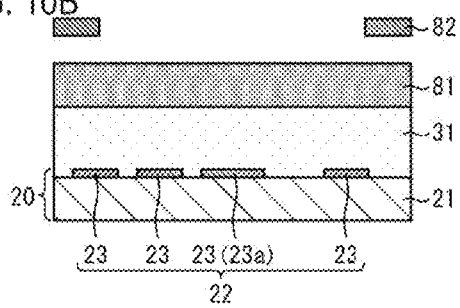

Next, as illustrated in FIG. 10B, the interlayer insulating layer 31 is formed across the entire display region of the semiconductor substrate 20 by depositing, similarly to the first embodiment, an insulating material, such as a photosensitive resin, on the semiconductor substrate 20.

Then, as illustrated in FIG. 10B, the interlayer insulating layer 31 is coated with a photosensitive resist 81, and the photosensitive resist 81 is exposed with a main trench photomask 82 for forming the first trench portion 34TR1 as a main trench in the interlayer insulating layer 31, and developed.

Figure 10C:
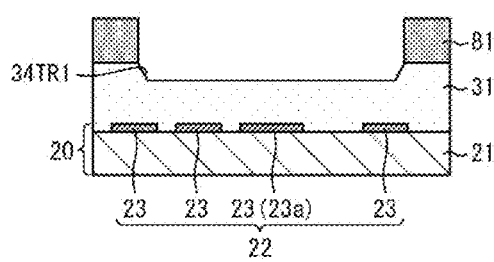

Next, as illustrated in FIG. 10C, similarly to the first embodiment, the interlayer insulating layer 31 is half etched (by dry etching or wet etching) using the developed photosensitive resist 81 as a mask, thereby forming the first trench portion 34TR1 in the interlayer insulating layer 31. The taper angle of the first trench portion 34TR1 in the present embodiment is also not limited to a specific angle; however, the taper angle is generally set to be 45°.

Figure 10D:
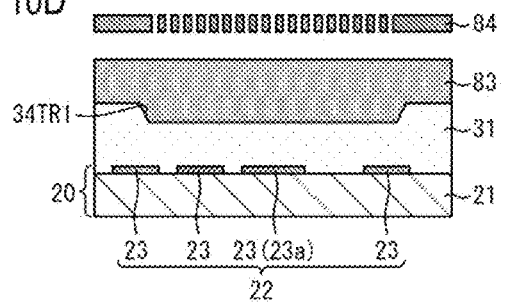

Next, as illustrated in FIG. 10D, after the photosensitive resist 81 is removed, the interlayer insulating layer 31 is coated with a photosensitive resist 83, with the photosensitive resist 83 covering the interlayer insulating layer 31. Thereafter, as illustrated in FIG. 10D, the photosensitive resist 83 is exposed with a concave-convex forming photomask 84 for forming the concave-convex portion 31a at the first trench portion 34TR1, and developed.

Note that for example, the mask of submicron rule used for single-crystal LSI or the like may be used also for the concave-convex forming photomask 84.

Figure 10E:
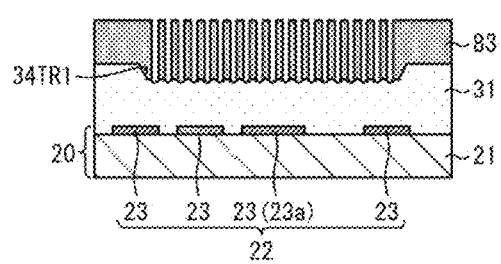

Then, as illustrated in FIG. 10E, the surface of the interlayer insulating layer 31 within the first trench portion 34TR1 is etched (by dry etching or wet etching) using the developed photosensitive resist 83 as a mask.

Figure 10F:
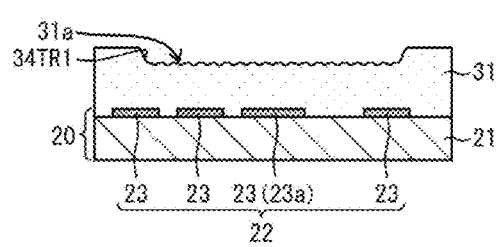

Thereafter, as illustrated in FIG. 10F, the photosensitive resist 83 is removed, thereby forming, on the surface of the interlayer insulating layer 31 of the bottom wall portion (plane portion) of the first trench portion 34TR1, the concave-convex portion 31a having the pitch P1 (concave width and convex width) and concave-convex height H1 (see FIG. 9D) of several tens to hundreds nm level.

Figure 11A:
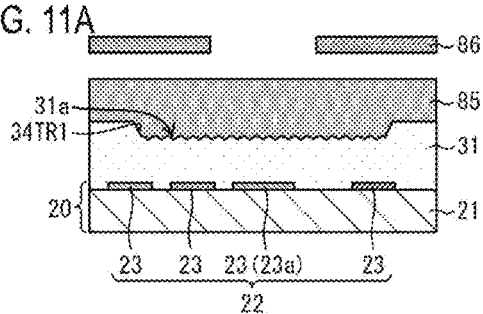
FIGS. 11A to 11F are cross-sectional views of main portions illustrating a sequence of processes in a process for producing the display panel according to the third embodiment of the present invention, performed after the process illustrated in FIG. 10F.

Next, as illustrated in FIG. 11A, the interlayer insulating layer 31 is coated with a photosensitive resist 85, with the photosensitive resist 85 covering the interlayer insulating layer 31. Next, as illustrated in FIG. 11A, the photosensitive resist 85 is exposed with a sub trench photomask 86 for forming the second trench portion 34TR2 employed as a contact hole to form the drive TFT-first electrode contact portion 24 within the first trench portion 34TR1, and developed.

Figure 11B:
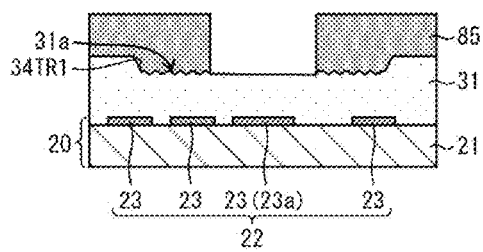

Then, as illustrated in FIG. 11B, after the interlayer insulating layer 31 above the drive TFT 23a is etched (by dry etching or wet etching) using the developed photosensitive resist 85 as a mask, the photosensitive resist 85 is removed.

Figure 11C:
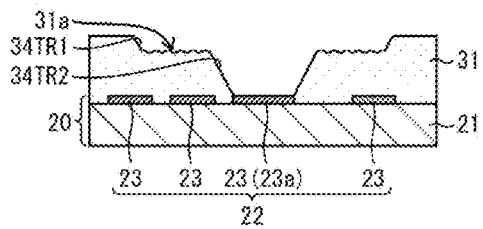

Then, as illustrated in FIG. 11C, the second trench portion 34TR2 is formed within the first trench portion 34TR1 in the interlayer insulating layer 31, and the drive TFT 23a is exposed. Similar to the first embodiment, the taper angle of the second trench portion 34TR2 is not limited to a specific angle also in cases in which the second trench portion 34TR2 is used as a contact hole to form the drive TFT-first electrode contact portion 24 in this manner. However, the taper angle is generally set to be 45°.

Figure 11D:
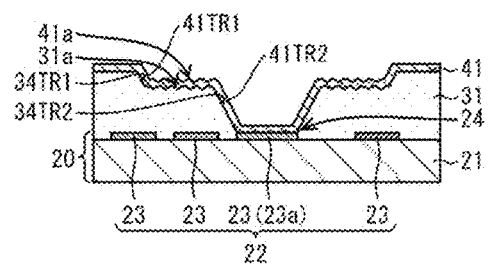

Then, as illustrated in FIG. 11D, similarly to the first embodiment, an electrode material for forming the first electrode 41 (positive electrode metal layer) is deposited on the interlayer insulating layer 31 using a sputtering method, for example, with the electrode material covering the drive TFT 23a and the interlayer insulating layer 31.

Next, a photosensitive resist on the layer formed from the electrode material is patterned to form a resist pattern (not illustrated) by a photolithography method, and after the layer formed from the electrode material has been etched using the resist pattern as a mask, the resist pattern is removed. As a result, the first electrode 41 including the first trench portion 41TR1 and the second trench portion 41TR2 and being isolated for each sub pixel circuit portion 12 is formed, and at the same time, the drive TFT-first electrode contact portion 24 in which the drive TFT 23a and the first electrode 41 are electrically connected at the second trench portion 41TR2 is formed.

In the present embodiment too, the shape of the concave-convex portion 31a of the surface of the interlayer insulating layer 31 is reflected as it is onto the layer formed from the electrode material. Therefore, the concave-convex portion 41a having the same pitch P1 (convex width and concave width) and concave-convex height H2 (see FIG. 9D) as that of the concave-convex portion 31a is formed on the first electrode 41 at the first trench portion 41TR1.

Figure 11E:
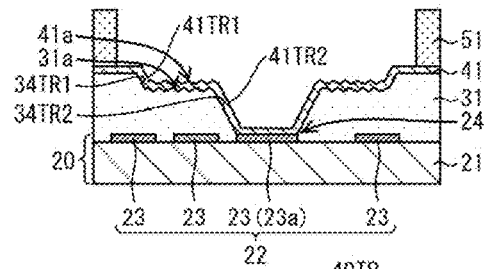

Next, as illustrated in FIG. 11E, similarly to the first embodiment, the edge cover 51 is formed across the entire display region of the semiconductor substrate 20 in which the first electrode 41 is formed, by depositing an insulating material, with the insulating material covering the first electrode 41 and the interlayer insulating layer 31.

Then, similarly to the first embodiment, a photosensitive resist on the layer formed from the insulating material (edge cover 51) is patterned to form a resist pattern (not illustrated) by a photolithography method, and after the layer formed from the insulating material has been etched using the resist pattern as a mask, the resist pattern is removed, and the edge cover 51 is thereby patterned in a shape defining the light-emitting region of each of the sub pixel circuit portions 12.

Figure 11F:
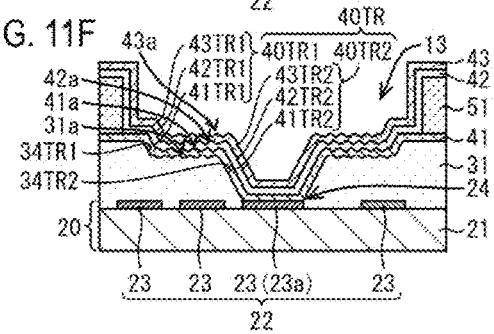

Then, as illustrated in FIG. 11F, similarly to the first embodiment, the EL layer 42 including the first trench portion 42TR1 and the second trench portion 42TR2 along the first trench portion 41TR1 and the second trench portion 41TR2 is formed on the first electrode 41.

Next, similarly to the first embodiment, the second electrode 43 (negative electrode metal layer) including the first trench portion 43TR1 and the second trench portion 43TR2 along the first trench portion 42TR1 and the second trench portion 42TR2 in the EL layer 42 is formed over the entire display region of the semiconductor substrate 20 in which the EL layer 42 is formed, by using, for example, a sputtering method. As a result, the EL element 40 including the step-shaped trench 40TR is formed within the light-emitting region 13 not covered by the edge cover 51, and the step-shaped trench 40TR includes the second trench portion 40TR2 formed within the first trench portion 40TR1.

In the embodiment too, the shape of the concave-convex portion 41a of the surface of the first electrode 41 is reflected as it is onto the EL layer 42, and the shape of the concave-convex portion 42a of the surface of the EL layer 42 is reflected as it is onto the second electrode 43. Therefore, the concave-convex portion 42a having the same pitch P1 (convex width and concave width) and concave-convex height H3 (see FIG. 9D) as that of the concave-convex portions 31a, 41a is formed on the EL layer 42 at the first trench portion 42TR1. Further, the concave-convex portion 43a having the same pitch P1 (convex width and concave width) and concave-convex height H4 (see FIG. 9D) as that of the concave-convex portions 31a, 41a, 42a is formed on the second electrode 43 at the first trench portion 43TR1.

Then, similarly to the first embodiment, the EL element 40 is sealed by covering the EL element 40 with a sealing member such as, for example, a cover glass (not illustrated).

Light-Emitting/Improved Light Extraction Action of Display Panel 2

The light-emitting action and improved light extraction action of the sub pixel circuit portion 12 in the display panel 2 according to the present embodiment are the same as those of first embodiment. Thus, the description thereof is omitted in the present embodiment.

Advantageous Effects

As above, the display panel 2 according to the present embodiment is the same as the display panel 2 according to the first embodiment except in that in each sub pixel circuit portions 12, the drive TFT-first electrode contact portion 24 is formed by the first electrode 41 at the first trench portion 43TR1. Accordingly, the present embodiment can also obtain similar advantageous effects to those of the first embodiment.

The present embodiment can obtain the following advantageous effects, in addition to advantageous effects similar to those of the first embodiment. A description follows regarding additional effects of the present embodiment, with reference to FIGS. 6A and 6B, FIG. 9A, and FIGS. 16A and 16B.

In the present embodiment, as stated above, the drive TFT-first electrode contact portion 24 is provided in a sub trench area formed within the light-emitting region. The present embodiment accordingly enables the effective size of a single sub pixel to be smaller than that of the sub pixel circuit portion 12 according to the first embodiment, as illustrated in FIG. 9A.

For example, as illustrated in FIG. 9A, take a length D1 as a length in the length direction (Y direction) of the sub pixel circuit portion 12 needed in the sub pixel circuit portion 12 according to the first embodiment for the drive TFT-first electrode contact portion 24. In cases in which D1 occupies ⅕ the overall length of the sub pixel circuit portions 12 in the Y1 direction (namely, the length of the longer side of the sub pixel circuit portions 12), the present embodiment can reduce the length of the longer side of the sub pixel circuit portions 12 by ⅕ that of the first embodiment. In such cases, the pixel size can be reduced by 20% at the long side. Accordingly, the present embodiment can provide the display panel 2 having higher definition than that of the first embodiment.

For similar reasons, the present embodiment also enables a reduction in pixel size compared to the sub pixel circuit portion 12 illustrated in FIGS. 6A and 6B, and to the sub pixels 510R, 510G, and 510B of PTL 1 illustrated in FIGS. 16A and 16B. Accordingly, the present embodiment can provide the display panel 2 with higher definition than that of the conventional display panel.

As stated in the first embodiment, the present technology enables a plurality of trench portions to be formed within the light-emitting region 13, even in the case of the display panel 2 with ultra-high definition. Accordingly, similarly to the sub pixel circuit portion 12 illustrated in, for example, FIGS. 1A and 1B, the present embodiment also enables reflection points for light attenuated by the light propagation distance limit within the sub pixels to be secured at, for example, four locations in the Y direction of the first electrode 41. Accordingly, the present embodiment enables about twice the light extraction effect to be obtained in the Y direction compared to cases in which there are, within the light-emitting region 13, two trench portions provided side-by-side in the horizontal direction, as in, for example, the sub pixel circuit portion 12 illustrated in FIG. 6A. The present embodiment can also obtain about twice the light extraction effect while reducing the sub pixel size by providing the drive TFT-first electrode contact portion 24 at the sub trench area as stated above.

The present embodiment also enables production processes to be simplified because the present embodiment eliminates the need for forming in the interlayer insulating layer 31 a separate contact hole 32 to form the drive TFT-first electrode contact portion 24.

First Modification

An example has been stated in the present embodiment of a case in which the first electrode 41 is electrically connected to the drive TFT 23*a* at the first trench portion 41TR1 in the first electrode 41. However, the present embodiment is not limited thereto.

For example, in cases in which the sub pixel circuit portion 12 has a first sub trench and a second sub trench provided as sub trenches as in the second embodiment, the drive TFT-first electrode contact portion 24 may be provided in the second sub trench area.

Namely, in the second embodiment, a configuration may be made such that the drive TFT 23*a* is disposed within the third trench portion 34TR3 in the interlayer insulating layer 31, and the first electrode 41 is electrically connected to the drive TFT 23*a* at the third trench portion 41TR3 of the first electrode 41. In such cases, a light extraction effect of three times that of the sub pixel circuit portion 12 illustrated in FIG. 6B can be obtained with the sub pixel size being reduced.

In such cases, in the second embodiment, the drive TFT 23*a* is disposed in the region of the interlayer insulating layer 31 for forming the third trench portion 34TR3. The interlayer insulating layer 31 is etched, and the drive TFT 23*a* is exposed at the third trench portion 34TR3. As a result of the processes and the like, the drive TFT 23*a* is disposed within the third trench portion 34TR3, and the first electrode 41 is formed on the third trench portion 34TR3. As a result, the sub pixel circuit portion 12 can be formed.

Irrespective of the number of trenches (the number of trench steps) in the step-shaped trench 33TR of the interlayer insulating layer 31, the present embodiment enables the light extraction effect to be increased, while reducing the sub pixel size, due to forming the drive TFT 23*a* in a bottom portion of the step-shaped trench 33TR in the interlayer insulating layer 31.

Second Modification

The drive TFT-first electrode contact portion 24 configured as stated above is preferably formed in a bottom portion of the step-shaped trench 33TR in the interlayer insulating layer 31 in order to allow the drive TFT-first electrode contact portion 24 to be formed simply within the light-emitting region 13 and in order to achieve a simple configuration. However, the present embodiment is not limited thereto. The drive TFT-first electrode contact portion 24 may be disposed within the light-emitting region 13 by separately forming a contact hole to form the drive TFT-first electrode contact portion 24 within the step-shaped trench 33TR. Namely, the drive TFT-first electrode contact portion 24 may be provided in a region of the step-shaped trench 33TR other than at the bottom portion of the step-shaped trench 33TR.

Third Modification

The sub pixel size can be reduced by providing the drive TFT-first electrode contact portion 24 in a trench portion as stated above. Accordingly, the sub pixel size can also be reduced in the sub pixel circuit portion 12 illustrated in FIG. 6A by connecting the first electrode 41 to the drive TFT 23*a* at one trench portion out of the first trench portion 40TR1 and the second trench portion 40TR2 (namely, connecting the first electrode 41 and the drive TFT 23*a* together at one trench portion out of the first trench portion 40TR1 and the second trench portion 40TR2).

Similarly, the sub pixel size can also be reduced in the sub pixel circuit portion 12 illustrated in FIG. 6B by connecting the first electrode 41 to the drive TFT 23*a* at the first trench portion 40TR1.

Fourth Embodiment

A description follows regarding yet another embodiment of the present invention, with reference to FIGS. 12A and 12B to FIGS. 14A and 14B.

The present embodiment will be stated by the differences between the present embodiment and the third embodiment. Components having the same function as the components stated in the third embodiment are appended with the same reference signs, and the description thereof is omitted. Obviously, the same modifications as those of the first to the third embodiments may also be applied to the present embodiment.

Display Panel 2

Figure 12A:
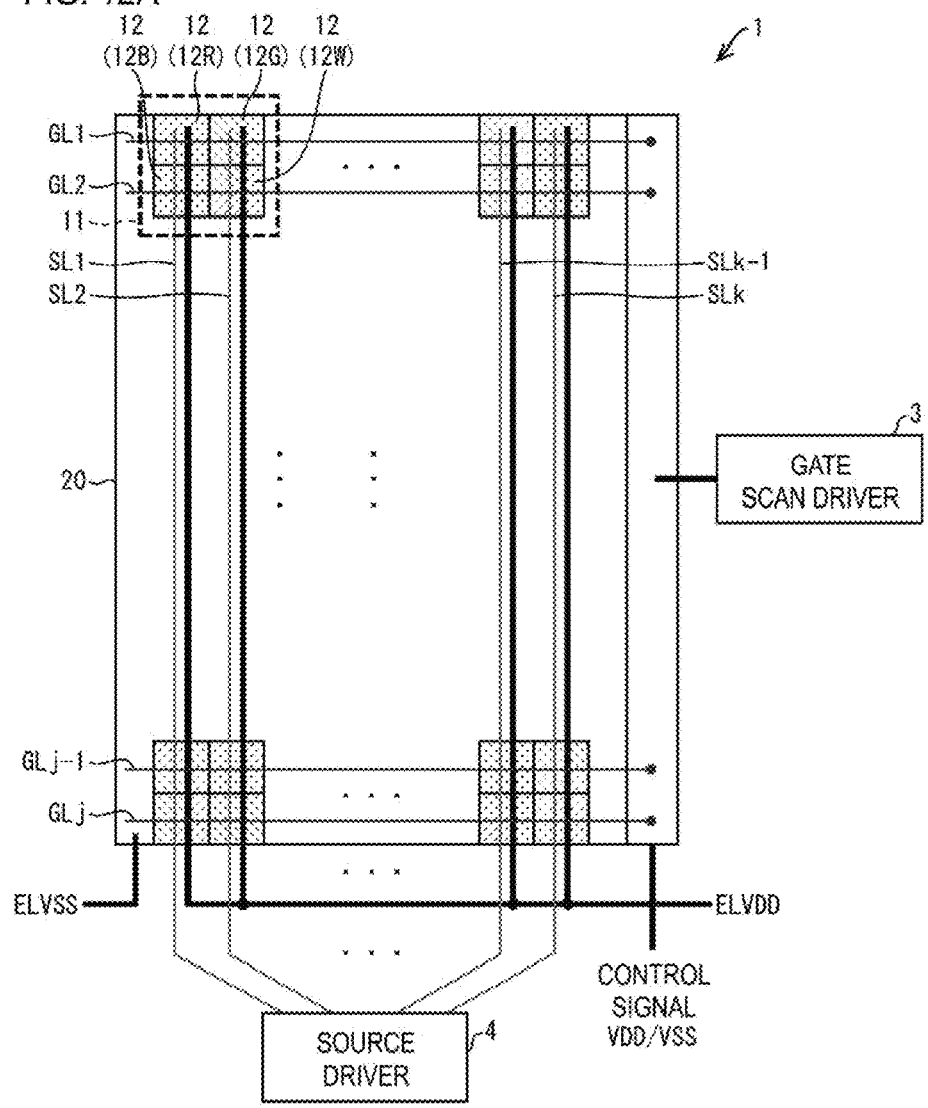
FIG. 12A is a plan view illustrating a schematic configuration of a display device according to a fourth embodiment of the present invention.
Figure 12B:
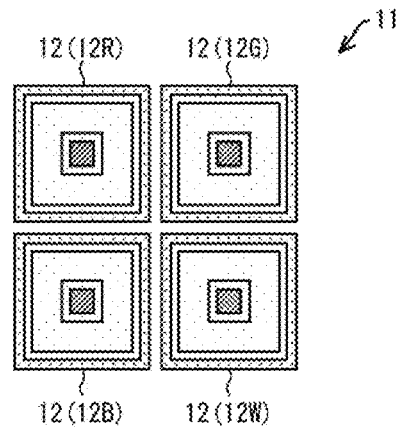
FIG. 12B is a plan view illustrating a schematic configuration of a pixel circuit part illustrated in FIG. 12A.

FIG. 12A is a plan view (transparent view) illustrating a schematic configuration of the display device 1 according to the present embodiment. FIG. 12B is a plan view illustrating a schematic configuration of the pixel circuit portion 11 illustrated in FIG. 12A.

Figure 13A:
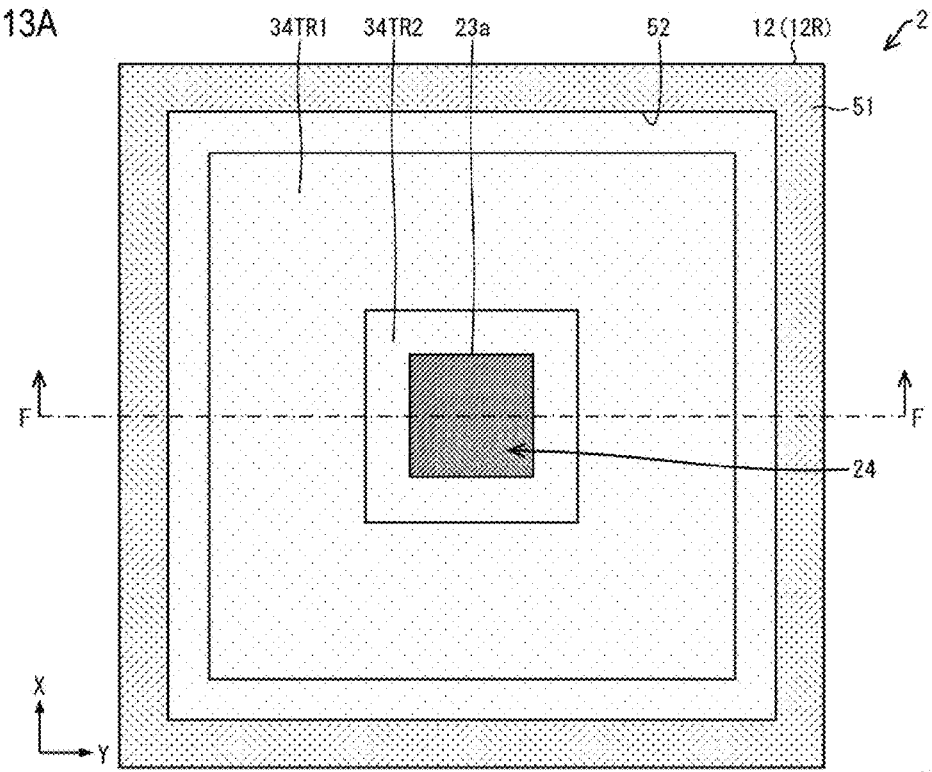
FIG. 13A is a plan view illustrating a schematic configuration of a sub pixel circuit portion of a display panel according to the fourth embodiment of the present invention.
Figure 13B:
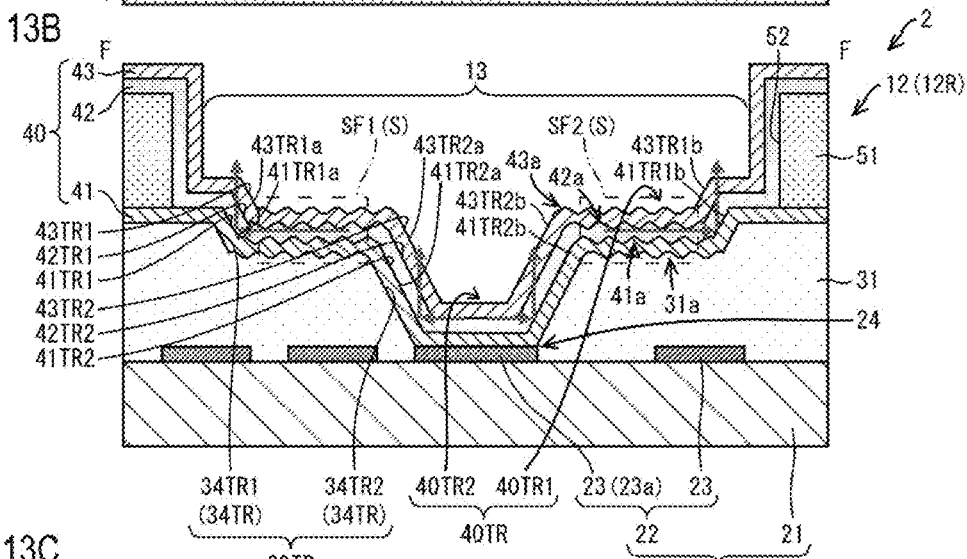
FIG. 13B is a cross-section arrow view taken along line F-F of the sub pixel circuit portion of the display panel illustrated in FIG. 13A.
Figure 13C:
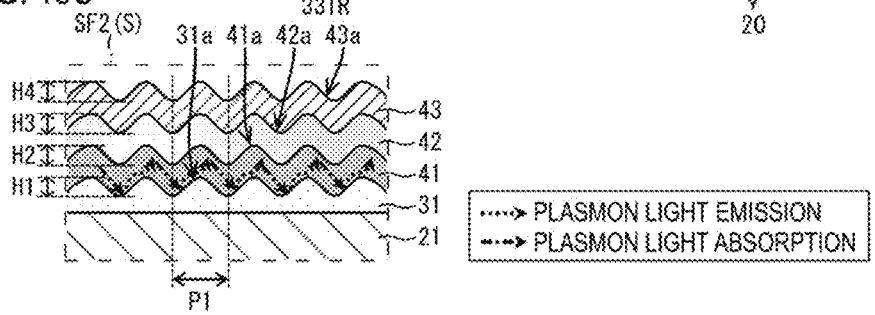
FIG. 13C is a cross-sectional view illustrating an example of a schematic configuration of a cross section S surrounded by a two-dot chain line in the display panel illustrated in FIG. 13B.

FIG. 13A is a plan view (transparent view) illustrating a schematic configuration of the sub pixel circuit portion 12 of the display panel 2 according to the present embodiment. FIG. 13B is a cross-section arrow view taken along line F-F of the sub pixel circuit portion 12 of the display panel 2 illustrated in FIG. 13A. FIG. 13C is a cross-sectional view illustrating an example of a schematic configuration of a cross section S surrounded by a two-dot chain line in the display panel 2 illustrated in FIG. 13B.

The display panel 2 according to the present embodiment includes a plurality of (j) scanning lines GL1 to GL*j* and a plurality of (k) data lines SL1 to SL*k* orthogonal to the scanning lines GL1 to GL*j*, the plurality of scanning lines GL1 to GL*j* and the plurality of data lines SL1 to SL*k* being provided in a predetermined position. In the present embodiment, j and k are both integers of 2 or greater.

In the present embodiment, similarly to the first to the third embodiments, when there is no particular need to discriminate, the scanning lines GL1 to GL*j* are referred to collectively as "scanning lines GL", and the data lines SL1 to SL*k* are referred to collectively as "data lines SL".

The display panel 2 includes a plurality of (j×k) sub pixel circuit portions 12 each provided as sub pixels corresponding to respective intersection points in which the scanning lines GL (scanning lines GL1 to GL*j*) and the data lines SL (data lines SL1 to SL*k*) intersect.

In the present embodiment, the display panel 2 includes, as illustrated in FIGS. 12A and 12B, pixel circuit portions 11, each formed from the four sub pixel circuit portions 12 (light-emitting elements, pixel circuits) for respective color. The four sub pixel circuit portions exhibit four different colors RGBW, respectively. The pixel circuit portions 11 are provided as pixels in a matrix pattern, as illustrated in FIG. 12A.

In the display panel 2 according to the present embodiment, as illustrated in FIGS. 12A and 12B and FIGS. 13A to 13C, a single pixel includes four sub pixels provided correspondingly to intersections (each intersection point) between two adjacent scanning lines GL and two adjacent data lines SL. The display panel 2 according to the present embodiment is the same as the display panel 2 according to the third embodiment, except in that the sub pixel has a square shape.

Namely, the display panel 2 according to the present embodiment is the same as the display panel 2 according to the third embodiment, except in that, as illustrated in FIGS. 12A and 12B, the pixel circuit portions 11 configuring the pixels are each configured by four sub pixel circuit portions 12 (pixel circuits, light-emitting elements), configured to exhibit different display colors and arranged above and below and to left and right in a four pane window shape.

In the present embodiment, due to the sub pixel circuit portions 12 being arranged in a four pane window shape, the R sub pixel circuit portions 12R and the G sub pixel circuit portions 12G are arranged side-by-side repeatedly in the extension direction of the odd numbered rows of the scanning lines GL, for example, and the B sub pixel circuit portions 12B and the W sub pixel circuit portions 12W are arranged side-by-side repeatedly in the extension direction of the even numbered rows of the scanning lines GL, for example. The R sub pixel circuit portions 12R and the B sub pixel circuit portions 12B are also arranged side-by-side repeatedly in the extension direction of odd numbered columns of the data lines SL, and the G sub pixel circuit portions 12G and the W sub pixel circuit portions 12W are arranged side-by-side repeatedly in the extension direction of even numbered columns of the data lines SL, for example.

In the present embodiment, due to the sub pixel circuit portions 12 being arranged in a four pane window shape in this manner, the number of scanning lines GL is twice the number of sub pixels in a single pixel. However, the number of data lines SL can be ½ the number of sub pixels in a single pixel.

In the present embodiment too, the sub pixel circuit portions 12 configuring the R sub pixels are also referred to as "R sub pixel circuit portions 12R", the sub pixel circuit portions 12 configuring the G sub pixels are also referred to as "G sub pixel circuit portions 12G", and the sub pixel circuit portions 12 configuring the B sub pixels are also referred to as "B sub pixel circuit portions 12B". Further, the sub pixel circuit portions 12 configuring the W sub pixels are referred to as "W sub pixel circuit portions 12W," hereinafter.

As illustrated in FIG. 12B, the configuration is also basically the same in the R sub pixel circuit portions 12R, the G sub pixel circuit portions 12G, the B sub pixel circuit portions 12B, and the W sub pixel circuit portions 12W.

Thus, in the present embodiment too, FIGS. 13A and 13B illustrate the configuration of the sub pixel circuit portion 12 by employing the R sub pixel circuit portion 12R as an example of the sub pixel circuit portion 12.

In the present embodiment too, all of the cross sections S illustrated in FIG. 13B (cross sections SF1, SF2 that are cross sections of the first trench portion 40TR1) have the same configuration. Thus, in FIG. 13C, the configuration of the cross section S is illustrated by employing the cross section SF2 as an example of the cross section S.

In the present embodiment too, as illustrated in FIGS. 10A and 10B and similarly to the third embodiment, the drive TFT-first electrode contact portion 24 is provided in a sub trench area (sub trench portion) in each of the sub pixel circuit portions 12. Further, the concave-convex portions 31a, 41a, 42a, 43a are provided only within the first trench portions 34TR1, 40TR1, and are not provided in the sub trench area (that is, the second trench portions 34TR2, 40TR2).

Accordingly, the sub pixel circuit portion 12 according to the present embodiment is the same as the sub pixel circuit portion 12 according to the third embodiment except in that the sub pixel circuit portion 12 has a square shape as stated above.

Method for Producing Display Panel 2

The method for producing the display panel 2 according to the present embodiment is the same as that of the third embodiment, except in that the sub pixel circuit portions 12 are disposed in a four pane window shape as stated above.

Therefore, although the sub pixel circuit portion 12 according to the present embodiment has a square shape in plan view, the cross-sectional structures of the sub pixel circuit portions 12 in each of the production processes are the same as those of FIGS. 10A to 10F and FIGS. 11A to 11F. The sub pixel circuit portion 12 according to the present embodiment can also be produced by a similar method to that of the third embodiment, except in that in the process for forming the EL layer 42, light-emitting layers for each of the colors RGBW are formed by separately coating by an RGBW separate coating method, instead of performing RGB separate coating.

Accordingly, in the present embodiment, an illustration of the cross-section structures of the sub pixel circuit portions 12 in each of the production processes and a description thereof are omitted, and the description of FIGS. 10A to 10F and FIGS. 11A to 11F should be substituted for the description of the method of producing the display panel 2 according to the present embodiment.

Advantageous Effects

As above, the display panel 2 according to the present embodiment is the same as the display panel 2 of the third embodiment, except in that the sub pixel circuit portions 12 are disposed in a four pane window shape. Accordingly, the present embodiment can also obtain similar advantageous effects to those of the third embodiment.

First Modification

Schematic Configuration of Display Panel 2

FIG. 14A is a diagram illustrating, arranged above and below, a plan view (transparent view) illustrating a schematic configuration of the sub pixel circuit portion 12 according to the present modification and a cross-section arrow view taken along line G-G of the sub pixel circuit portion illustrated in the plan view. In FIG. 14A, the plan view is illustrated at the top of the diagram, and the cross-sectional view is illustrated at the bottom of the diagram. In FIGS. 14A and 14B, plan view is illustrated at the top of the diagram, and cross-sectional view is illustrated at the bottom of the diagram. For ease of illustration, the plan view (transparent view) in FIG. 14A also illustrates, as trenches, only the first trench portion 34TR1 and the second trench portion 34TR2 in the interlayer insulating layer 31.

Thus, even in cases in which the sub pixel circuit portions 12 are disposed in a four pane window shape, the EL element 40 may include, within the light-emitting region 13, at least one trench having an indented shape and include the first electrode 41, the EL layer 42, and the second electrode 43, these being layered in this order and in contact with each other.

FIG. 14A illustrates, as an example of the present modification, a case in which a first trench portion 34TR1 and a second trench portion 34TR2 having the same size as each other are formed side-by-side in the interlayer insulating layer 31 to give a trench pitch of d31 and an inter-trench space of d32.

The display panel 2 according to the present modification has the same configuration as that of the display panel 2 illustrated in FIGS. 1A and 1B and FIGS. 2A and 2B, except in that, within the light-emitting region 13 of each of the sub pixel circuit portions 12, the first trench portion 40TR1 and the second trench portion 40TR2 are provided side-by-side in the horizontal direction formed by the first trench portion 34TR1 and the second trench portion 34TR2.

The display panel 2 according to the present modification has the same configuration as that of the display panel 2 illustrated in FIGS. 12A and 12B and FIGS. 13A to 13C, except in that, within the light-emitting region 13 of each of the sub pixel circuit portions 12, the first trench portion 40TR1 and the second trench portion 40TR2 are provided side-by-side in the horizontal direction formed by the first trench portion 34TR1 and the second trench portion 34TR2.
Method for Producing Display Panel 2

The display panel 2 according to the present modification can be produced by a similar method to that of the display panel 2 illustrated in FIGS. 12A and 12B and FIGS. 13A to 13C, except in that the first trench portion 40TR1 and the second trench portion 40TR2 are formed in the horizontal direction and the drive TFT-first electrode contact portion 24 is provided outside the light-emitting region 13.

In other words, the method for producing the display panel 2 according to the present modification is the same as that of the first modification of the first embodiment, except in that the sub pixel circuit portions 12 are disposed in a four pane window shape as stated above. Accordingly, a description thereof is omitted.

Advantageous Effects

In the present modification too, the first trench portion 40TR1 and the second trench portion 40TR2 each include the first electrode 41, the EL layer 42, and the second electrode 43, these being layered in this order and in contact with each other, and each do not include a partition (insulating layer) on a reflection structure as in the case of the trench 530 in the sub pixel 510R of PTL 1.

The display panel 2 according to the present modification is the same as that of the first modification of the first embodiment, except in that the sub pixel circuit portions 12 are disposed in a four pane window shape. Accordingly, the present modification can obtain similar advantageous effects to those of the first modification of the first embodiment.
Second Modification FIG. 14B is a diagram illustrating, arranged above and below, a plan view (transparent view) illustrating a schematic configuration of a sub pixel circuit portion 12 according to the present second modification and a cross-section arrow view taken along line H-H of the sub pixel circuit portion illustrated in the plan view. In FIG. 14B too, the plan view is illustrated at the top of the diagram, and the cross-sectional view is illustrated at the bottom of the diagram. For ease of illustration, the plan view (transparent view) in FIG. 14B also illustrates, as the trench, the trench portion 34TR in the interlayer insulating layer 31.

The display panel 2 according to the present modification is the same as that of the second modification of the first embodiment, except in that the sub pixel circuit portions 12 are disposed in a four pane window shape. Accordingly, the present modification can accordingly obtain similar advantageous effects to those of the first modification of the first embodiment.

The method for producing the display panel 2 according to the present modification is the same as that of the second modification of the first embodiment, except in that the sub pixel circuit portions 12 are disposed in a four pane window shape as stated above.

Thus, the description thereof is omitted in the present modification. A description follows regarding the advantages of the display panel 2 illustrated in FIGS. 13A to 13C for the first and second modifications stated above.
Advantages of Display Panel 2 Illustrated in FIGS. 13A to 13C for First and Second Modifications of Present Embodiment As stated above, when display panels become higher in definition, the size of a single pixel becomes smaller as the definition becomes higher. Thus, even in cases in which the sub pixel circuit portions 12 are formed in a square shape as illustrated in FIGS. 14A and 14B, it might be difficult to secure the inter-trench space d32 when, as in the conventional way, trench portions of the same size as each other are formed side-by-side at a predetermined trench pitch (trench pitch d31). In such cases, similarly to the sub pixel circuit portions 12 illustrated in FIGS. 6A and 6B, it might be difficult to form the first trench portion 34TR1 and the second trench portion 34TR2 isolated from each other.

However, similarly to the first to third embodiments, the present embodiment also does not form a trench shape serving as walls and banks for reflecting light in an island pattern partitioned in the horizontal direction by non-light-emitting regions as in PTL 1, but instead, a step-shaped trench is provided within the light-emitting region 13, with the step-shaped trench having a step shape at the inside. Thus, the display panel 2 illustrated in FIGS. 14A and 14B also can obtain similar advantageous effects to those of the display panel 2 illustrated in FIGS. 1A and 1B.

Moreover, similarly to the third embodiment, the display panel 2 illustrated in FIGS. 13A to 13C includes the drive TFT-first electrode contact portion 24 provided in a sub trench area (sub trench portion) in each of the sub pixel circuit portions 12. Namely, in the display panel 2 illustrated in FIGS. 13A to 13C, the drive TFT 23a is disposed within the second trench portion 34TR2 of the interlayer insulating layer 31, and the first electrode 41 is electrically connected to the drive TFT 23a at the second trench portion 41TR2 of the first electrode 41.

Therefore, in the display panel 2 illustrated in FIGS. 13A to 13C, in cases in which a single pixel is configured by four sub pixels, the pixel size can be reduced compared to the examples illustrated in FIGS. 14A and 14B for a similar reason to that of the third embodiment. This enables the display panel 2 of even higher definition to be produced. The display panel 2 illustrated in FIGS. 13A to 13C thereby enables similar advantageous effects to those of the third embodiment to be obtained, in addition to similar advantageous effects to those of the first embodiment.
Fifth Embodiment A description follows regarding another embodiment of the present invention, with reference to FIGS. 15A to 15D.

The present embodiment will be stated by the differences between the present embodiment and the first embodiment, and components having the same function as the components stated in the first embodiment are appended with the same reference signs, and the description thereof is omitted. Obviously, the same modifications as those of the first to fourth embodiments may also be applied to the present embodiment.
Display Panel 2

Figure 15A:
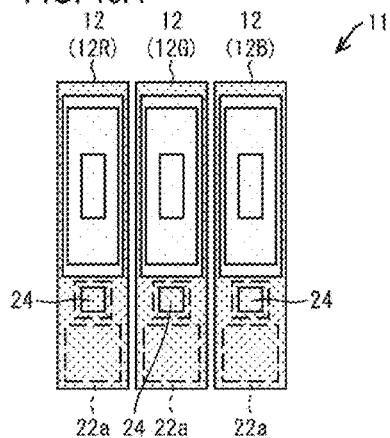
FIG. 15A is a plan view illustrating a schematic configuration of a pixel circuit part of a display panel according to a fifth embodiment of the present invention.
Figure 15D:
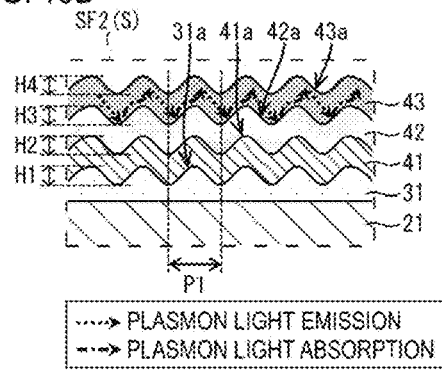
FIG. 15D is a cross-sectional view illustrating an example of a schematic configuration of a cross section S surrounded by a two-dot chain line in the display panel illustrated in FIG. 15C.
Figure 15B:
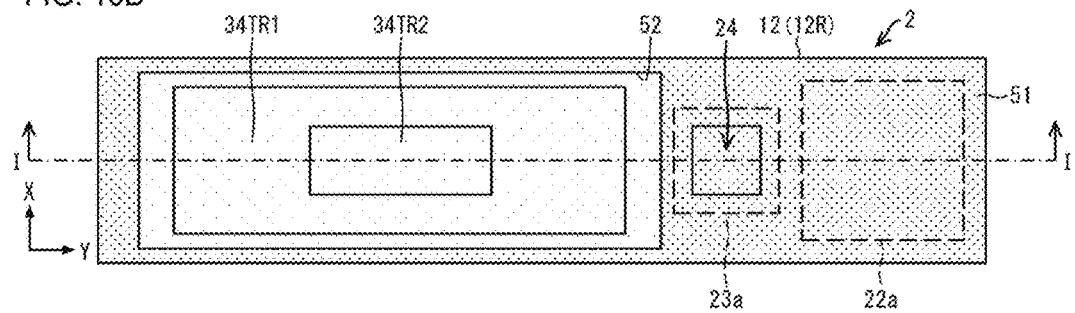
FIG. 15B is a plan view illustrating a schematic configuration of a sub pixel circuit portion of the display panel according to the fifth embodiment of the present invention.
Figure 15C:
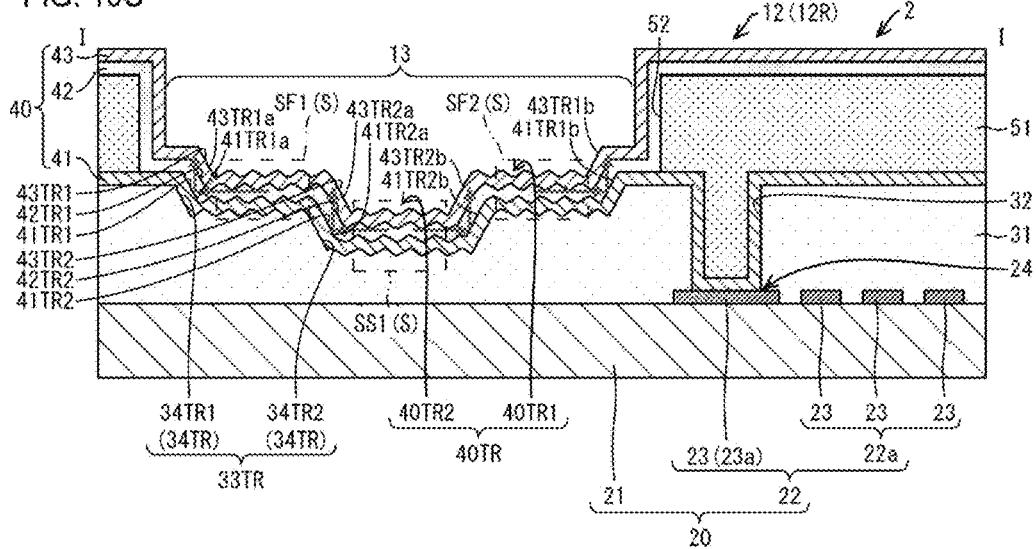
FIG. 15C is a cross-section arrow view taken along line I-I of the sub pixel circuit portion of the display panel illustrated in FIG. 15B.

FIG. 15A is a plan view (transparent view) illustrating a schematic configuration of the pixel circuit portion 11 of the display panel 2 according to the present embodiment. FIG. 15B is a plan view (transparent view) illustrating a schematic configuration of the sub pixel circuit portion 12 of the display panel 2 according to the present embodiment. FIG. 15C is a cross-section arrow view taken along line I-I of the sub pixel circuit portion 12 of the display panel 2 illustrated in FIG. 15B. FIG. 15D is a cross-sectional view illustrating an example of a schematic configuration of a cross section S surrounded by a two-dot chain line in the display panel 2 illustrated in FIG. 15C.

In the present embodiment too, as illustrated in FIG. 15A, the configuration is basically the same in the R sub pixel circuit portions 12R, the G sub pixel circuit portions 12G, and the B sub pixel circuit portions 12B.

Thus, in the present embodiment too, FIGS. 15B and 15C illustrate the configuration of the sub pixel circuit portion 12 by employing the R sub pixel circuit portion 12R as an example of the sub pixel circuit portion 12.

In the present embodiment too, all of the cross sections S illustrated in FIG. 15C (cross sections SF1, SF2 that are cross sections of the first trench portion 40TR1, and cross section SS1 that is a cross section of the second trench portion 40TR2) have the same configuration. Thus, in FIG. 15D, the configuration of the cross section S is illustrated by employing the cross section SF2 as an example of the cross section S.

In the first to fourth embodiments, an example has been stated for a case in which the display device 1 is a top-emitting display device including a top-emitting display panel 2. In contrast thereto, the present embodiment describes a case, as an example, in which the display device 1 is a bottom-emitting display device including a bottom-emitting display panel 2.

In the present embodiment too, a description follows regarding an example of a case in which, similarly to the first to fourth embodiments, the first electrode 41 is a positive electrode (patterned positive electrode), and the second electrode 43 is a negative electrode (common negative electrode). However, the present embodiment is not limited thereto.

A description follows regarding differences from the first embodiment.

Semiconductor Substrate 20

The semiconductor substrate 20 employed in the present embodiment is the same as the semiconductor substrate 20 employed in the first embodiment, except in that, due to light being extracted from the back face side of the insulating substrate 21, the TFT circuit portion 22 is provided in a region other than the light-emitting region 13 (namely, in a non-light-emitting region outside the light-emitting region 13), as illustrated in FIGS. 15A to 15D.

More specifically, the present embodiment has the same semiconductor substrate 20 as that employed in the first embodiment except in that, as illustrated in FIGS. 15A to 15D, of the TFT circuit portions 22, the TFT circuit portion 22a formed from TFTs 23 other than the drive TFT 23 is provided on a side opposite to the light-emitting region 13 side of the drive TFT-first electrode contact portion 24.

As stated above, when the display panel 2 is a top-emitting display panel, the insulating substrate 21 employed is not limited to a specific substrate. However, when the display panel 2 is a bottom-emitting display panel, as in the present embodiment, a transparent or semi-transparent substrate material, such as a glass substrate, is employed for the insulating substrate 21.

First Electrode 41 and Second Electrode 43

Moreover, when the display panel 2 is a bottom-emitting display panel, to reflect light reflected at the interfaces and guided within the EL layer 42 and to extract the light from the semiconductor substrate 20 side, the second electrode 43 is preferably formed from a reflective electrode material such as a metal or alloy having reflecting properties, and the first electrode 41 is preferably formed from a transparent electrode material which is transparent or semi-transparent.

Electrode materials employed in the first electrode 41 and the second electrode 43, such as reflective electrode materials and transparent electrode materials, are the same as those of the examples given in the first embodiment. In the present embodiment too, the first electrode 41 and the second electrode 43 may each be a single layer formed from one electrode material or may have a layered structure formed from a plurality of electrode materials.

Thus, when the EL element 40 is a bottom-emitting EL element as stated above, the second electrode 43 may have a layered structure including a reflective electrode formed from a reflective electrode material and a transparent electrode formed from a transparent electrode material.

Method for Producing Display Panel 2

A method for producing the display panel 2 according to the present embodiment is the same as that of the first embodiment, except in that, as stated above, the position for forming the TFT circuit portion 22a formed from the TFTs 23 other than the drive TFT 23 is different from that of the first embodiment. Thus, the description thereof is omitted in the present embodiment.

Light-Emitting/Improved Light Extraction Action of Display Panel 2

The light-emitting action and improved light extraction action of the sub pixel circuit portion 12 in the display panel 2 according to the present embodiment is also basically the same as that of first embodiment.

However, the display panel 2 according to the present embodiment is a bottom-emitting display panel, and as stated above, the light reflected at the interfaces and guided within the EL layer 42 is reflected by the reflective electrode configuring the second electrode 43 and extracted from the semiconductor substrate 20 side.

Thus, in the present embodiment, the energy once absorbed by the surface plasmon generated on the surface of the second electrode 43 is converted into propagation light as the light energy and re-extracted in the concave-convex portion 43a provided at the interface with the EL layer 42 in the second electrode 43 into which the light radiated from the light-emitting layer in the EL layer 42 enters.

That is, in the present embodiment, not the concave-convex portion 41a but the concave-convex portion 43a is used as a diffraction lattice (concave-convex diffraction lattice) that diffracts (diffracts and outputs) the surface plasmon.

Note that the configuration of the concave-convex portion 43a is the same as that in the first embodiment, and thus, similar modifications to those in the first embodiment may be applied. Further, in the description regarding the concave-convex diffraction lattice provided on the surface of the reflective electrode on the EL layer 42 side thereof, which has been stated, for example, in the section "Configuration of Each of Concave-Convex Portions 31a, 41a, 42a, 43a" or the like in the first embodiment, the concave-convex portion 41a may be replaced with the concave-convex portion 43a, and the positive electrode may be replaced with the negative electrode.

In the present embodiment, as illustrated in FIG. 15C, due to the plasmon effect (free electron vibration of the negative electrode metal layer) by the surface plasmon generated at the interface between the light-emitting layer in the EL layer 42 and the reflective electrode (negative electrode metal layer) in the second electrode 43, the light (light energy) having the same wavelength as that of the resonant frequency of the surface plasmon, out of the light made incident into the reflective electrode, is absorbed into the surface of the reflective electrode.

However, the lifespan of the surface plasmon is relatively long, and the concave-convex portion 43a is provided on the surface of the second electrode 43, and thus, the absorbed light energy is extracted as the light again in the normal direction of the concave-convex portions 43a, due to the light-emitting transition of the plasmon.

At this time, new light emission is added because the light radiated from the EL layer 42 induces the plasmon toward the reflective electrode surface, and is re-radiated after absorbing the energy, and thus, the luminescent is enhanced even in the present embodiment.

Advantageous Effects

The present embodiment is same as the first embodiment, except in that: the extraction direction of light from the EL element 40 is different; and the concave-convex portion 43a having the pitch P1 (convex width and concave width) and concave-convex height H4 of submicron order level (for example, several tens to hundreds nm level) is provided, as a diffraction lattice for diffracting the surface plasmon, on the surface of the second electrode 43 in the light-emitting region 13, that is, at the interface with the EL layer 42 in the negative electrode metal layer.

Accordingly, the present embodiment can also obtain similar advantageous effects to those of the first embodiment.

However, in the present embodiment, the extraction direction of light from the EL element 40 is different and the concave-convex portion 43a is provided, as a diffraction lattice for diffracting the surface plasmon, on the surface of the second electrode 43 in the light-emitting region 13, and thus, the light energy in the negative electrode metal layer surface is prevented from being dissipated by the plasmon, the light is re-extracted from the plasmon in which the light energy is absorbed on the negative electrode metal layer surface, and then the light is extracted in the negative electrode metal layer (reflective electrode, reflective metal portion) at trench edge to the lower face side thereof. However, in the present embodiment too, similarly to the first embodiment, the attenuation of the guided light within the light-emitting layer can be suppressed and to the light extraction efficiency can be significantly improved.

Thus, the present embodiment enables the provision of the EL element 40, the sub pixel circuit portion 12, the pixel circuit portion 11, the display panel 2, and the display device 1 configured as respective bottom-emitting types and capable of increasing the light extraction efficiency even in a high definition panel.

In the present embodiment, as a modification to the first embodiment and as illustrated in FIGS. 15A to 15D, an example has been stated for a case in which the display panel illustrated in FIGS. 1A to 1C is made as a bottom-emitting display panel. However, the present embodiment is not limited thereto, and obviously, as a modification to the first embodiment, the display panel illustrated in FIG. 6A or 6B may, for example, be made as a bottom-emitting display panel. As stated above, similar modifications to the second to fourth embodiments are also possible, and obviously, the display panels according to any of the second to fourth embodiments may also be made as a bottom-emitting display panel.

Conclusion

A light-emitting element (sub pixel circuit portion 12) according to a first aspect of the present invention includes a substrate (insulating substrate 21), an interlayer insulating layer 31 on the substrate, a first electrode 41, an electroluminescence layer (EL layer 42) including at least a light-emitting layer, and a second electrode 43, the first electrode 41, the electroluminescence layer (EL layer 42), the second electrode 43 being layered in this order with the interlayer insulating layer 31 interposed between the substrate and the first electrode 41. One electrode out of the first electrode 41 and the second electrode 43 includes a reflective electrode, and at least one trench having an indented shape (reflective trench, for example, the step-shaped trench 40TR, the first trench portion 40TR1, the second trench portion 40TR2, the third trench portion 40TR3) is formed within a single light-emitting region 13. This trench includes the first electrode 41, the electroluminescence layer, and the second electrode 43 being layered in this order and in contact with each other. A concave-convex portion of the submicron order configured to diffract surface plasmons is provided on a surface of the reflective electrode on a side closer to the electroluminescence layer.

A light-emitting element (sub pixel circuit portion 12) according to a second aspect of the present invention may include, in the first aspect, the plurality of trenches disposed within the light-emitting region 13.

A light-emitting element (sub pixel circuit portion 12) according to a third aspect of the present invention may have a configuration in which, in the second aspect, the plurality of trenches, within a single trench (for example, the first trench portion 40TR1) in plan view, form a step-shaped trench (for example, the step-shaped trench 40TR) including at least one sub trench (for example, the second trench portion 40TR2, the third trench portion 40TR3) having a size smaller than that of the single trench.

Namely, the present aspect does not form a trench shape serving as walls and banks for reflecting light in an island pattern partitioned in the horizontal direction by non-light-emitting regions as in PTL 1, but instead, a step-shaped trench may be provided within the light-emitting region 13, the step-shaped trench including at least one sub trench provided within a main trench.

For example, the light-emitting element according to the present aspect may include a step-shaped trench having a step shape at the inside in which at least one sub trench having a size smaller than that of the first trench portion 40TR1 (namely, the second trench portion 40TR2 having a length-and-width size smaller than that of the first trench portion 40TR1) is provided within a single trench, for example, within the first trench portion 40TR1 serving as a main trench.

Alternatively, the light-emitting element according to the present aspect may include step-shaped trenches having a step shape at the inside in which, within a trench provided in the horizontal direction, for example, within at least one trench out of the first trench portion 40TR1 and the second trench portion 40TR2, at least one trench having a size smaller than that of the first trench portion 40TR1 or the second trench portion 40TR2 is provided. Namely, a plurality of main trenches may be provided in the horizontal direction.

A light-emitting element (sub pixel circuit portion 12) according to a fourth aspect of the present invention may have a configuration in which, in the second or third aspect, the plurality of trenches are provided side-by-side in plan view within the light-emitting region 13.

A light-emitting element (sub pixel circuit portion 12) according to a fifth aspect of the present invention may have a configuration in which: in any one of the first to fourth aspects, the interlayer insulating layer 31 includes, within the light-emitting region 13, a trench (the insulating trench, for example, the trench portion 34TR, the first trench portion 34TR1, the second trench portion 34TR2, the third trench portion 34TR3, the step-shaped trench 33TR) having a shape corresponding to the at least one trench; and the first electrode 41, the electroluminescence layer (EL layer 42), and the second electrode 43 may be layered on the interlayer insulating layer 31 within the light-emitting region 13 along the at least one trench in the interlayer insulating layer 31.

A light-emitting element (sub pixel circuit portion 12) according to a sixth aspect of the present invention may have a configuration in which, in the third aspect, the at least one sub trench each includes a first sub trench (for example, the second trench portion 40TR2) and a second sub trench (for example, the third trench portion 40TR3), and the second sub trench is formed within the first sub trench.

A light-emitting element (sub pixel circuit portion 12) according to a seventh aspect of the present invention may have a configuration in which, in any one of the first to sixth aspects, the first electrode 41 includes the reflective electrode, and light reflected by the reflective electrode is extracted outside from a side closer to the second electrode 43.

A light-emitting element (sub pixel circuit portion 12) according to an eighth aspect of the present invention may have a configuration in which, in any one of the first to seventh aspects, a drive circuit part (TFT circuit portion 22) is provided on the substrate (insulating substrate 21), the drive circuit part (TFT circuit portion 22) includes a drive transistor (drive TFT 23a) connected to the first electrode 41 and configured to supply a drive current to an electroluminescence element (EL element 40) configured by the first electrode 41, the electroluminescence layer (EL layer 42), and the second electrode 43. In such cases, the first electrode 41 may be connected to the drive transistor at one trench out of the at least one trench.

A light-emitting element (sub pixel circuit portion 12) according to a ninth aspect of the present invention may have a configuration in which, in the eighth aspect, the second electrode 43 includes the reflective electrode, the drive circuit part (TFT circuit portion 22) is provided in a non-light-emitting region outside the light-emitting region 13, and light reflected by the reflective electrode is extracted outside from a side closer to the first electrode 41.

A light-emitting element (sub pixel circuit portion 12) according to a tenth aspect of the present invention may have a configuration in which, in any one of the first to ninth aspects, the concave-convex portion (the concave-convex portion 41a or the concave-convex portions 43a) has a periodic structure smaller than a wavelength of emitted light.

A display panel 2 according to an eleventh aspect of the present invention may have a configuration in which a plurality of the light-emitting elements according to any one of the first to tenth aspects are arranged.

A display panel 2 according to a twelfth aspect of the present invention may have a configuration in which, in the eleventh aspect, a plurality of pixels (pixel circuit portions 11), each including a plurality of sub pixels (sub pixel circuit portions 12), are arranged in a matrix pattern, and each of the plurality of sub pixels is configured by the light-emitting element (sub pixel circuit portion 12).

A display panel 2 according to a thirteenth aspect of the present invention may include, in the twelfth aspect, a plurality of scanning lines GL and a plurality of data lines SL. Each of the plurality of pixels (pixel circuit portions 11) may be configured from four sub pixels (sub pixel circuit portions 12) provided corresponding to intersection points, two adjacent scanning lines of the plurality of scanning lines GL and two adjacent data lines of the plurality of data lines being intersected at the intersection points.

A display device 1 according to a fourteenth aspect of the present invention includes the display panel 2 according to any one of the eleventh to thirteenth aspects.

An electronic device (for example, the display panel 2, the display device 1, an illumination device, or the like) according to a fifteenth aspect of the present invention includes the light-emitting element (sub pixel circuit portion 12) according to any one of the first to tenth aspects.

A method for producing a light-emitting element (sub pixel circuit portion 12) according to a sixteenth aspect of the present invention includes: forming at least one trench including a concave-convex portion 31a of submicron order (insulating trench, for example, the trench portion 34TR, the first trench portion 34TR1, the second trench portion 34TR2, the third trench portion 34TR3, the step-shaped trench 33TR) in a region for forming a light-emitting region 13 of an interlayer insulating layer 31 layered on a substrate (insulating substrate 21); forming a first electrode 41 on the interlayer insulating layer 31, the first electrode 41 including a trench including a concave-convex portion 41a of submicron order (for example, the first trench portion 41TR1, the second trench portion 41TR2, the third trench portion 41TR3) along the at least one trench of the interlayer insulating layer 31; forming an edge cover 51 on the first electrode 41, the edge cover 51 surrounding the trench (for example, the first trench portion 41TR1, the second trench portion 41TR2, the third trench portion 41TR3) in the first electrode 41, covering an end portion of the first electrode 41 where the trench (for example, the first trench portion 41TR1, the second trench portion 41TR2, the third trench portion 41TR3) is not formed, and including an opening at the light-emitting region 13; and forming an electroluminescence layer (EL layer 42) and a second electrode 43 on the first electrode 41, the electroluminescence layer including at least a light-emitting layer, and at the trench (for example, the first trench portion 41TR1, the second trench portion 41TR2, the third trench portion 41TR3) in the first electrode 41, the first electrode 41, the electroluminescence layer, and the second electrode 43 being layered in this order and in contact with each other, and each of the electroluminescence layer and the second electrode 43 including, along the trench of the first electrode 41, a trench including a concave-convex portion of submicron order (concave-convex portions 42a, 43a). In such cases, a reflective electrode is employed as one electrode out of the first electrode 41 and the second electrode 43.

A method for producing a light-emitting element (sub pixel circuit portion 12) according to a seventeenth aspect of the present invention may include, at the forming at least one trench in the interlayer insulating layer 31 in the sixteenth aspect, forming a plurality of trenches in the interlayer insulating layer 31 in the region for forming the light-emitting region 13.

A method for producing a light-emitting element (sub pixel circuit portion 12) according to an eighteenth aspect of the present invention may include, at the forming at least one trench in the interlayer insulating layer 31 in the seventeenth aspect, forming, within a single trench (for example, the first trench portion 34TR1) in plan view, a step-shaped trench (for example, the step-shaped trench 40TR) including at least one sub trench (for example, the second trench portion 34TR2, the third trench portion 34TR3) having a size smaller than that of the single trench.

For example, the method may include, at the forming the trench in the interlayer insulating layer 31, forming, within a single trench, for example, the first trench portion 34RT1 serving as a main trench, a step-shaped trench having a step shape at the inside in which at least one sub trench (namely, the second trench portion 34TR1 smaller in length-andwidth size than the first trench portion 34TR1) having a size smaller than that of the first trench portion 34TR1 is provided.

Alternatively, the method may include, at the process of forming the trench in the interlayer insulating layer 31, forming, within a trench provided in the horizontal direction, for example, within at least one trench out of the first trench portion 34TR1 and the second trench portion 34TR1, a step-shaped trench having a step shape at the inside in which at least one trench having a size smaller than that of the trench is provided. Namely, a plurality of main trenches may be provided in the horizontal direction.

A method for producing a light-emitting element (sub pixel circuit portion 12) according to a nineteenth aspect of the present invention may include, at the forming at least one trench in the interlayer insulating layer 31 in the seventeenth aspect, forming the plurality of trenches side-by-side in plan view.

A method for producing a light-emitting element (sub pixel circuit portion 12) according to a twentieth aspect of the present invention may include, at the forming at least one trench in the interlayer insulating layer 31 in any one of the sixteenth to nineteenth aspects, forming a concave-convex portion 31a on the at least one trench in the interlayer insulating layer 31 such that a concave-convex portion (the concave-convex portion 41a or the concave-convex portion 43a) having a periodic structure smaller than a wavelength of emitted light is formed on a surface of the reflective electrode on a side closer to the electroluminescence layer (EL layer 42).

The present invention is not limited to each of the embodiments stated above, and various modifications may be implemented within a range not departing from the scope of the claims. Embodiments obtained by appropriately combining technical approaches stated in each of the different embodiments also fall within the scope of the technology of the present invention. Moreover, novel technical features may be formed by combining the technical approaches stated in each of the embodiments.

INDUSTRIAL APPLICABILITY

The present invention is utilizable in various devices that employ organic EL elements, and, for example, is utilizable in display devices such as televisions and illumination devices.

REFERENCE SIGNS LIST

1 Display device
2 Display panel
3 Gate scan driver
4 Source driver
11 Pixel circuit part
12 Sub pixel circuit portion (light-emitting element)
12R R sub pixel circuit portion (light-emitting element)
12G G sub pixel circuit portion (light-emitting element)
12B B sub pixel circuit portion (light-emitting element)
12W W sub pixel circuit portion (light-emitting element)
13 Light-emitting region
20 Semiconductor substrate
21 Insulating substrate (substrate)
22 TFT circuit portion
22a TFT circuit portion
23 TFT
24 Drive TFT-first electrode contact portion
31 Interlayer insulating layer
32 Contact hole
33TR, 40TR Step-shaped trench
34TR Trench portion
34TR1, 40TR1, 41TR1, 42TR1, 43TR1 First trench portion (main trench)
34TR2, 40TR2, 41TR2, 42TR2, 43TR2 Second trench portion (sub trench, first sub trench)
34TR3, 40TR3, 41TR3, 42TR3, 43TR3 Third trench portion (sub trench, second sub trench)
40 EL element
41 First electrode
41TR1a, 41TR1b, 41TR2a, 41TR2b, 41TR3a, 41TR3b Side wall
42 EL layer (electroluminescence layer)
43 Second electrode
43TR1a, 43TR1b, 43TR2a, 43TR2b, 43TR3a, 43TR3b Side wall
51 Edge cover
52 Opening
61, 63, 65, 67, 71, 73 Photosensitive resist
62, 64, 66, 68, 72, 74 Photomask
GL Scanning line
SL Data line

What is claimed is:

1. A light-emitting element comprising:
a substrate;
an interlayer insulating layer on the substrate;
a first electrode;
an electroluminescence layer including at least a light-emitting layer; and
a second electrode, the first electrode, the electroluminescence layer, and the second electrode being layered in this order on the substrate with the interlayer insulating layer interposed between the substrate and the first electrode,
wherein one electrode out of the first electrode and the second electrode includes a reflective electrode,
at least one trench having an indented shape is formed within a single light-emitting region,
the at least one trench includes the first electrode, the electroluminescence layer, and the second electrode layered in this order and in contact with each other,
a concave-convex portion of submicron order configured to diffract surface plasmons is provided on a surface of the reflective electrode on a side closer to the electroluminescence layer;
wherein the at least one trench comprises a plurality of trenches, the plurality of trenches are disposed within the light-emitting region; and
wherein the plurality of trenches form, within a single trench in plan view, a step-shaped trench including at least one sub trench having a size smaller than a size of the single trench.

2. The light-emitting element according to claim 1, wherein the plurality of trenches are disposed side-by-side in plan view within the light-emitting region.

3. The light-emitting element according to claim 1, wherein the interlayer insulating layer includes, within the light-emitting region, a trench having a shape corresponding to the at least one trench, and
the first electrode, the electroluminescence layer, and the second electrode are layered on the interlayer insulating layer within the light-emitting region along the at least one trench in the interlayer insulating layer.

4. The light-emitting element according to claim 1, wherein the at least one sub trench each includes a first sub trench and a second sub trench, and
the second sub trench is formed within the first sub trench.

5. The light-emitting element according to claim 1,
wherein the first electrode includes the reflective electrode, and
light reflected by the reflective electrode is extracted outside from a side closer to the second electrode.

6. The light-emitting element according to claim 1, further comprising:
a drive circuit part provided on the substrate, the drive circuit part including a drive transistor connected to the first electrode and configured to supply a drive current to an electroluminescence element configured by the first electrode, the electroluminescence layer, and the second electrode,
wherein the first electrode is connected to the drive transistor at one of the at least one trench.

7. The light-emitting element according to claim 6,
wherein the second electrode includes the reflective electrode,
the drive circuit part is provided in a non-light-emitting region outside the light-emitting region, and
light reflected by the reflective electrode is extracted outside from a side closer to the first electrode.

8. The light-emitting element according to claim 1,
wherein the concave-convex portion has a periodic structure smaller than a wavelength of emitted light.

9. A display panel comprising a plurality of the light-emitting elements according to claim 1, the plurality of the light-emitting elements being arranged.

10. The display panel according to claim 9,
wherein a plurality of pixels, each including a plurality of sub pixels, are arranged in a matrix pattern, and
each of the plurality of sub pixels is configured by the light-emitting element.

11. The display panel according to claim 10, further comprising:
a plurality of scanning lines; and
a plurality of data lines,
each of the plurality of pixels is configured from four sub pixels provided corresponding to intersection points, two adjacent scanning lines of the plurality of scanning lines and two adjacent data lines of the plurality of data lines being intersected at the intersection points.

12. A display device comprising the display panel according to claim 9.

13. An electronic device comprising the light-emitting element according to claim 1.

* * * * *